US012563721B2

(12) United States Patent
Chang et al.

(10) Patent No.: US 12,563,721 B2
(45) Date of Patent: Feb. 24, 2026

(54) MEMORY DEVICE AND METHOD FOR FORMING THE SAME

(71) Applicant: TAIWAN SEMICONDUCTOR MANUFACTURING COMPANY, LTD., Hsinchu (TW)

(72) Inventors: Meng-Sheng Chang, Hsinchu County (TW); Chia-En Huang, Hsinchu County (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1214 days.

(21) Appl. No.: 17/461,028

(22) Filed: Aug. 30, 2021

(65) Prior Publication Data

US 2023/0060167 A1 Mar. 2, 2023

(51) Int. Cl.
*H10B 20/25* (2023.01)
*G11C 17/16* (2006.01)

(52) U.S. Cl.
CPC ........... *H10B 20/25* (2023.02); *G11C 17/165* (2013.01)

(58) Field of Classification Search
CPC ...... H10B 20/25; G11C 17/165; G11C 17/18; G11C 17/16; H01L 23/5252
See application file for complete search history.

(56) References Cited

U.S. PATENT DOCUMENTS

| | | | | |
|---|---|---|---|---|
| 8,062,966 B2 * | 11/2011 | Mehrad | ............. | H01L 29/66545 |
| | | | | 438/188 |
| 9,589,977 B1 * | 3/2017 | Chen | ................. | H01L 29/66545 |
| 2013/0154021 A1 * | 6/2013 | Chuang | ........... | H01L 21/823842 |
| | | | | 257/369 |
| 2017/0154890 A1 * | 6/2017 | Jin | ....................... | H01L 23/5252 |
| 2018/0138178 A1 * | 5/2018 | Lin | ....................... | H01L 27/088 |
| 2022/0068907 A1 * | 3/2022 | Tura | ....................... | B82Y 10/00 |
| 2022/0344358 A1 * | 10/2022 | Lee | ......................... | H10B 10/12 |

* cited by examiner

*Primary Examiner* — Eva Y Montalvo

(74) *Attorney, Agent, or Firm* — Birch, Stewart, Kolasch & Birch, LLP

(57) ABSTRACT

An OTP memory device includes a substrate, a first transistor, a second transistor, a first word line, second word line, and a bit line. The first transistor includes a first gate structure, and first and second source/drain regions on opposite sides of the first gate structure. The second transistor is operable in an inversion mode, and the second transistor includes a second gate structure having more work function metal layers than the first gate structure of the first transistor, and second and third source/drain regions on opposite sides of the second gate structure. The first word line is over and electrically connected to the first gate structure of the first transistor. The second word line is over and electrically connected to the second gate structure of the second transistor. The bit line is over and electrically connected to the first source/drain region of the first transistor.

20 Claims, 43 Drawing Sheets

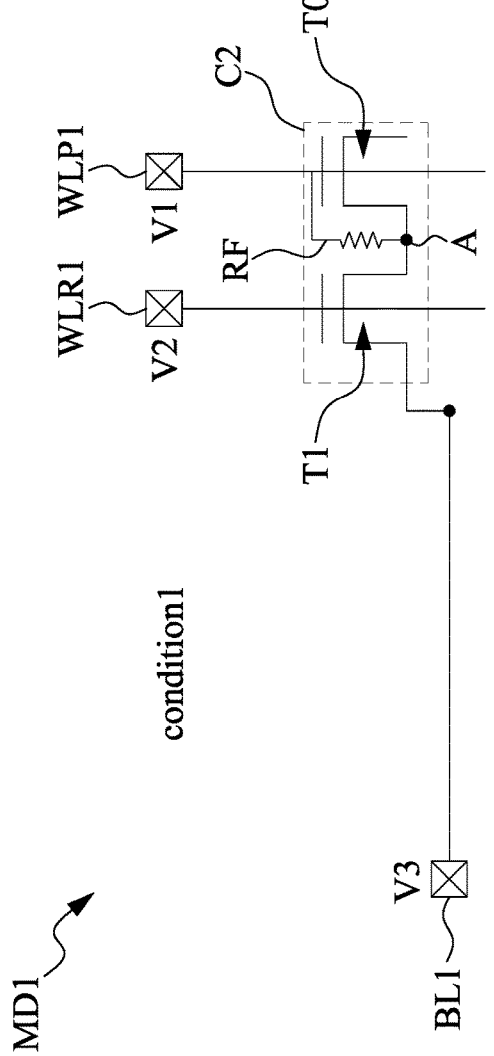
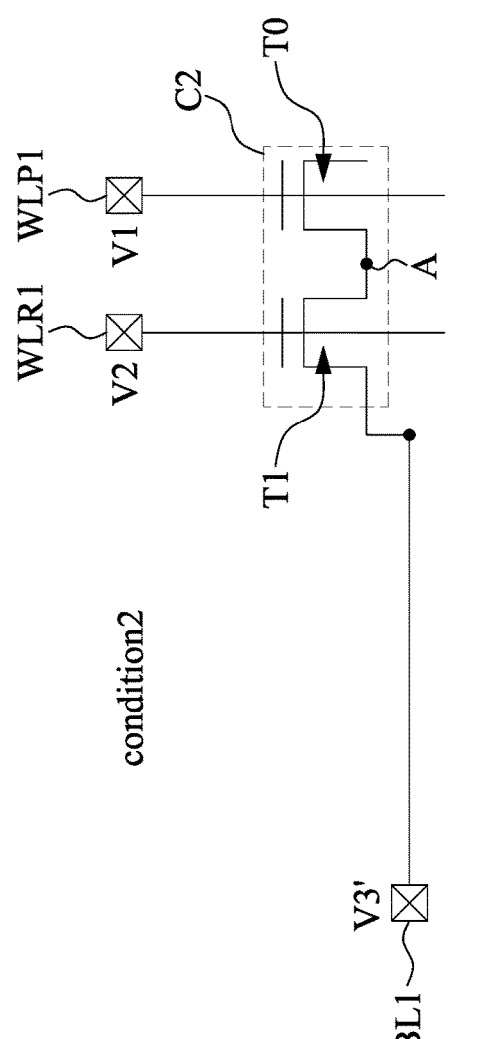
Fig. 2A

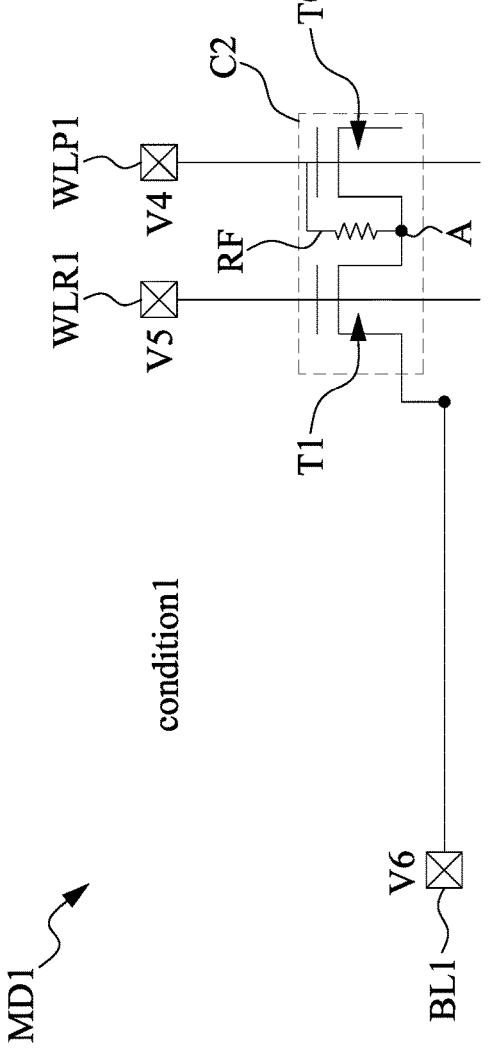
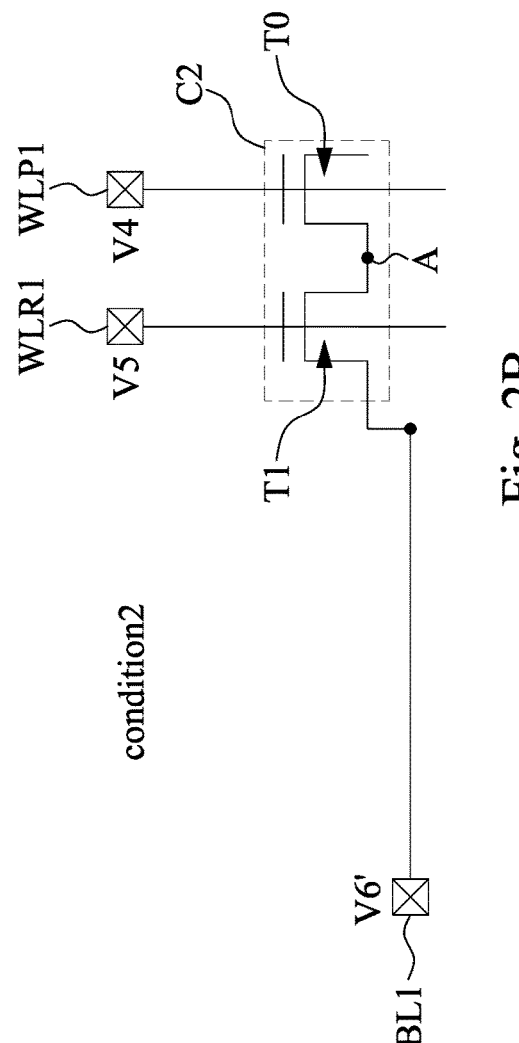
Fig. 2B

1000

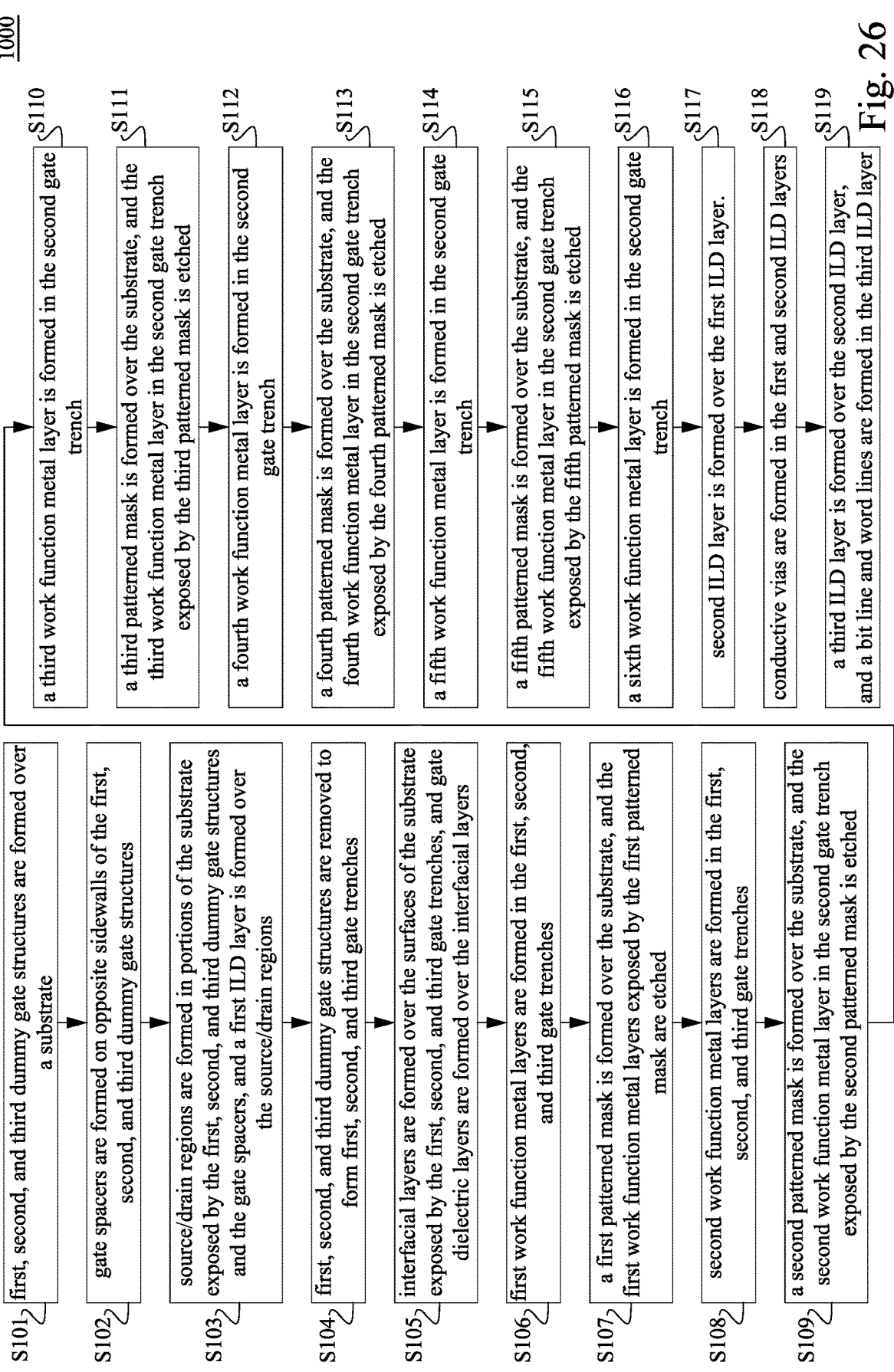

S101  first, second, and third dummy gate structures are formed over a substrate S102  gate spacers are formed on opposite sidewalls of the first, second, and third dummy gate structures S103  source/drain regions are formed in portions of the substrate exposed by the first, second, and third dummy gate structures and the gate spacers, and a first ILD layer is formed over the source/drain regions S104  first, second, and third dummy gate structures are removed to form first, second, and third gate trenches S105  interfacial layers are formed over the surfaces of the substrate exposed by the first, second, and third gate trenches, and gate dielectric layers are formed over the interfacial layers S106  first work function metal layers are formed in the first, second, and third gate trenches S107  a first patterned mask is formed over the substrate, and the first work function metal layers exposed by the first patterned mask are etched S108  second work function metal layers are formed in the first, second, and third gate trenches S109  a second patterned mask is formed over the substrate, and the second work function metal layer in the second gate trench exposed by the second patterned mask is etched S110  a third work function metal layer is formed in the second gate trench S111  a third patterned mask is formed over the substrate, and the third work function metal layer in the second gate trench exposed by the third patterned mask is etched S112  a fourth work function metal layer is formed in the second gate trench S113  a fourth patterned mask is formed over the substrate, and the fourth work function metal layer in the second gate trench exposed by the fourth patterned mask is etched S114  a fifth work function metal layer is formed in the second gate trench S115  a fifth patterned mask is formed over the substrate, and the fifth work function metal layer in the second gate trench exposed by the fifth patterned mask is etched S116  a sixth work function metal layer is formed in the second gate trench S117  second ILD layer is formed over the first ILD layer.

S118  conductive vias are formed in the first and second ILD layers

S119  a third ILD layer is formed over the second ILD layer, and a bit line and word lines are formed in the third ILD layer

Fig. 26

MEMORY DEVICE AND METHOD FOR FORMING THE SAME

BACKGROUND

Integrated circuits (ICs) sometimes include one-time-programmable ("OTP") memory elements to provide non-volatile memory ("NVM") in which data are not lost when the IC is powered off. One type of NVM includes an anti-fuse bit integrated into an IC by using a layer of dielectric material (oxide, etc.) connected to other circuit elements. To program an anti-fuse bit, a programming electric field is applied across the dielectric material layer to sustainably alter (e.g., break down) the dielectric material, thus decreasing the resistance of the dielectric material layer. Typically, to determine the status of an anti-fuse bit, a read voltage is applied across the dielectric material layer and a resultant current is read.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a schematic diagram for performing a programming operation to a memory device in accordance with some embodiments.

FIG. 2B is a schematic diagram for performing a read operation to a memory device in accordance with some embodiments.

FIG. 26 illustrates a method of forming a memory device in accordance with some embodiments of the present disclosure.

DETAILED DESCRIPTION

Figure 1:
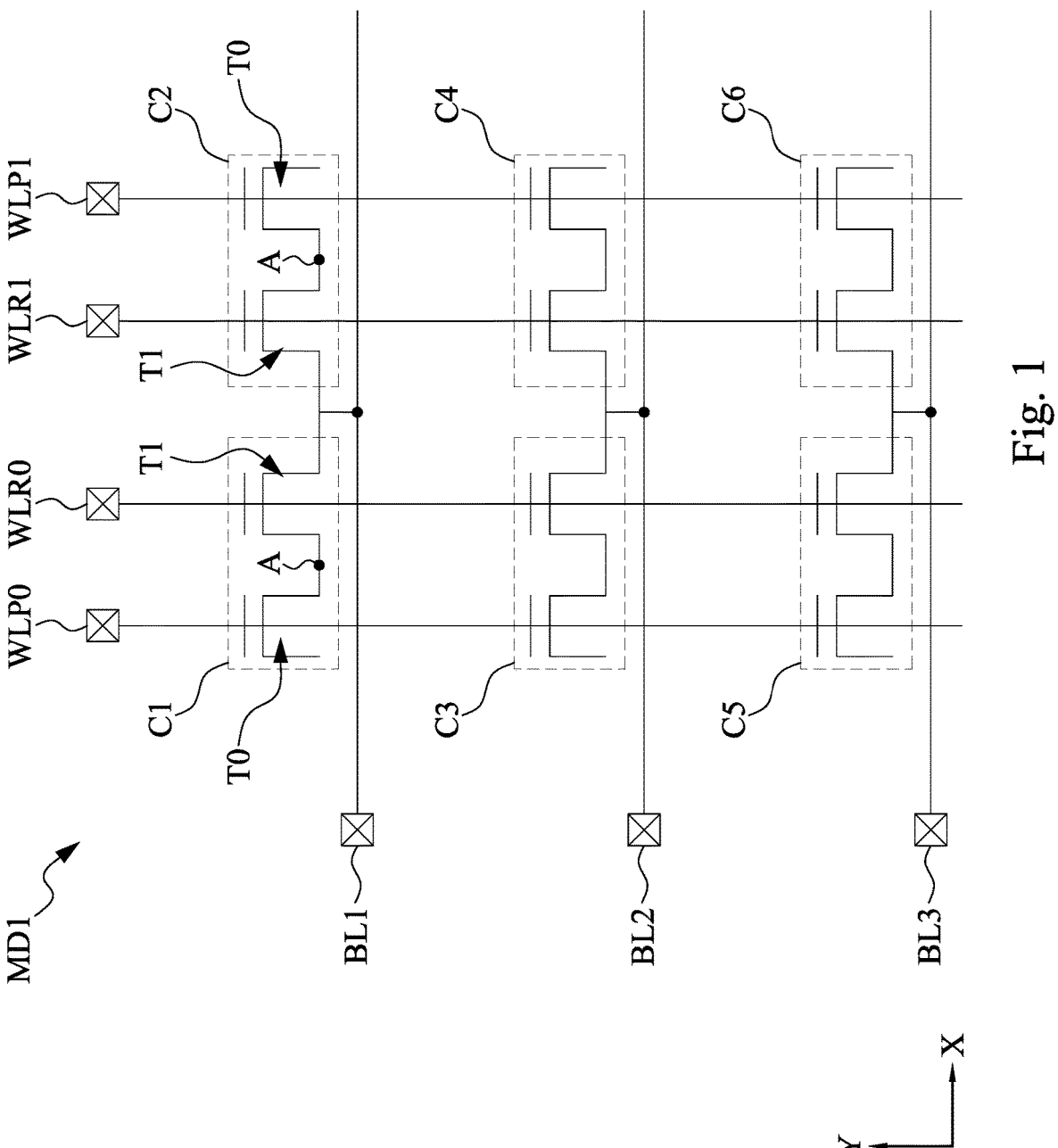
FIG. 1 is a schematic diagram of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present invention includes an embodiment of a one-time programmable (OTP) memory cell. Herein, it may be that the OTP memory cell can be electronically programmed with data only once; and even though power is no longer supplied, programmed data in the OTP memory cell is retained. For example, the OTP memory cell provides an anti-fuse device that includes a substrate and source and drain regions formed in the substrate that are laterally spaced apart to form a channel between them. The anti-fuse device also includes a gate oxide formed on the channel and a gate formed on the gate oxide. Programming of the anti-fuse is performed by applying power to the gate and at least one of the source region and the drain region to break down the gate oxide, which minimizes resistance between the gate and the channel.

FIG. 1 is a schematic circuit of a memory device MD1 in accordance with some embodiment. As depicted in FIG. 1, the memory device MD1 includes a plurality of OTP memory cells C1, C2, C3, C4, C5, and C6, a plurality of word lines WLP0, WLR0, WLR1, WLP1, and a plurality of the bit lines BL1, BL2, BL3. The word lines WLP0, WLR0, WLR1, and WLP1 are arranged in X-direction, and each of the word lines WLP0, WLR0, WLR1, and WLP1 extends along Y-direction. The bit lines BL1, BL2, BL3 are arranged in Y-direction, and each of the bit lines BL1, BL2, BL3 extends along X-direction.

In some embodiments, each of the OTP memory cells C1-C6 includes a first transistor T0 and a second transistor T1. With respect to the OTP memory cell C1, a gate terminal of the first transistor T0 is electrically coupled to the word line WLP0, and a gate terminal of the second transistor T1 is electrically coupled to the word line WLR0. A source/drain terminal of the first transistor T0 is floated, and the other source/drain terminal of the first transistor T0 is electrically coupled to a resistance node A. Herein, since the one source/drain terminal of the first transistor T0 does not have any effect on storing and reading data in the OTP memory cell C1, the one source/drain terminal of the first transistor T0 is floated. One source/drain terminal of the second transistor T1 is also coupled to the resistance node A, and the other source/drain terminal of the second transistor T1 is coupled to a bit line BL1. In some embodiments, the source/drain terminal of the first transistor T0 is electrically coupled to the source/drain terminal of the second transistor T1.

With respect to the OTP memory cell C2, a gate terminal of the first transistor TO is electrically coupled to the word line WLP1, and a gate terminal of the second transistor T1 is electrically coupled to the word line WLR1. A source/drain terminal of the first transistor T0 is floated, and the other source/drain terminal of the first transistor T0 is electrically coupled to a resistance node A. Herein, since the one source/drain terminal of the first transistor T0 does not have any effect on storing and reading data in the OTP memory cell C1, the one source/drain terminal of the first MOS transistor is floated. One source/drain terminal of the second transistor T1 is also coupled to the resistance node A, and the other source/drain terminal of the second transistor T1 is coupled to a bit line BL1. In some embodiments, the source/drain terminal of the first transistor T0 is electrically coupled to the source/drain terminal of the second transistor T1. In some embodiments, the OTP memory cells C1 and C2 share the same bit line BL1.

The OTP memory cells C3-C6 are similar to the OTP memory cells C1 and C2 as described above, and thus relevant details will not be repeated for brevity. Generally, a gate of a transistor is formed by laminating conductive layers on an insulating layer. In some embodiments, the first transistor T0 may act as an anti-fuse. In a programming operation, an insulating layer of the gate of the first transistor TO may be electrically broken down. The second transistor T1 serves as a switching element in order to select the OTP memory cell.

FIG. 2A is a schematic diagram for performing a programming operation to the memory device MD1 of FIG. 1 in accordance with some embodiments. FIG. 2B is a schematic diagram for performing a read operation to the memory device MD1 of FIG. 1 in accordance with some embodiments. It is noted that in FIGS. 2A and 2B, for simplicity, only the OTP memory cell C2 is illustrated. During the programming operation, the bodies of the first and the second MOS transistors M0 and M1 of the OTP memory cell C2 are coupled to a ground voltage.

Reference is made to FIG. 2A, in which FIG. 2A illustrates two different conditions during a programming operation. In condition 1 of FIG. 2A, the word line WLP1 is supplied with a voltage V1, and the world line WLR1 is coupled to a voltage V2 having a lower level than the voltage V1. The bit line BL1 is coupled to a ground voltage V3. Herein, the voltage V2 is a voltage having a sufficient level to turn on the second transistor T1, and the voltage V1 is a voltage having a sufficient level to electrically breakdown an insulating layer (e.g., the interfacial layer 162 and gate dielectric layer 164 described in FIG. 5A) included in a gate structure (e.g., the gate structure 170B described in FIG. 5A) of the first transistor T0. In some embodiments, the voltage V2 may be about 1.8V to about 2.4V, which is sufficiently high to turn on the second transistor T1, and the voltage V1 may be 4.8V. On the other hand, the ground voltage V3 can be regarded as having a voltage level of about 0V.

Since the gate of second transistor T1 is supplied with a voltage V2 that is sufficiently high to turn on the second transistor T1, the gate of the second transistor T1 is turned on, and thus the resistance node A is coupled to the ground voltage V3. The gate of the first transistor T0 is coupled to the voltage V1. Due to a difference of voltage level supplied to the gate (e.g., voltage V1) and voltage level supplied to the one terminal of the first transistor T0 (e.g., voltage V3), the insulating layer of the first transistor T0 is electrically broken down. When the insulating layer is electrically broken down, a current path is created between the word line WLP1 and the resistance node A. The resulting circuit can be regarded as having a resistance RF in the current path. Accordingly, in condition 1, the OTP memory cell C2 can be referred to as "programmed" after the programming operation, because the insulating layer of the first transistor T0 is electrically broken down.

On the other hand, in condition 2 of FIG. 2A, the word line WLP1 is supplied with the voltage V1, and the world line WLR1 is coupled to the voltage V2 having a lower level than the voltage V1. The bit line BL1 is coupled to a voltage V3'. Here, the voltage V3' has a higher voltage level than the ground voltage V3 as described in condition 1 of FIG. 2A. For example, the voltage V3' may be about 0.3V, which is higher than the ground voltage V3 (e.g., about 0V). In some embodiments, the voltage V3' has substantially the same value as the voltage V2, such that the voltage difference between the gate terminal of the second transistor T1 and the source region terminal of the second transistor T1 may be about zero so that the second transistor T1 is turned off, and the source/drain terminal of the second transistor T1 connected to the first transistor T0 is floated. Even though the voltage V1 is applied to the first transistor T0 through the word line WLP1, an electric field will not be applied to the insulating layer of the second transistor T1 because the source/drain terminal of the first transistor TO connected to the second transistor T1 is floated. In this way, the insulating layer of the first transistor T0 may not be broken down during the programming operation, the first transistor T0 remains its original function after the programming operation. Accordingly, in condition 2, the OTP memory cell C2 can be referred to as "un-programmed" after the programming operation, because the insulating layer of the first transistor T0 is not electrically broken down.

Reference is made to FIG. 2B, in which FIG. 2B illustrates two different conditions during a read operation. It is noted that the condition 1 of FIG. 2B follows the condition 1 of FIG. 2A, and the condition 2 of FIG. 2B follows the condition 2 of FIG. 2A.

In a read operation, the word line WLP1 is supplied with a power voltage V4, and the word line WLR1 is coupled to the power voltage V5. The bit line BL1 is precharged with a ground voltage level V6. The power voltage V5 is sufficiently high to turn on the second transistor T1.

In condition 1 of FIG. 2A where the insulating layer included in the gate structure of first transistor T0 is electrically broken down, the voltage of the bit line BL1 may increase, and a current path between the gate of the first transistor T0 and the bit line BL1 may increase as well. On the other hand, in condition 2 where the insulating layer included in the gate structure of first transistor T0 is not electrically broken down, the voltage level of bit line BL1 does not rise and therefore retains the precharged voltage level (i.e., ground voltage level V6), and thus there is no current path between the gate of the first transistor T0 and the bit line BL1. Data can be read depending on whether there is current on the bit line BL1. For instance, in condition 1, if the voltage or the current of the bit line BL increases because of the breakdown of the insulating layer of the first transistor T0, data '1' can be determined. On the other hand, if the voltage or the current of the bit line BL does not rise, data '0' can be determined. That is, if the insulating layer breaks down, the bit line BL1 may have a logic level of '1'; if the insulating layer does not break down, the bit line BL1 may have a logic level of '0'.

Figure 3:
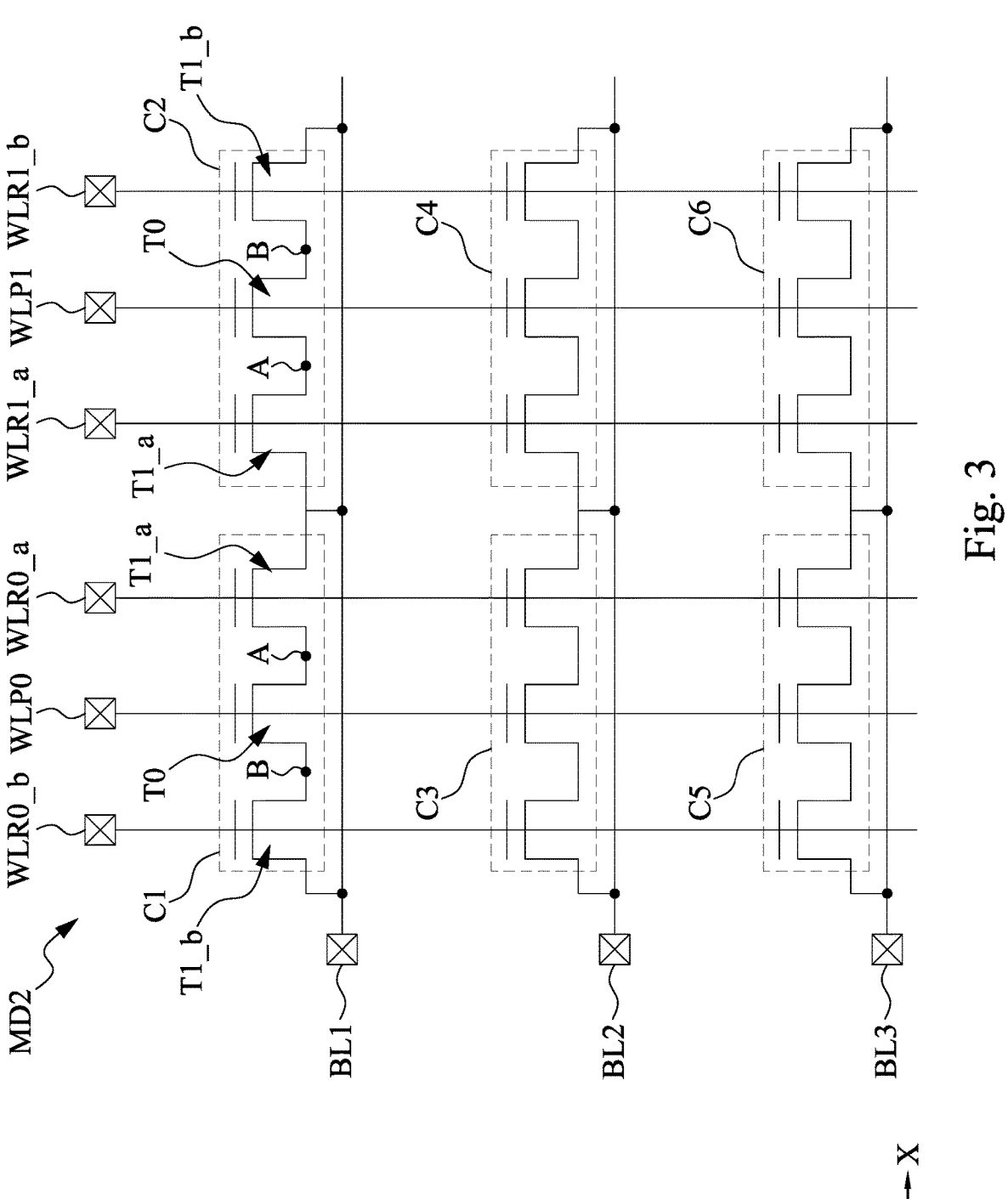
FIG. 3 is a schematic diagram of a memory device in accordance with some embodiments.

FIG. 3 is a schematic circuit of a memory device MD2 in accordance with some embodiment. Some elements of the memory device MD2 of FIG. 3 are similar to those described with respect to the memory device MD1 of FIG. 1, and thus relevant details will not be repeated for simplicity. The memory device MD2 of FIG. 3 is different from the memory device MD1 of FIG. 1, in that the each of the OTP memory cells C3-C6 of memory device MD2 includes a first transistor T0, a second transistor T1_a, and a third transistor T1_b. Moreover, the memory device MD2 includes a plurality of word lines WLP0, WLR0_a, WLR0_b, WLP1, WLR1_a, and WLR1_b.

With respect to the OTP memory cell C1 of memory device MD2, a gate terminal of the first transistor T0 is electrically coupled to the word line WLP0, a gate terminal of the second transistor T1_a is electrically coupled to the word line WLR0_a, and a gate terminal of the third transistor T1_b is electrically coupled to the word line WLR0_b. A source/drain terminal of the first transistor T0 is electrically coupled to a resistance node A, and the other source/drain terminal of the first transistor T0 is electrically coupled to a resistance node B. One source/drain terminal of the second transistor T1_a is also coupled to the resistance node A, and the other source/drain terminal of the second transistor T1_a is coupled to the bit line BL1. Similarly, one source/drain terminal of the third transistor T1_b is coupled to the resistance node B, and the other source/drain terminal of the third transistor T1_b is coupled to the bit line BL1. In some embodiments, the source/drain terminal of the first transistor T0 is electrically coupled to the source/drain terminal of the second transistor T1_a, and the other source/drain terminal of the first transistor T0 is electrically coupled to the source/drain terminal of the second transistor T1_a.

With respect to the OTP memory cell C2 of memory device MD2, a gate terminal of the first transistor T0 is electrically coupled to the word line WLP1, and a gate terminal of the second transistor T1_a is electrically coupled to the word line WLR1_a, and a gate terminal of the third transistor T1_b is electrically coupled to the word line WLR1_b. A source/drain terminal of the first transistor T0 is electrically coupled to a resistance node A, and the other source/drain terminal of the first transistor T0 is electrically coupled to a resistance node B. One source/drain terminal of the second transistor T1_a is also coupled to the resistance node A, and the other source/drain terminal of the second transistor T1_a is coupled to the bit line BL1. Similarly, one source/drain terminal of the third transistor T1_b is coupled to the resistance node B, and the other source/drain terminal of the third transistor T1_b is coupled to the bit line BL1. In some embodiments, the source/drain terminal of the first transistor T0 is electrically coupled to the source/drain terminal of the second transistor T1_a, and the other source/drain terminal of the first transistor T0 is electrically coupled to the source/drain terminal of the second transistor T1_a. In some embodiments, the OTP memory cells C1 and C2 share the same bit line BL1.

The OTP memory cells C3-C6 of memory device MD2 are similar to the OTP memory cells C1 and C2 of memory device MD2 as described above, and thus relevant details will not be repeated for brevity. Generally, a gate of a transistor is formed by laminating conductive layers on an insulating layer. In a programming operation, an insulating layer of the gate of the first transistor T0 may be electrically broken down. The second transistor T1_a and the third transistor T1_b serve as switching elements in order to select the OTP memory cells.

Figure 4A:
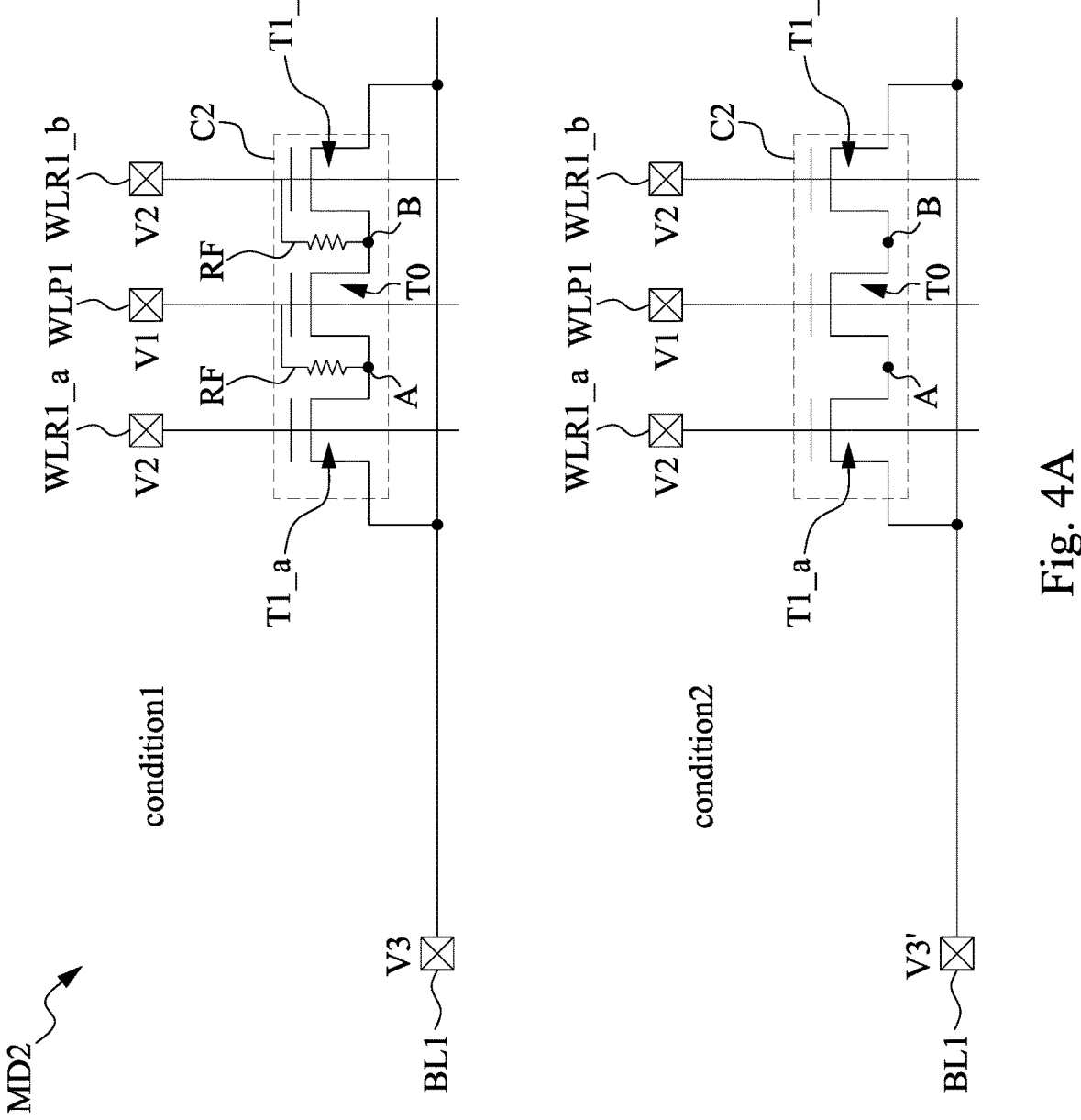
FIG. 4A is a schematic diagram for performing a programming operation to a memory device in accordance with some embodiments.
Figure 4B:
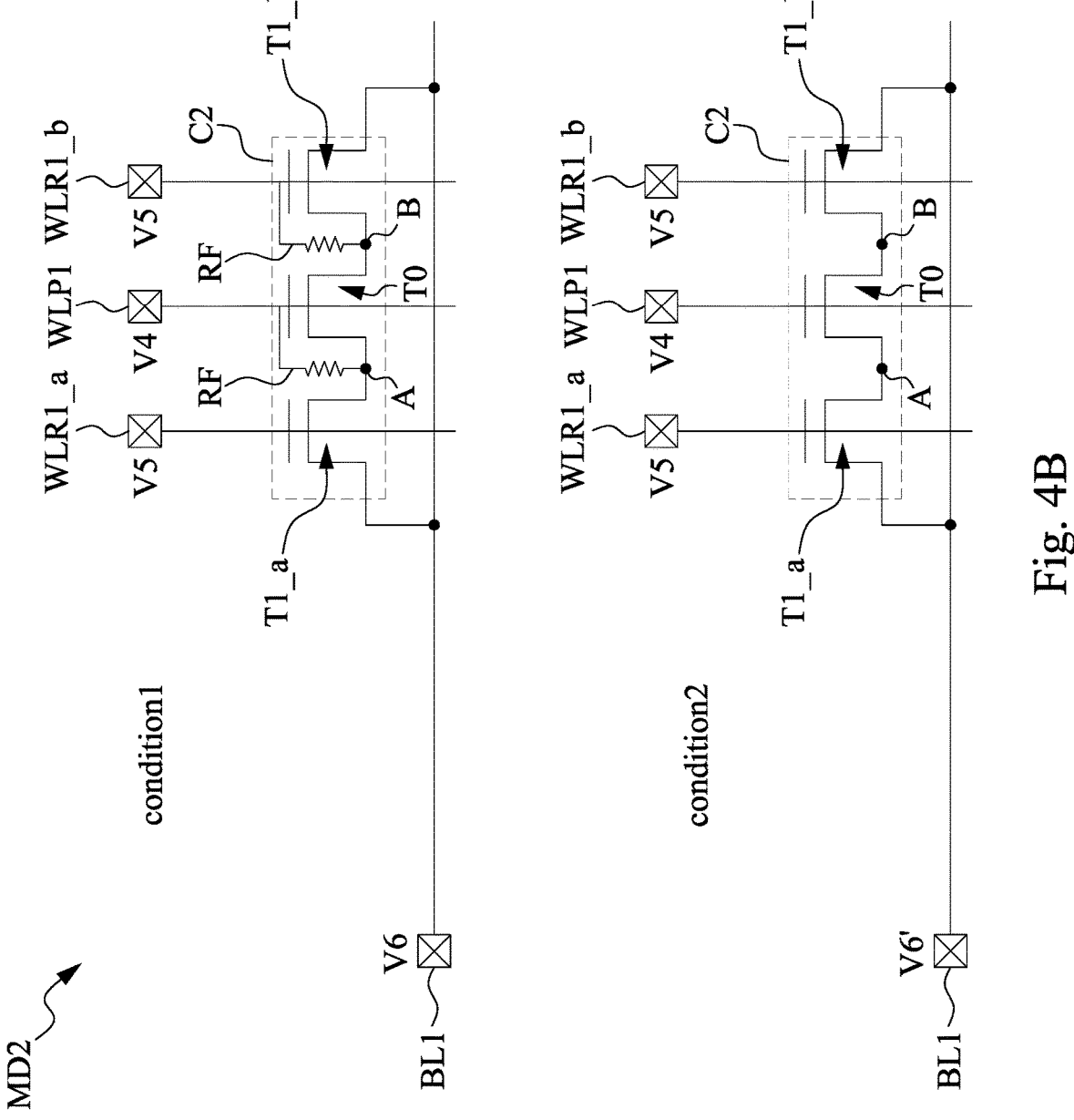
FIG. 4B is a schematic diagram for performing a read operation to a memory device in accordance with some embodiments.

FIG. 4A is a schematic diagram for performing a programming operation to the memory device MD2 of FIG. 3 in accordance with some embodiments. FIG. 4B is a schematic diagram for performing a read operation to memory device MD2 of FIG. 3 in accordance with some embodiments. The programming operation of FIG. 4A and the read operation of FIG. 4B are similar to those described in FIGS. 2A, and 2B, and thus relevant details may be omitted for simplicity.

Reference is made to FIG. 4A, in which FIG. 4A illustrates two different conditions during a programming operation. In condition 1 of FIG. 4A, the word line WLP1 is supplied with a voltage V1, and the world lines WLR1_a and WLR1_b are coupled to a voltage V2. That is, during the programming operation, the world line WLR1_a and WLR1_b are coupled to the same voltage level. The bit line BL1 is coupled to a ground voltage V3. Herein, the voltage V2 is a voltage having a sufficient level to turn on the second transistor T1_a and the third transistor T1_b, and the voltage V1 is a voltage having a sufficient level to electrically breakdown an insulating layer (e.g., the interfacial layer 162 and gate dielectric layer 164 described in FIG. 5B) included in a gate structure (e.g., the gate structure 170B described in FIG. 5B) of the first transistor T0. In some embodiments, the voltage V2 may be about 1.8V to about 2.4V, which is sufficiently high to turn on the second transistor T1, and the voltage V1 may be 4.8V. On the other hand, the ground voltage V3 can be regarded as having a voltage level of about 0V.

Since the gate of second transistor T1_a and the gate of third transistor T1_b are supplied with a voltage V2 that is sufficiently high to turn on the second transistor T1_a and the third transistor T1_b, the gate of second transistor T1_a and the gate of third transistor T1_b are turned on, and thus the resistance nodes A and B are coupled to the ground voltage V3. The gate of the first transistor T0 is coupled to the voltage V1. Due to a difference of voltage level supplied to the gate (e.g., voltage V1) and voltage level supplied to the terminals of the first transistor T0 (e.g., voltage V3), the insulating layer of the first transistor T0 is electrically broken down. When the insulating layer is electrically broken down, a current path is created between the word line WLP1 and the resistance nodes A and B. The resulting circuit can be regarded as having resistances RF in the current path. Accordingly, in condition 1, the OTP memory cell C2 can be referred to as "programmed" after the programming operation, because the insulating layer of the first transistor T0 is electrically broken down.

On the other hand, in condition 2 of FIG. 4A, the word line WLP1 is supplied with the voltage V1, and the world lines WLR1_a and WLR1_b are coupled to the voltage V2. The bit line BL1 is coupled to a voltage V3'. Here, the voltage V3' has a higher voltage level than the ground voltage V3 as described in condition 1 of FIG. 4A. For example, the voltage V3' may be about 0.3_V, which is higher than the ground voltage V3 (e.g., about 0V). In some embodiments, the voltage V3' has substantially the same value as the voltage V2, such that the voltage difference between the gate terminal of the second transistor T1_a and the source region terminal of the second transistor T1_a may be about zero, and the voltage difference between the gate terminal of the third transistor T1_b and the source region terminal of the third transistor T1_b may be about zero, so that the second and third transistors T1_a and T1_b are turned off, and the source/drain terminals of the second and third transistors T1_a and T1_b connected to the first transistor T0 are floated. Even though the voltage V1 is applied to the first transistor T0 through the word line WLP1, an electric field will not be applied to the insulating layer of the second transistor T1_a and the insulating layer of the third transistor T1_b, because the source/drain terminals of the first transistor T0 connected to the second transistor T1_a and the third transistor T1_b are floated. In this way, the insulating layer of the first transistor T0 may not be broken down during the programming operation, the first transistor T0 remains its original function after the programming operation. Accordingly, in condition 2, the OTP memory cell C2 can be referred to as "un-programmed" after the programming operation, because the insulating layer of the first transistor T0 is not electrically broken down.

Reference is made to FIG. 4B, in which FIG. 4B illustrates two different conditions during a read operation. It is noted that the condition 1 of FIG. 4B follows the condition 1 of FIG. 4A, and the condition 2 of FIG. 4B follows the condition 2 of FIG. 4A.

In a read operation, the word line WLP1 is supplied with a power voltage V4, and the word lines WLR1_a and WLR1_b are coupled to the power voltage V5. The bit line BL1 is precharged with a ground voltage level V6. The power voltage V5 is sufficiently high to turn on the second and third transistors T1_a and T1_b.

In condition 1 of FIG. 4A where the insulating layer included in the gate structure of first transistor T0 is electrically broken down, the voltage of the bit line BL1 may increase, and a current path between the gate of the first transistor T0 and the bit line BL1 may increase as well. On the other hand, in condition 2 where the insulating layer included in the gate structure of first transistor T0 is not electrically broken down, the voltage level of bit line BL1 does not rise and therefore retains the precharged voltage level (i.e., ground voltage level V6), and thus there is no current path between the gate of the first transistor T0 and the bit line BL1. Data can be read depending on whether there is current on the bit line BL1. For instance, in condition 1, if the voltage or the current of the bit line BL increases because of the breakdown of the insulating layer of the first transistor T0, data '1' can be determined. On the other hand, if the voltage or the current of the bit line BL does not rise, data '0' can be determined. That is, if the insulating layer breaks down, the bit line BL1 may have a logic level of '1'; if the insulating layer does not break down, the bit line BL1 may have a logic level of '0'.

Figure 5A:
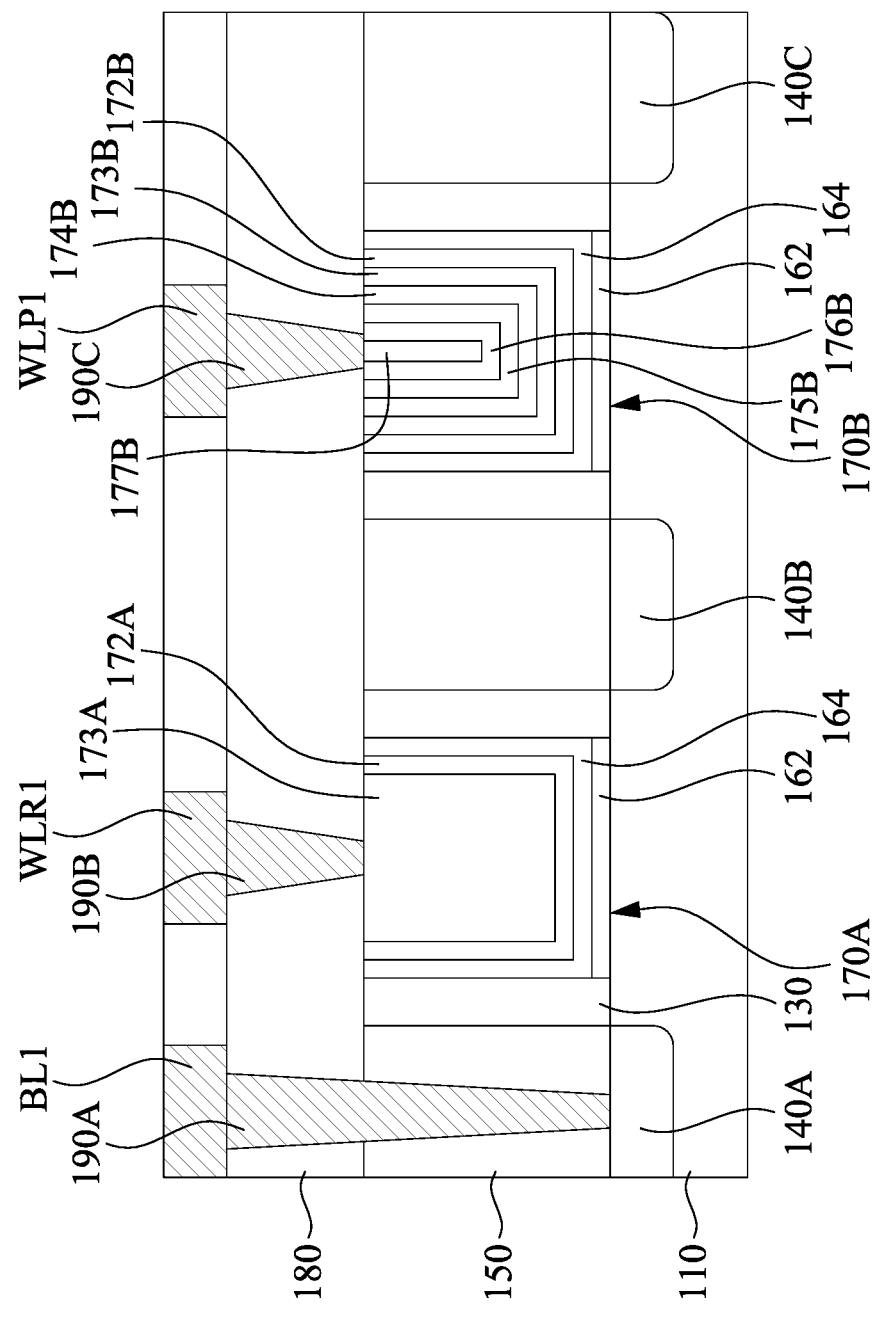
FIGS. 5A and 5B are cross-sectional views of memory device in accordance with some embodiments.
Figure 5B:
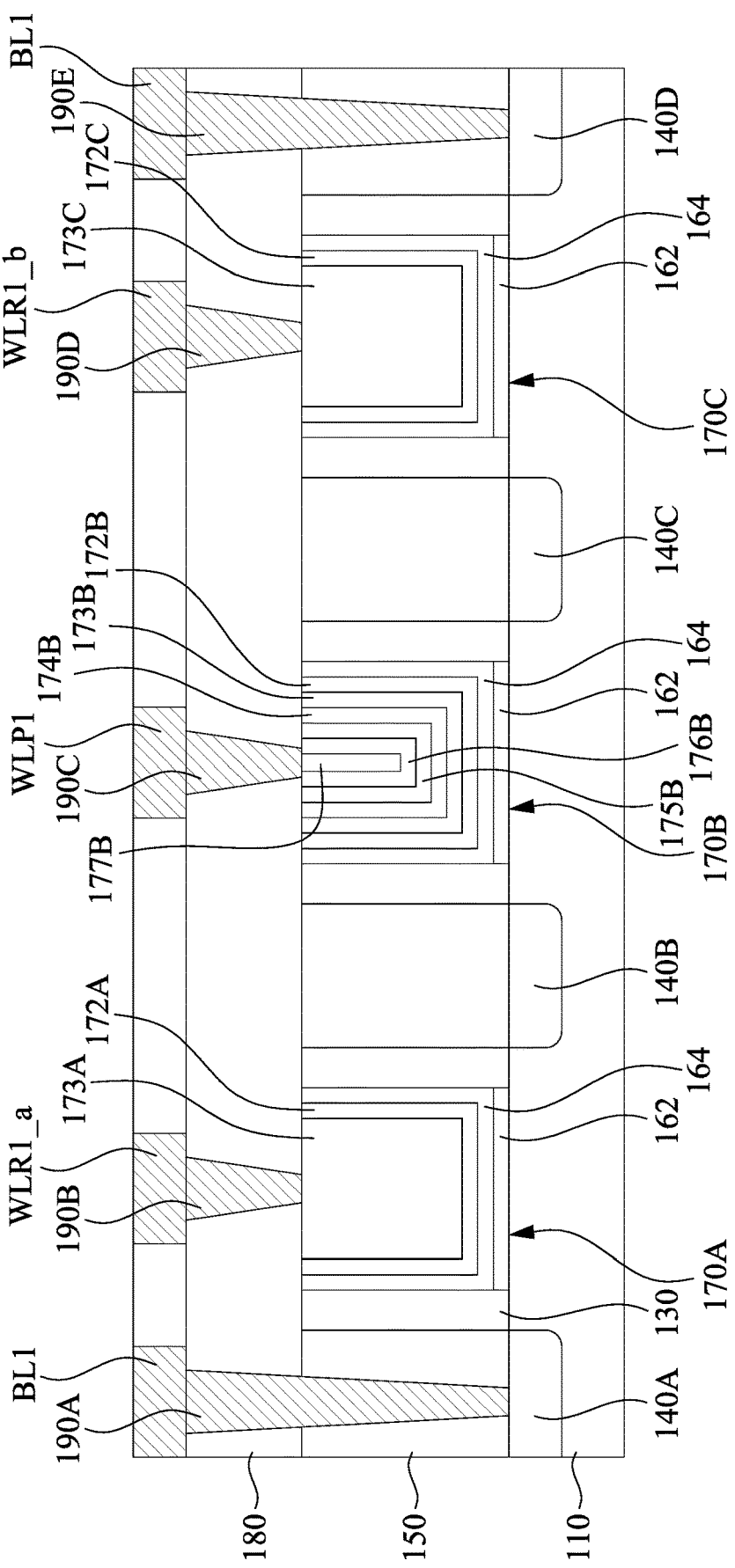

FIGS. 5A and 5B are cross-sectional views of memory device in accordance with some embodiments. In some embodiments, the cross-sectional view of FIG. 5A corresponds to the OTP memory cell C2 of the memory device MD1 as discussed in FIGS. 1 to 2B, and the cross-sectional view of FIG. 5B corresponds to the OTP memory cell C2 of the memory device MD2 as discussed in FIGS. 3 to 4B.

Reference is made to FIG. 5A. Shown there is a substrate 100. In some embodiments, the substrate 100 may include may be a semiconductor material and may include known structures including a graded layer or a buried oxide, for example. In some embodiments, the substrate 100 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 100. Alternatively, the silicon substrate 100 may be an active layer of a semiconductor-on-insulator (SOI) substrate or a multi-layered structure such as a silicon-germanium layer formed on a bulk silicon layer.

A metal gate structure 170A and a metal gate structure 170B are disposed over the substrate 100. In some embodiments, the metal gate structure 170A includes an interfacial layer 162, a gate dielectric layer 164, a first work function metal layer 172A, and a second work function metal layer 173A. The metal gate structure 170B includes an interfacial layer 162, a gate dielectric layer 164, a first work function metal layer 172B, a second work function metal layer 173B, a third work function metal layer 174B, a fourth work function metal layer 175B, a fifth work function metal layer 176B, and a sixth work function metal layer 177B. In some embodiments, the metal gate structure 170B has more work function metal layers than the metal gate structure 170A.

In some embodiments, interfacial layer 162 may be made of oxide, such as $SiO_2$. In some embodiments, the gate dielectric layers 164 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HMO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

In some embodiments, the work function metal layers 172A to 173A and 172B to 177B may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary re-type work function metals include Ti, Ag, TaAl, TaAIC, TiAIN, TaC, TaCN, TaSiN, Mn, Zr, other suitable n-type work function materials, or combinations thereof. Gate spacers 130 are disposed on opposite sidewalls of the metal gate structures 170A and 170B, respectively. In some embodiments, the gate spacers 130 may be made of may include $SiO_2$, $Si_3N_4$, $SiO_xN_y$, SiC, SiCN films, SiOC, SiOCN films, and/or combinations thereof.

For example, the work function metal layers 172A and 173A may be TaAl and TaAl, respectively. On the other hand, the work function metal layers 172B, 173B, 174B, 175b, 176B, and 177B may be TaAl, TiA N TiAlN, TaAl, TaAl, and TaAl, respectively.

Source/drain regions 140A, 140B, and 140C are disposed in the substrate 100. In some embodiments, the source/drain regions 140A and 140B are disposed on opposite sides of the metal gate structure 170A, and the source/drain regions 140B and 140C are disposed on opposite sides of the metal gate structure 170B. The source/drain region 140B is disposed between the metal gate structures 170A and 170B. That is, the metal gate structures 170A and 170B share the same source/drain region 140B.

In some embodiments, the metal gate structure 170A, the source/drain regions 140A and 140B, and portion of the substrate 100 under the metal gate structure 170A form the transistor T1 of OTP memory cell C2 as discussed in FIGS. 1 to 2B. Similarly, the metal gate structure 170B, the source/drain regions 140B and 140C, and portion of the substrate 100 under the metal gate structure 170B form the transistor T0 of OTP memory cell C2 as discussed in FIGS. 1 to 2B.

In some embodiments, the source/drain regions 140A, 140B, and 140C include p-type dopants such as boron for formation of p-type FETs. In other embodiments, the source/drain regions 140A, 140B, and 140C include n-type dopants such as phosphorus for formation of n-type FETs. In some embodiments, the source/drain regions 140A, 140B, and 140C may be epitaxially grown regions. Accordingly, the source/drain regions 140A, 140B, and 140C may also be referred to as epitaxy source/drain structures. In some embodiments, if the source/drain regions 140A, 140B, and 140C are epitaxially grown, the source/drain regions 140A, 140B, and 140C may include Ge, Si, GaAs, AlGaAs, SiGe, GaAsP, SiP, or other suitable material.

An interlayer dielectric (ILD) layer 150 is disposed over the source/drain regions 140A, 140B, and 140C, and laterally surrounds the metal gate structures 170A and 170B. In some embodiments, the ILD layer 150 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, a contact etch stop layer (CESL) (not shown) may be optionally formed between the ILD layer 150 and the source/drain epitaxy structures 140A, 140B, and 140C. The CESL may include material different from the ILD layer 150, thus resulting in different etch selectivity between CESL and the ILD layer 150. In some embodiments, the CESL includes silicon nitride, silicon oxynitride or other suitable materials.

An interlayer dielectric (ILD) layer 180 is disposed over the ILD layer 150 and covers the metal gate structures 170A and 170B. In some embodiments, the material of the ILD layer 180 may be similar to the ILD layer 150.

Conductive vias 190A, 190B, and 190C are disposed in the ILD layers 150 and 180. In greater details, the conductive via 190A extends through the ILD layers 150 and 180 and is in contact with the source/drain region 140A, the conductive via 190B extend through the ILD layer 180 and is in contact with the metal gate structure 170A, and the conductive via 190C extend through the ILD layer 180 and is in contact with the metal gate structure 170B. In some embodiments, the conductive vias 190A, 190B, and 190C may be a conductive material, and may be made of metal, such as copper (Cu), aluminum (Al), ruthenium (Ru), cobalt (Co), molybdenum (Mo), nickel (Ni), tungsten (W), or the like.

An interlayer dielectric (ILD) layer 185 is disposed over the ILD layer 180. In some embodiments, the material of the ILD layer 185 may be similar to the ILD layer 150.

A bit line BL1, a word line WLR1, and a word line WLP1 is disposed in the ILD layer 185. In greater detail, the bit line BL1 is in contact with the conductive via 190A and is electrically connected to the source/drain region 140A. The word line WLR1 is in contact with the conductive via 190B and is electrically connected to the metal gate structure 170A. The word line WLP1 is in contact with the conductive via 190C and is electrically connected to the metal gate structure 170B. In some embodiments, the bit line BL1, the word line WLR1, and the word line WLP1 may be a conductive material, and may be made of metal, such as copper (Cu), aluminum (Al), ruthenium (Ru), cobalt (Co), molybdenum (Mo), nickel (Ni), tungsten (W), or the like.

Reference is made to FIG. 5B. It is noted that some elements of FIG. 5B are similar to those described in FIG. 5A, and thus relevant details will not be repeated for simplicity.

A metal gate structure 170A, a metal gate structure 170B, and a metal gate structure 170C are disposed over the substrate 100. In some embodiments, the metal gate structure 170C is similar to the metal gate structure 170A. For example, the metal gate structure 170C has an interfacial layer 162, a gate dielectric layer 164, a first work function metal layer 172C, and a second work function metal layer 173C. In some embodiments, the metal gate structures 170A and 170C have the same number of work function metal layers. However, the metal gate structures 170A and 170C have less work function metal layers than the metal gate structure 170B. In some embodiments, the number of work function metal layers in the metal gate structure 170B is at least three times the number of work function metal layers in the metal gate structures 170A and 170C.

Source/drain regions 140A, 140B, 140C, and 140D are disposed in the substrate 100. In some embodiments, the metal gate structure 170A, the source/drain regions 140A and 140B, and portion of the substrate 100 under the metal gate structure 170A form the transistor T1_a of OTP memory cell C2 as discussed in FIGS. 3 to 4B. The metal gate structure 170B, the source/drain regions 140B and 140C, and portion of the substrate 100 under the metal gate structure 170B form the transistor T0 of OTP memory cell C2 as discussed in FIGS. 3 to 4B. The metal gate structure 170C, the source/drain regions 140C and 140D, and portion of the substrate 100 under the metal gate structure 170C form the transistor T1_b of OTP memory cell C2 as discussed in FIGS. 3 to 4B.

Conductive vias 190A, 190B, 190C, 190D, and 190E are disposed in the ILD layers 150 and 180. In greater details, the conductive via 190A extends through the ILD layers 150 and 180 and is in contact with the source/drain region 140A, the conductive via 190B extend through the ILD layer 180 and is in contact with the metal gate structure 170A, the conductive via 190C extend through the ILD layer 180 and is in contact with the metal gate structure 170B, the conductive via 190D extend through the ILD layer 180 and is in contact with the metal gate structure 170C, and the conductive via 190E extends through the ILD layers 150 and 180 and is in contact with the source/drain region 140D.

A bit line BL1, a word line WLR1_a, a word line WLP1, and a word line WLR1_b is disposed in the ILD layer 185. In greater detail, the bit line BL1 is in contact with the conductive vias 190A and 190E and is electrically connected to the source/drain regions 140A and 140D. The word line WLR1_a is in contact with the conductive via 190B and is electrically connected to the metal gate structure 170A. The word line WLP1 is in contact with the conductive via 190C and is electrically connected to the metal gate structure 170B. The word line WLR1_b is in contact with the conductive via 190D and is electrically connected to the metal gate structure 170C.

Figures 6A, 6B, 6C:
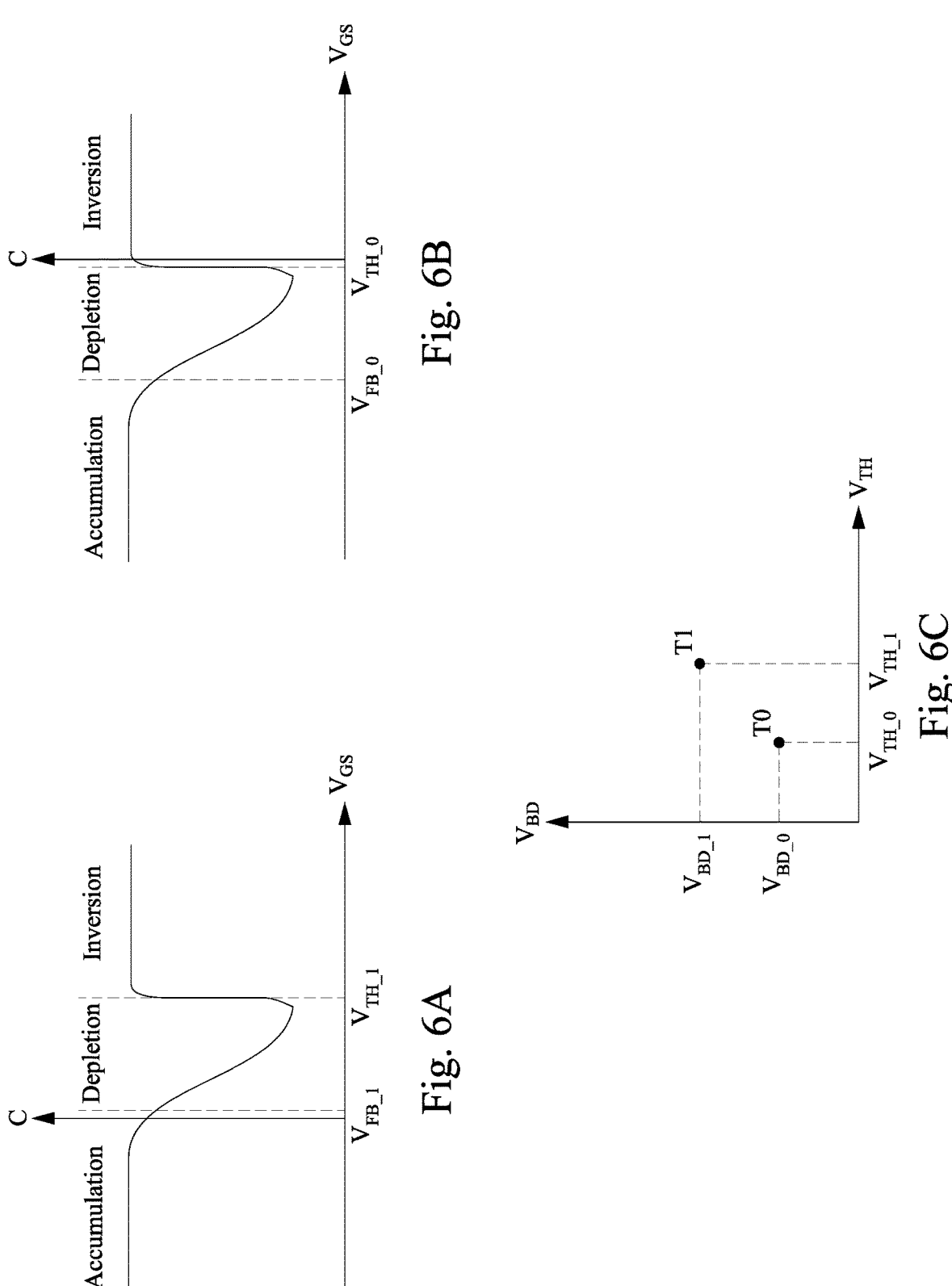
FIGS. 6A and 6B are C-V diagrams of memory devices in accordance with some embodiments.
FIG. 6C is a $V_{BD}$-$V_{TH}$ diagram of memory devices in accordance with some embodiments.

FIGS. 6A and 6B are C-V diagrams of memory devices in accordance with some embodiments. A property of a metal-oxide-semiconductor (MOS) structure is that its capacitance changes with an applied DC voltage. As a result, the modes of operation of the MOS structure change as a function of the applied voltage. As a voltage is applied to the gate terminal (e.g., word lines WLR1, WLR1_a, WLR1_b in FIGS. 5A and 5B), it causes the device to pass through accumulation, depletion, and inversion regions.

Reference is made to FIG. 6A, in which the FIG. 6A is a C-V diagram of the transistor T1 as discussed in FIGS. 1, 2A, 2B, and 5A and the transistors T1_a and T1_b as discussed in FIGS. 3, 4A, 4B, and 5B. Here, the transistors T1, T1_a, and T1_b are N-type transistors, such as NMOS devices. The transistor T1 is used as an example in the following discussion, while it is noted that the transistors T1_a and T1_b may have the same property as the transistor T1.

When $V_{GS}$ is negative, holes are attracted towards the surface of the silicon (e.g., substrate 100), forming an accumulation layer, which can be referred to as "accumulation mode."

As the $V_{GS}$ increases beyond the flat-band voltage $V_{FB\_1}$ of transistor T1, the majority carriers are replaced from the semiconductor-oxide interface (e.g., the interface of substrate 100 and the interfacial layer 162/gate dielectric layer 164). This state of the semiconductor is called depletion because the surface of the semiconductor is depleted of majority carriers, which can be referred to as "depletion mode." This area of the semiconductor acts as a dielectric because it can no longer contain or conduct charge. In effect, it becomes a semi-insulator.

As the gate voltage $V_{GS}$ further increases beyond the threshold voltage $V_{TH\_1}$ of transistor T1, dynamic carrier generation and recombination move toward net carrier generation. The positive gate voltage generates electron-hole pairs and attracts electrons toward the gate terminal. Again, because the gate dielectric is an insulator, these minority carriers accumulate at the substrate-to-oxide/well-to-oxide interface. The accumulated minority-carrier layer is called the inversion layer because the carrier polarity is inverted, which can be referred to as "inversion mode." Above a certain positive gate voltage, most available minority carriers are in the inversion layer, and further gate voltage increases do not further deplete the semiconductor. That is, the depletion region reaches a maximum depth. Once the depletion region reaches a maximum depth, the capacitance that is measured by the high frequency capacitance meter is the oxide capacitance in series with the maximum depletion capacitance. This capacitance is often referred to as minimum capacitance. The C-V curve slope is almost flat.

In some embodiments of FIG. 6A, when a positive gate voltage $V_{GS}$ is applied, the transistor (e.g., the transistors T1, T1_a, and T1_b) is operated at the "accumulation mode." Accordingly, the transistor T1 (or the transistors T1_a and T1_b) can also be referred to as an "accumulation mode transistor" or "accumulation operation mode transistor."

Reference is made to FIG. 6B, in which the FIG. 6B is a C-V diagram of the transistor T0 as discussed in FIGS. 5A and 5B. Here, the transistor T0 is an N-type transistor, such as an NMOS device.

The transistor T0 of FIG. 6B has substantially the same C-V property as the transistor T1 of FIG. 6A, and thus relevant details will not be repeated for simplicity. FIG. 6B is different from FIG. 6A, in that the flat-band voltage $V_{FB\_0}$ and the threshold voltage $V_{TH\_0}$ of the transistor T0 are lower than the flat-band voltage $V_{FB\_1}$ and the threshold voltage VTH_1 of the transistor T1 (or the transistors T1_a and T1_b), respectively.

In some embodiments, the flat-band voltage $V_{FB\_0}$ of the transistor T0 is lower than 0 (e.g., negative value). In some embodiments, the threshold voltage $V_{TH\_0}$ of the transistor T0 is substantially equal to 0. For example, the threshold voltage $V_{TH\_0}$ of the transistor T0 may be in a range of about −0V to 0.4V. In some embodiments, the threshold voltage $V_{TH\_0}$ of the transistor T0 is lower than 0 (e.g., negative value). For example, the threshold voltage $V_{TH\_0}$ of the transistor T0 may be in a range of about −0.4 V to 0 V.

In some embodiments, if the threshold voltage $V_{TH\_0}$ of the transistor 0 is lower than 0, when a positive gate voltage $V_{GS}$ is applied, the transistor T0 is operated at the "inversion mode." Accordingly, the transistor T0 can also be referred to as an "inversion mode transistor" or "inversion operation mode transistor."

In some embodiments, if the threshold voltage $V_{TH\_0}$ of the transistor 0 is slightly larger than 0, when a positive gate voltage $V_{GS}$ is applied, the transistor T0 is operated at the "depletion mode." Accordingly, the transistor T0 can also be referred to as "depletion mode transistor" or "depletion operation mode transistor." However, the transistor T0 may quickly change to the "inversion mode" as the gate voltage $V_{GS}$ increases, because the threshold voltage $V_{TH\_0}$ of the transistor 0 is slightly larger than 0.

As discussed above with respect to FIGS. 1 to 4B, the transistor T0 acts as an anti-fuse bit, not a switch. Accordingly, in some embodiments of the present disclosure, if the transistor T0 is operated in an "inversion mode" when a positive gate voltage $V_{GS}$ is applied, the gate voltage $V_{GS}$ can easily reach the breakdown voltage $V_{BD}$ of the transistor T0 without passing the "accumulation mode" and the "depletion mode." However, if the transistor T0 is operated in an "accumulation mode" when a positive gate voltage $V_{GS}$ is applied, extra voltage is needed to change the transistor T0 from "accumulation mode" to "inversion mode." Accordingly, with this configuration, the power of the memory device can be reduced. Moreover, the memory device can be "programed" with lower voltage, which will also improve the reliability of the memory device.

FIG. 6C is a $V_{BD}$-$V_{TH}$ diagram of memory devices in accordance with some embodiments. The threshold voltage $V_{TH\_0}$ of the transistor T0 is lower than the threshold voltage $V_{TH\_1}$ of the transistor T1 (or the transistors T1_a and T1_b). Moreover, the breakdown voltage $V_{BD\_0}$ of the transistor 0 is lower than the breakdown voltage $V_{BD\_1}$ of the transistor 1 (or the transistors T1_a and T1_b).

In some embodiments, the threshold voltage $V_{TH\_0}$ of the transistor T0 is in a range from about 0V to 0.4V, and the threshold voltage $V_{TH\_1}$ of the transistor T1 (or the transistors T1_a and T1_b) is in a range from about 0.3V to 0.8V. In some embodiments, the breakdown voltage $V_{BD\_0}$ of the transistor T0 is in a range from about 2V to 4V, and the breakdown voltage $V_{BD\_1}$ of the transistor T1 (or the transistors T1_a and T1_b) is in a range from about 3.6V to 5.5V.

It is noted that, because the transistor T1 and the transistor T1 (or the transistors T1_a and T1_b) have different threshold voltages. The gate structure of the transistor T1 and the gate structure of the transistor T1 (or the transistors T1_a and T1_b) may include different work function values. For example, in some embodiments, the gate structure 170A of FIG. 5A and the gate structure 170B of FIG. 5A may include different work function values. In some embodiments, the gate structure 170A of FIG. 5A may include higher work function value than the gate structure 170B of FIG. 5A. Similarly, the gate structures 170A and 170C of FIG. 5B and the gate structure 170B of FIG. 5B may include different work function values. In some embodiments, the gate structure 170A and 170C of FIG. 5B may include higher work function value than the gate structure 170B of FIG. 5B. In some embodiments, the gate structures 170A and 170C of FIG. 5B may have substantially the same work function value.

FIGS. 7 to 25 illustrate a method for forming the structure discussed in FIG. 5B. It is noted that, the formation method of the structure discussed in FIG. 5A can be achieved by omitting the gate structures 170C and the word line WLR_b of FIG. 5B.

Figure 7:
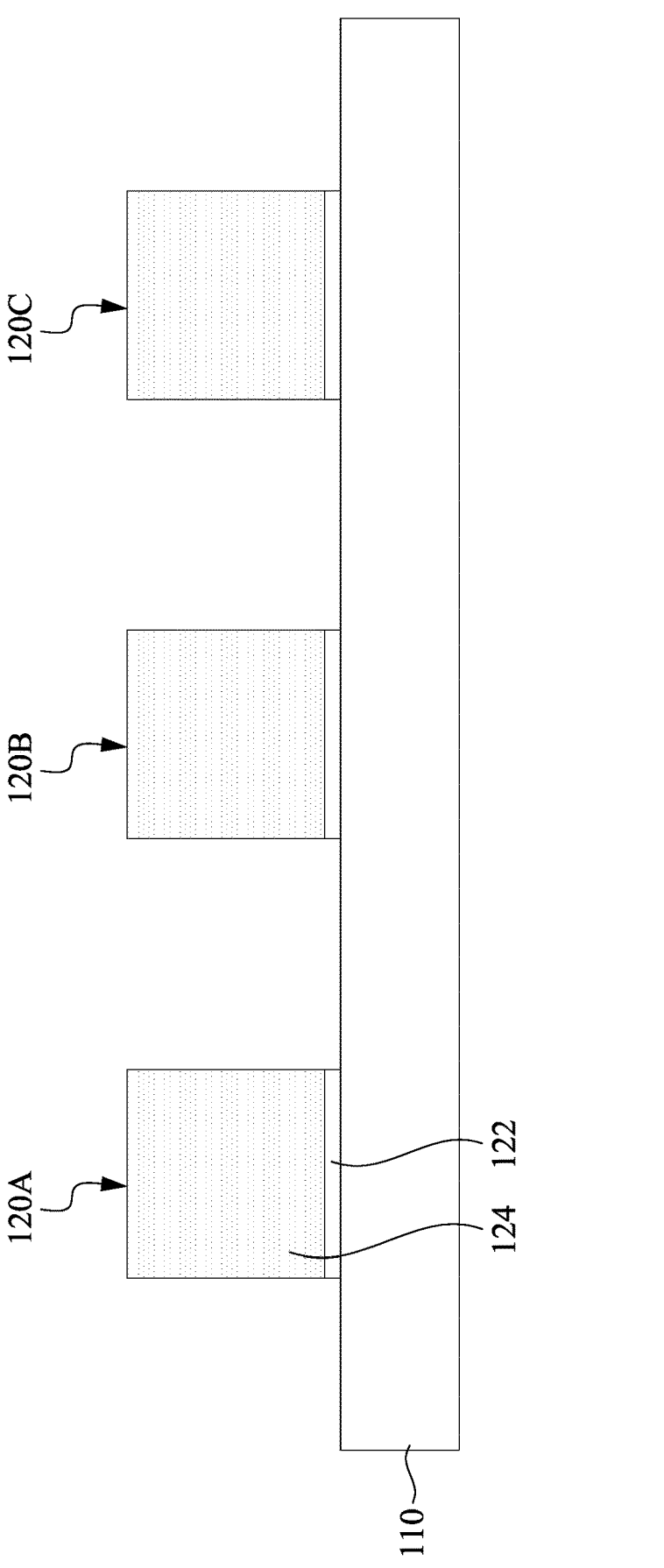
FIGS. 7 to 25 illustrate a method in various stages of fabricating the memory device in accordance with some embodiments of the present disclosure.

Reference is made to FIG. 7. A plurality of dummy gate structures 120A, 120B, and 120C are formed over a substrate 100. Each of the dummy gate structures 120A, 120B, and 120C includes a gate dielectric layer 122 and a dummy gate electrode 124. In some embodiments, the dummy gate structures 120A, 120B, and 120C may be formed by, for example, depositing a gate dielectric material and a dummy gate electrode material over the substrate 100, followed by a patterning process to pattern the gate dielectric material and the dummy gate electrode material to form the dummy gate structures 120A, 120B, and 120C.

The gate dielectric layer 122 may be, for example, silicon oxide, silicon nitride, a combination thereof, or the like, and may be deposited or thermally grown according to acceptable techniques. The gate dielectric layer 122 may be formed by suitable process, such as chemical vapor deposition (CVD), physical vapor deposition (PVD), atomic layer deposition (ALD), or any suitable process. The dummy gate electrode 124 may include polycrystalline-silicon (poly-Si) or poly-crystalline silicon-germanium (poly-SiGe). Further, the dummy gate electrode 124 may be doped poly-silicon with uniform or non-uniform doping. The dummy gate electrode 124 may be formed by suitable process, such as chemical vapor deposition (CVD), physical vapor deposition (PVD), atomic layer deposition (ALD), or any suitable process.

Figure 8:
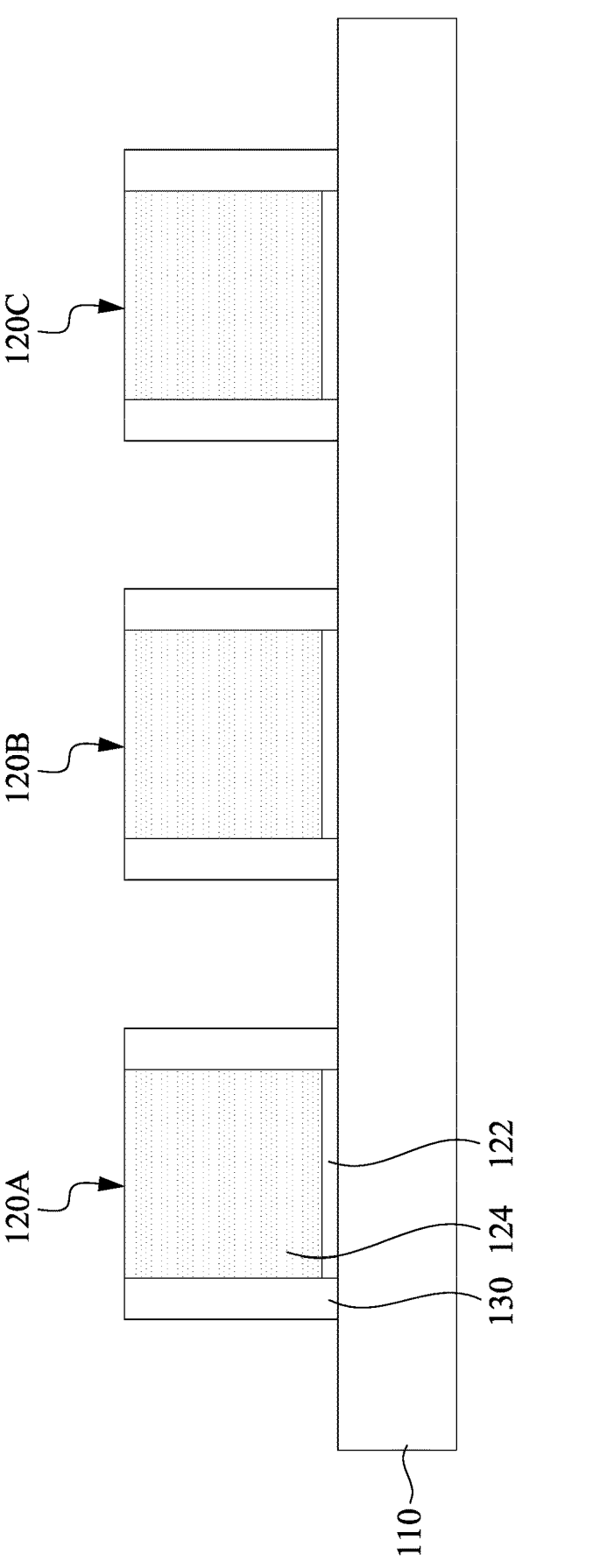

Reference is made to FIG. 8. A plurality of gate spacers 130 are formed on opposite sidewalls of the dummy gate structures 120A, 120B, and 120C. The gate spacers 130 may be formed by, for example, depositing a spacer layer blanket over the dummy gate structures 120A, 120B, and 120C, and them performing an etching process to remove horizontal portions of the spacer layer, such that vertical portions of the spacer layer remain on sidewalls of the dummy gate structures 120A, 120B, and 120C. The remaining vertical portions of the spacer layer are referred to as gate spacers 130.

Figure 9:
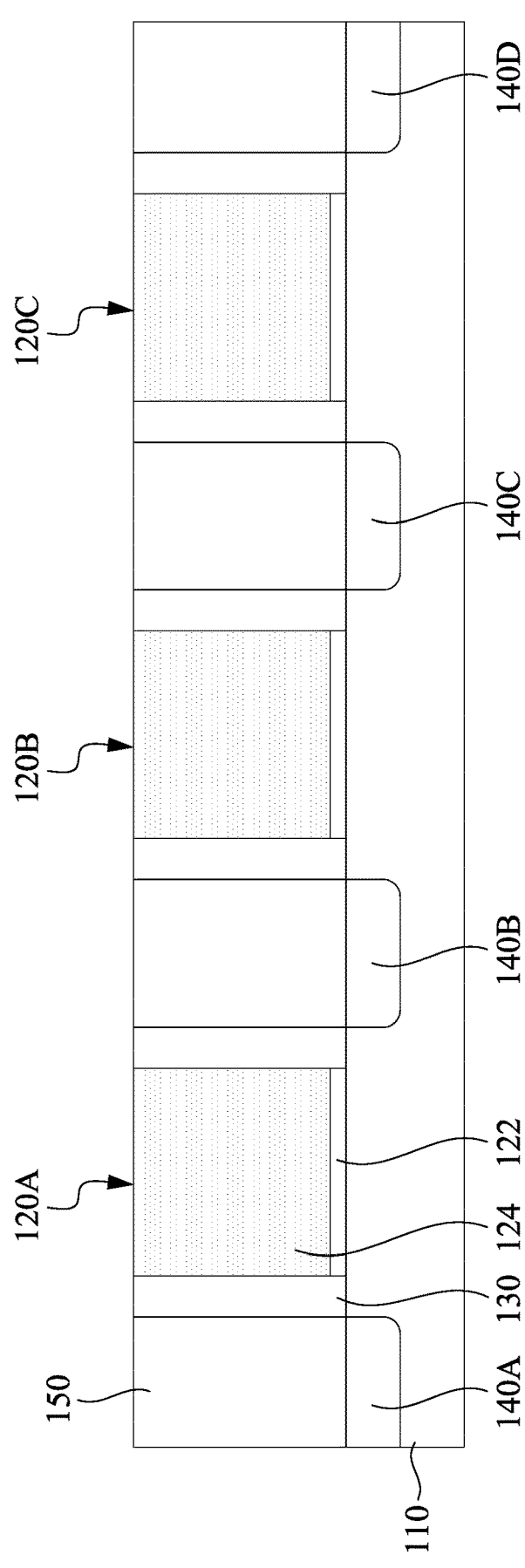

Reference is made to FIG. 9. Source/drain regions 140A, 140B, 140C, and 140D are formed in portions of the substrate 100 exposed by the dummy gate structures 120A, 120B, 120C and the gate spacers 130. In some embodiments where the source/drain regions 140A to 140D are doped semiconductor regions in the substrate 100, the source/drain regions 140A to 140D may be formed by an implantation process to drive an n-type dopant (e.g., phosphorous) or a p-type dopant (e.g., boron) in the exposed portion of the substrate 100. In some embodiments where the source/drain regions 140A to 140D are epitaxy structures, the source/drain regions 140A to 140D may be formed by, for example, etching the exposed portions of the substrate 100 to form recesses, and then depositing a crystalline semiconductor material in the recesses by a selective epitaxial growth (SEG) process that may fill the recesses in the substrate 100 and may extend further beyond the original surface of the substrate 100 to form raised source/drain epitaxy structures in some embodiments. The crystalline semiconductor material may be elemental (e.g., Si, or Ge, or the like), or an alloy (e.g., $Si_{1-x}$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like.

After the source/drain regions 140A, 140B, 140C, and 140D are formed, an interlayer dielectric (ILD) layer 150 is formed over the source/drain regions 140A to 140D. In some embodiments, the ILD layer 150 may be formed by, for example, depositing a dielectric material blanket over the substrate 100, and then performing a CMP process to remove excess dielectric material until the top surfaces of the dummy gate structures 120A, 120B, and 120C are exposed.

Figure 10:
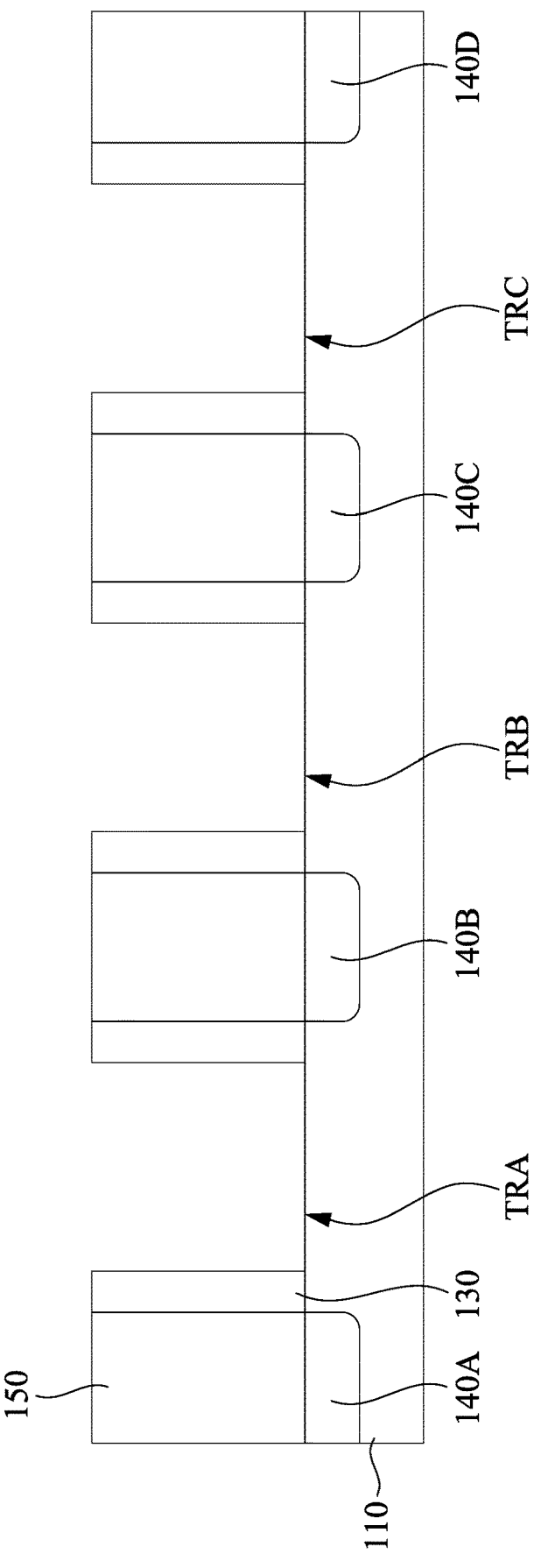

Reference is made to FIG. 10. The dummy gate structures 120A, 120B, and 120C are removed to form gate trenches TRA, TRB, and TRC, respectively. In some embodiments, the dummy gate structures 120A, 120B, and 120C may be removed by suitable etching process, such as wet etch, dry etch, or combinations thereof.

Figure 11:
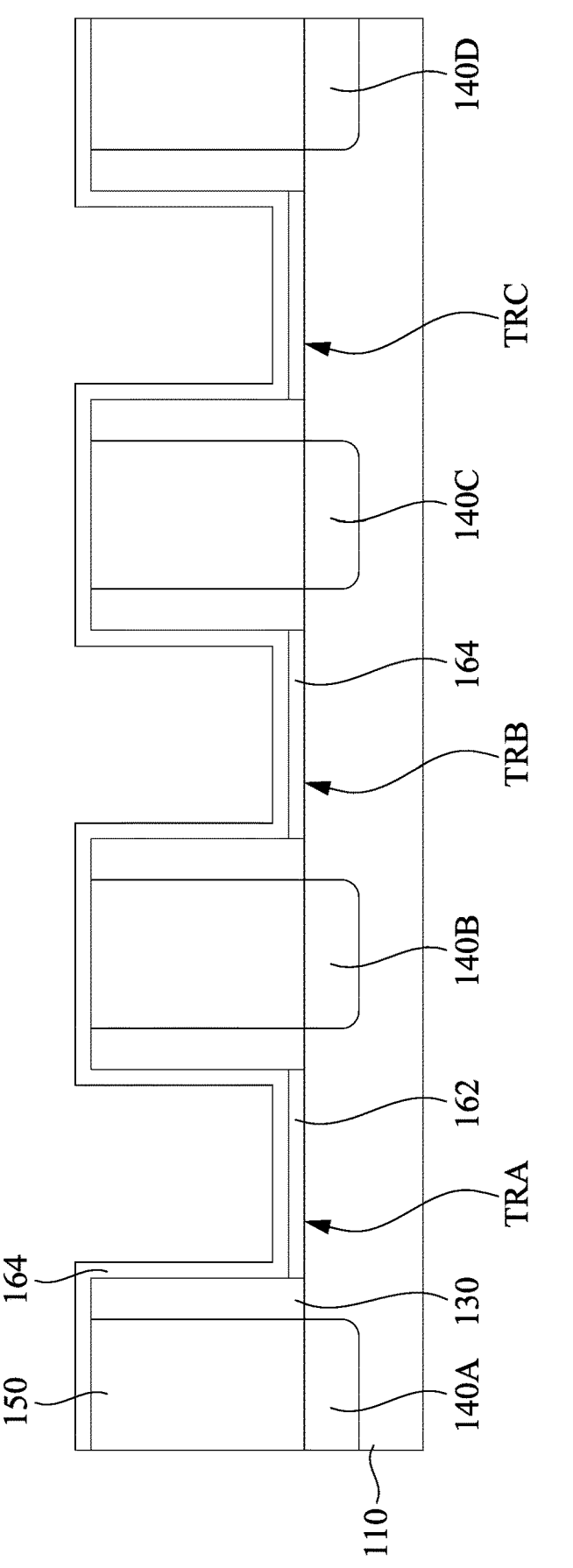

Reference is made to FIG. 11. Interfacial layers 162 are formed over the surfaces of the substrate 100 exposed by the gate trenches TRA, TRB, and TRC, and gate dielectric layers 164 are formed over the interfacial layers 162, respectively. The interfacial layers 162 may be made of silicon oxide or silicon oxynitride, and may be formed by a thermal process or by chemical oxide formation, in accordance with some embodiments. The gate dielectric layers 164 may be formed by atomic layer deposition (ALD), chemical vapor deposition (CVD), physical vapor deposition (PVD), plating, and/or other suitable methods.

Figure 12:
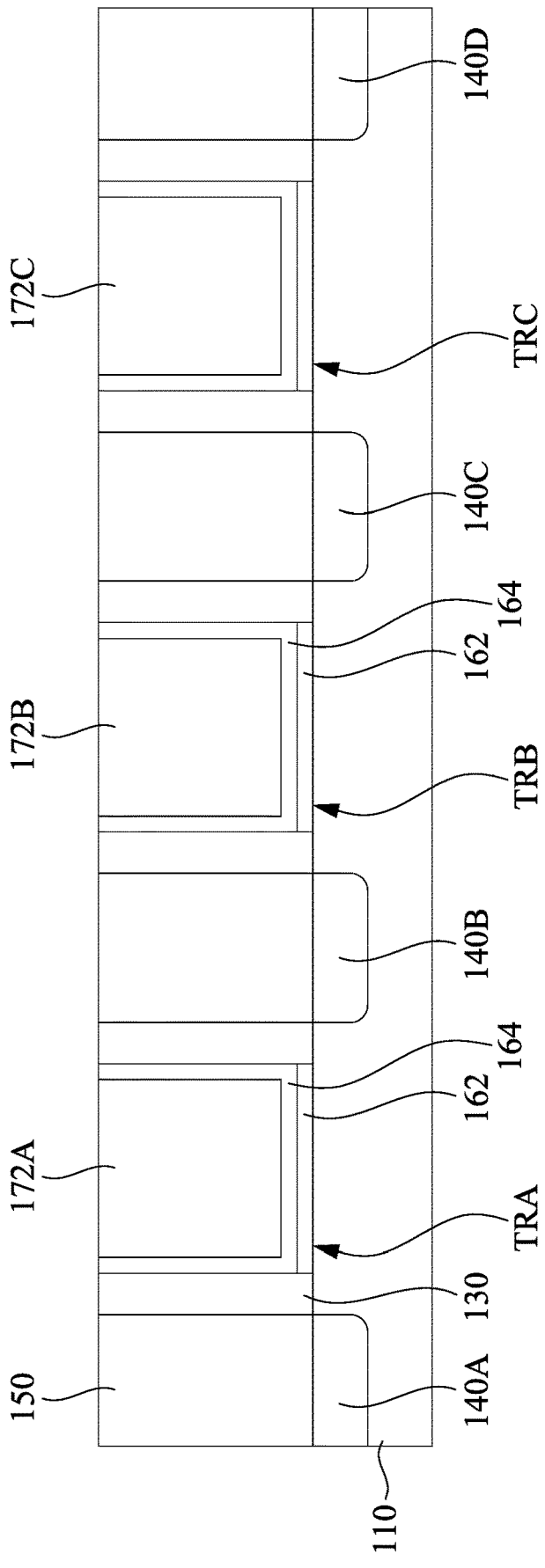

Reference is made to FIG. 12. First work function metal layers 172A, 172B, and 172C are formed in the gate trenches TRA, TRB, and TRC, respectively. In some embodiments, the first work function metal layers 172A, 172B, and 172C may be formed by, for example, depositing a work function metal material blanket over the substrate 100 and filling the gate trenches TRA, TRB, and TRC, and then performing a CMP process to remove excess work function metal material until the top surface of the ILD layer 150 is exposed. The remaining portions of the work function metal material in the gate trenches TRA, TRB, and TRC are referred to as first work function metal layers 172A, 172B, and 172C, respectively.

Figure 13:
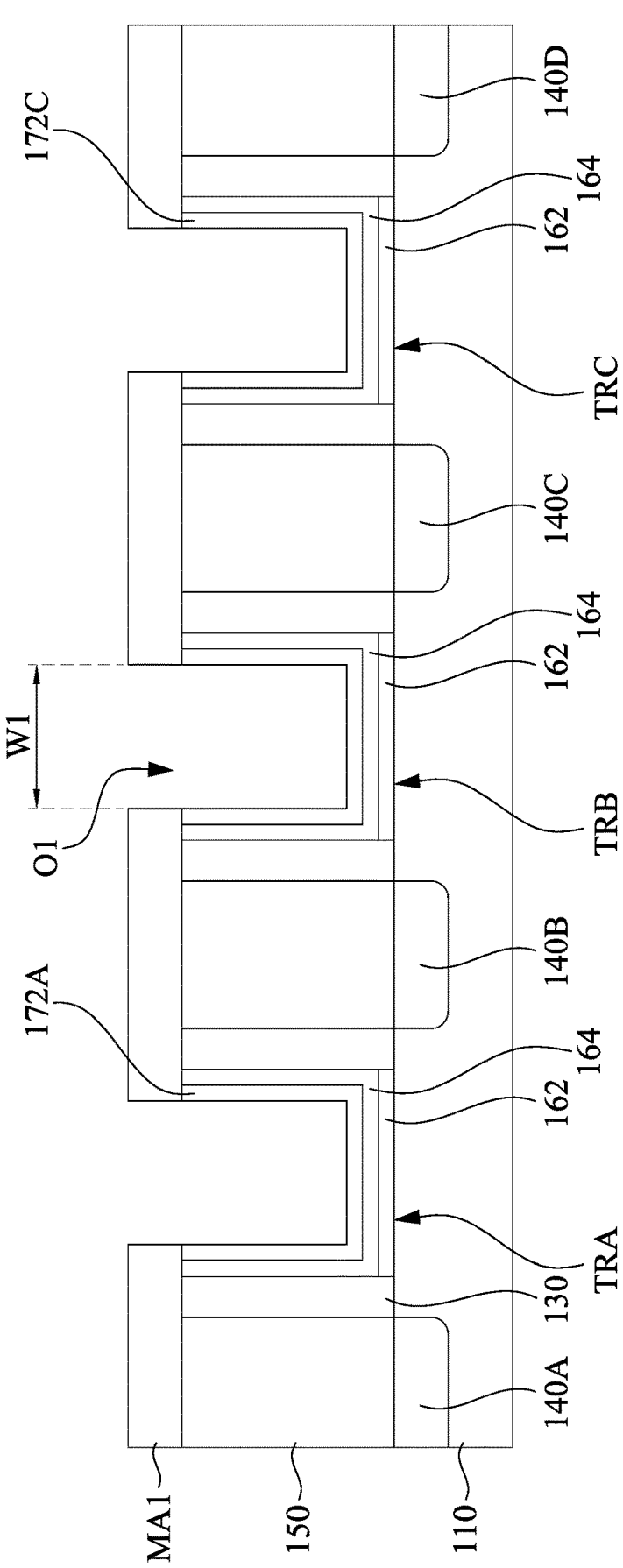

Reference is made to FIG. 13. A patterned mask MA1 is formed over the substrate 100. In some embodiments, the patterned mask MA1 has a plurality of openings O1, in which the openings O1 expose portions of the first work function metal layers 172A, 172B, and 172C, respectively. Next, the exposed portions of the first work function metal layers 172A, 172B, and 172C are etched. In some embodiments, the openings O1 have a width W1, in which the width W1 is narrower than the widest width of each of the first work function metal layers 172A, 172B, and 172C, such that the openings O1 expose the middle portions of each of the first work function metal layers 172A, 172B, and 172C, while the openings O1 cover the peripheral portions of each of the first work function metal layers 172A, 172B, and 172C on opposite sides of the middle portions of each of the first work function metal layers 172A, 172B, and 172C. In some embodiments, the etching process is controlled such that the etching process removes middle portions of the first work function metal layers 172A, 172B, and 172C through the openings O1, but not etches through the first work function metal layers 172A, 172B, and 172C, such that the remaining portions of the first work function metal layers 172A, 172B, and 172C still cover the gate dielectric layers 164. In some embodiments, the etching process substantially changes each of the first work function metal layers 172A, 172B, and 172C from a rectangular cross-section to a U-shape cross-section. In some embodiments, the patterned mask MA1 may be a hard mask, or may be a photoresist layer.

Figure 14:
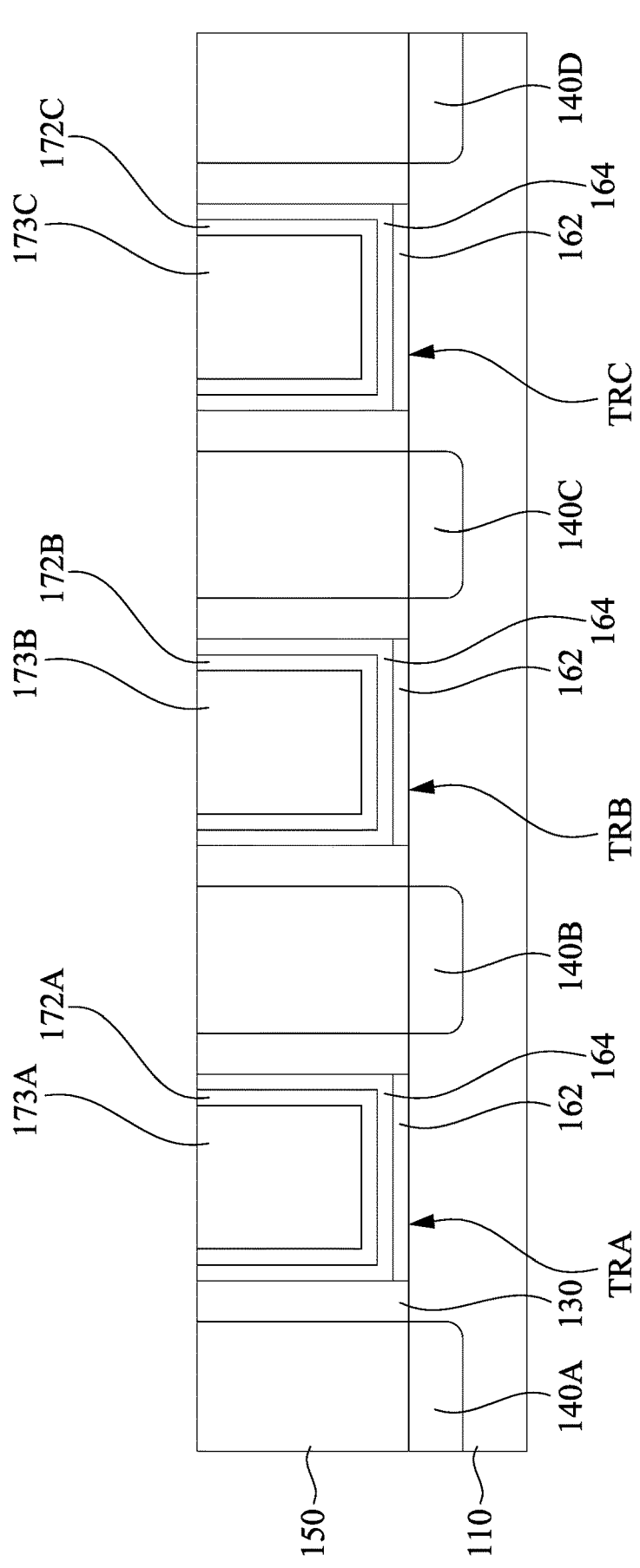

Reference is made to FIG. 14. The patterned mask MA1 is removed. Next, second work function metal layers 173A, 173B, and 173C are formed in the gate trenches TRA, TRB, and TRC, respectively. In some embodiments, the second work function metal layers 173A, 173B, and 173C may be formed by, for example, depositing a work function metal material blanket over the substrate 100 and filling the gate trenches TRA, TRB, and TRC, and then performing a CMP process to remove excess work function metal material until the top surface of the ILD layer 150 is exposed. The remaining portions of the work function metal material in the gate trenches TRA, TRB, and TRC are referred to as second work function metal layers 173A, 173B, and 173C, respectively.

Figure 15:
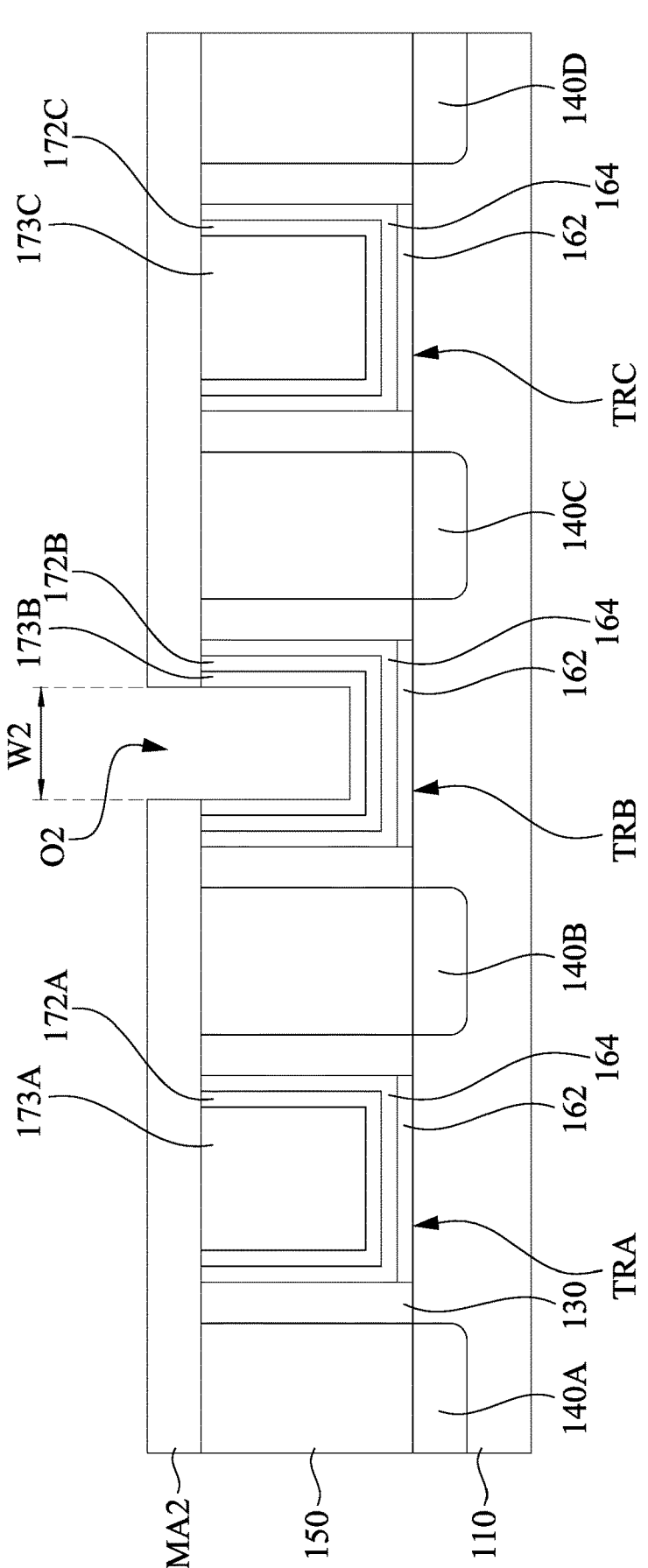

Reference is made to FIG. 15. A patterned mask MA2 is formed over the substrate 100. In some embodiments, the patterned mask MA2 has an opening O2, in which the opening O2 exposes a portion of the second work function metal layer 173B. In some embodiments, the patterned mask MA2 entirely covers the work function metal layers 172A and 173A in gate trench TRA, and entirely covers the work function metal layers 172C and 173C in gate trench TRC. That is, the work function metal layers 172A and 173A in gate trench TRA and the work function metal layers 172C and 173C in gate trench TRC are not exposed by the patterned mask MA2. Next, the exposed portion of the second work function metal layer 173B is etched. In some embodiments, the opening O2 has a width W2, in which the width W2 is narrower than the widest width of the second work function metal layer 173B, such that the opening O2 exposes the middle portion of the second work function metal layer 173B, while the opening O2 covers the peripheral portions of the second work function metal layer 173B on opposite sides of the middle portion of the second work function metal layer 173B. In some embodiments, the etching process is controlled such that the etching process removes the middle portion of the second work function metal layer 173B through the opening O2, but not etches through the second work function metal layer 173B, such that the remaining portion of the second work function metal layer 172B still cover the first work function metal layer 172B. In some embodiments, the etching process substantially changes the second work function metal layer 172B from a rectangular cross-section to a U-shape cross-section. In some embodiments, the width W2 of the opening O2 of the patterned mask MA2 is narrower than the width W1 of the openings O1 of the patterned mask MA1 discussed in FIG. 13. In some embodiments, the patterned mask MA2 may be a hard mask, or may be a photoresist layer.

Figure 16:
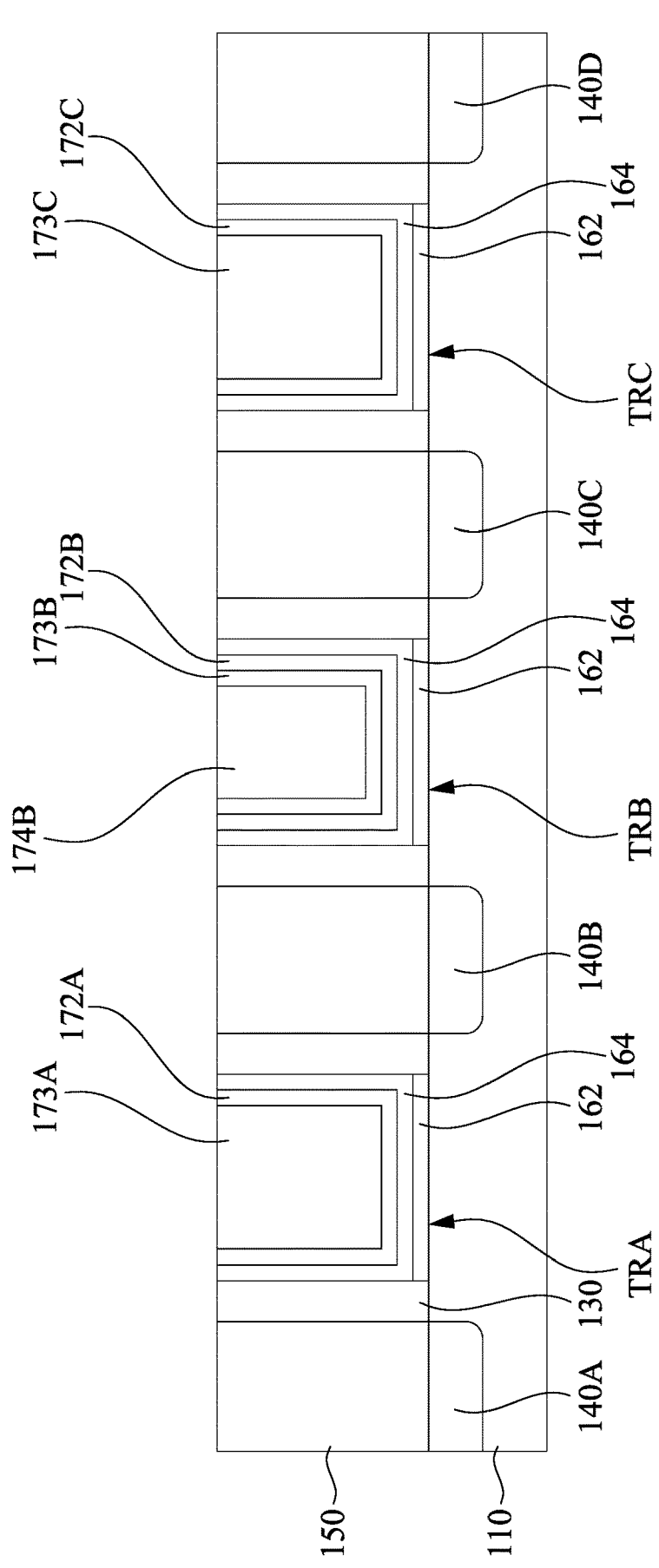

Reference is made to FIG. 16. The patterned mask MA2 is removed. Next, a third work function metal layer 174B is formed in the gate trench TRB and covering the second work function metal layer 173B. In some embodiments, the third work function metal layer 174B may be formed by, for example, depositing a work function metal material blanket over the substrate 100 and filling the gate trench TRB, and then performing a CMP process to remove excess work function metal material until the top surface of the ILD layer 150 is exposed. The remaining portion of the work function metal material in the gate trench TRB is referred to as third work function metal layer 174B. It is noted that, because the gate trenches TRA and TRC are completely filled with the work function metal layers 172A/173A and 172C/173C, respectively, the third work function metal layer 174B is not formed in the gate trenches TRA and TRC.

Figure 17:
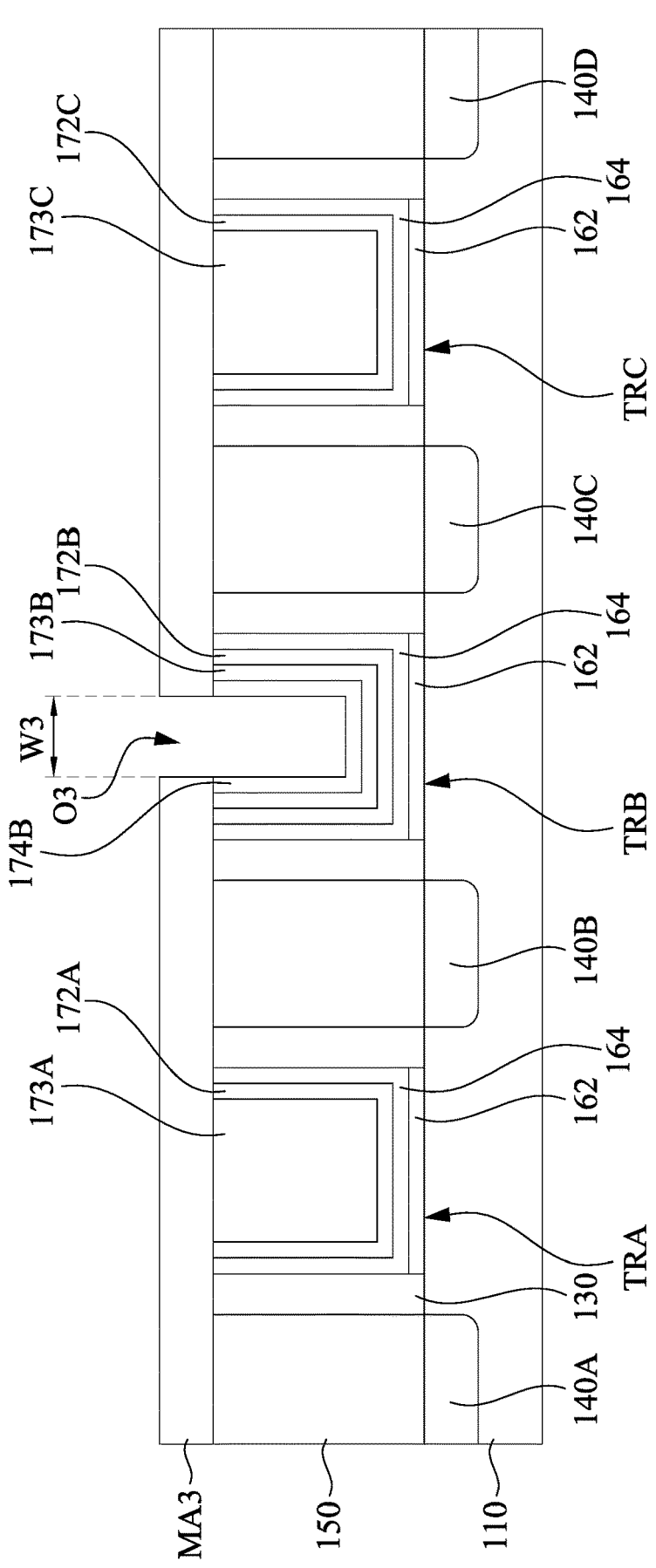

Reference is made to FIG. 17. A patterned mask MA3 is formed over the substrate 100. In some embodiments, the patterned mask MA3 has an opening O3, in which the opening O3 exposes a portion of the third work function metal layer 174B. In some embodiments, the patterned mask MA3 entirely covers the work function metal layers 172A and 173A in gate trench TRA, and entirely covers the work function metal layers 172C and 173C in gate trench TRC. That is, the work function metal layers 172A and 173A in gate trench TRA and the work function metal layers 172C and 173C in gate trench TRC are not exposed by the patterned mask MA3. Next, the exposed portion of the third work function metal layer 174B is etched. In some embodiments, the opening O4 has a width W4, in which the width W4 is narrower than the widest width of the third work function metal layer 174B, such that the opening O3 exposes the middle portion of the third work function metal layer 174B, while the opening O3 covers the peripheral portions of the third work function metal layer 174B on opposite sides of the middle portion of the third work function metal layer 174B. In some embodiments, the etching process is controlled such that the etching process removes the middle portion of the third work function metal layer 174B through the opening O3, but not etches through the third work function metal layer 174B, such that the remaining portion of the third work function metal layer 174B still cover the second work function metal layer 173B. In some embodiments, the etching process substantially changes the third work function metal layer 174B from a rectangular cross-section to a U-shape cross-section. In some embodiments, the width W3 of the opening O3 of the patterned mask MA3 is narrower than the width W2 of the opening O2 of the patterned mask MA2 discussed in FIG. 15. In some embodiments, the patterned mask MA3 may be a hard mask, or may be a photoresist layer.

Figure 18:
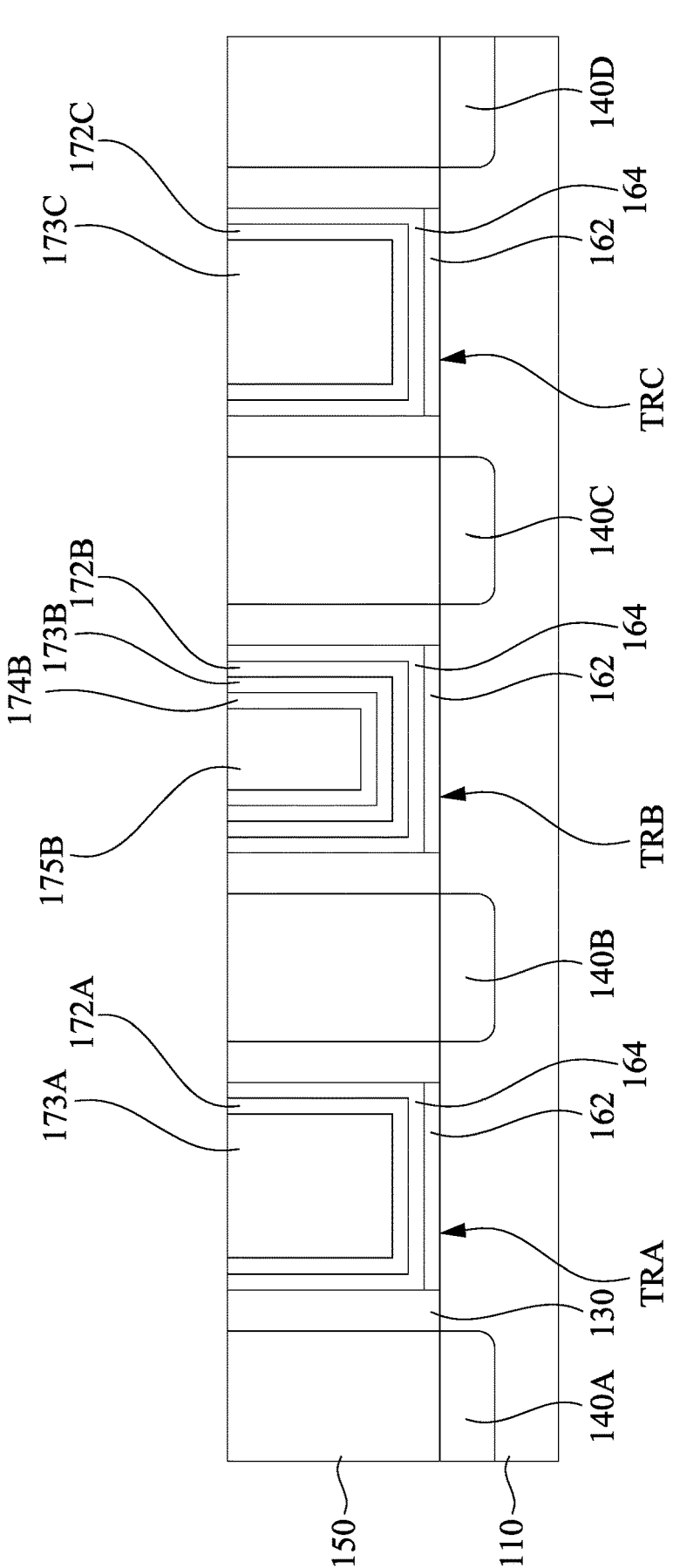

Reference is made to FIG. 18. The patterned mask MA3 is removed. Next, a fourth work function metal layer 175B is formed in the gate trench TRB and covering the third work function metal layer 174B. In some embodiments, the fourth work function metal layer 175B may be formed by, for example, depositing a work function metal material blanket over the substrate 100 and filling the gate trench TRB, and then performing a CMP process to remove excess work function metal material until the top surface of the ILD layer 150 is exposed. The remaining portion of the work function metal material in the gate trench TRB is referred to as fourth work function metal layer 175B. It is noted that, because the gate trenches TRA and TRC are completely filled with the work function metal layers 172A/173A and 172C/173C, respectively, the fourth work function metal layer 175B is not formed in the gate trenches TRA and TRC.

Figure 19:
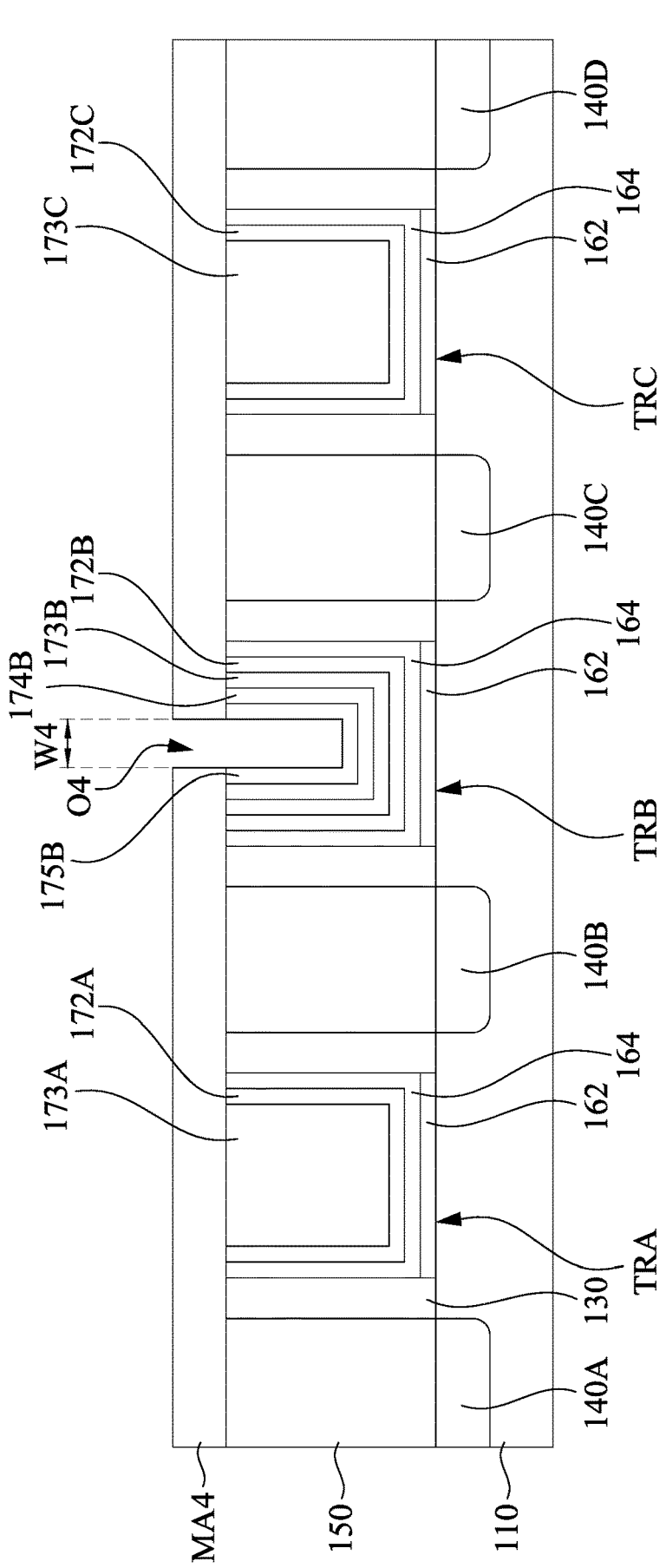

Reference is made to FIG. 19. A patterned mask MA4 is formed over the substrate 100. In some embodiments, the patterned mask MA4 has an opening O4, in which the opening O4 exposes a portion of the fourth work function metal layer 175B. In some embodiments, the patterned mask MA4 entirely covers the work function metal layers 172A and 173A in gate trench TRA, and entirely covers the work function metal layers 172C and 173C in gate trench TRC. That is, the work function metal layers 172A and 173A in gate trench TRA and the work function metal layers 172C and 173C in gate trench TRC are not exposed by the patterned mask MA4. Next, the exposed portion of the fourth work function metal layer 174B is etched. In some embodiments, the opening O4 has a width W4, in which the width W4 is narrower than the widest width of the fourth work function metal layer 175B, such that the opening O4 exposes the middle portion of the fourth work function metal layer 175B, while the opening O4 covers the peripheral portions of the fourth work function metal layer 175B on opposite sides of the middle portion of the fourth work function metal layer 175B. In some embodiments, the etching process is controlled such that the etching process removes the middle portion of the fourth work function metal layer 175B through the opening O4, but not etches through the fourth work function metal layer 175B, such that the remaining portion of the fourth work function metal layer 175B still cover the third work function metal layer 174B. In some embodiments, the etching process substantially changes the fourth work function metal layer 175B from a rectangular cross-section to a U-shape cross-section. In some embodiments, the width W4 of the opening O4 of the patterned mask MA4 is narrower than the width W3 of the opening O3 of the patterned mask MA3 discussed in FIG. 17. In some embodiments, the patterned mask MA4 may be a hard mask, or may be a photoresist layer.

Figure 20:
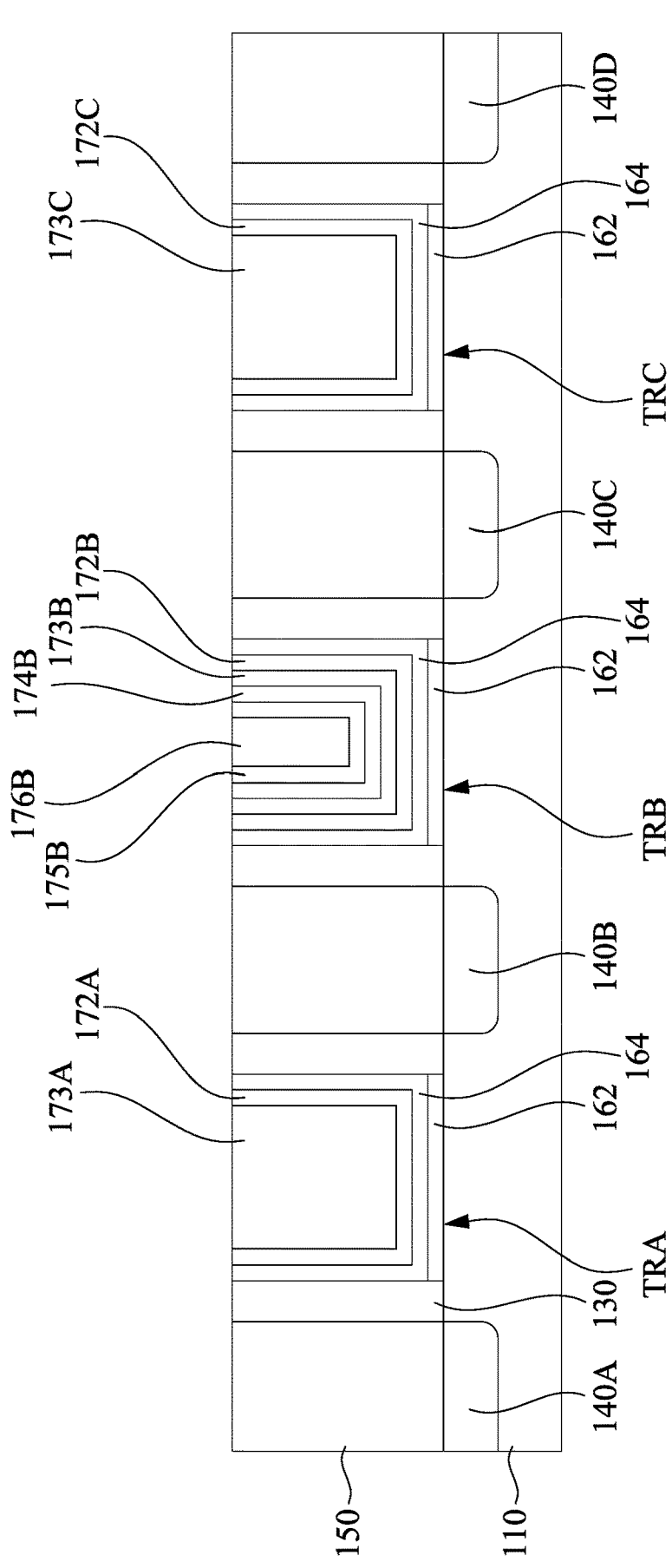

Reference is made to FIG. 20. The patterned mask MA4 is removed. Next, a fifth work function metal layer 176B is formed in the gate trench TRB and covering the fourth work function metal layer 175B. In some embodiments, the fifth work function metal layer 176B may be formed by, for example, depositing a work function metal material blanket over the substrate 100 and filling the gate trench TRB, and then performing a CMP process to remove excess work function metal material until the top surface of the ILD layer 150 is exposed. The remaining portion of the work function metal material in the gate trench TRB is referred to as fifth work function metal layer 176B. It is noted that, because the gate trenches TRA and TRC are completely filled with the work function metal layers 172A/173A and 172C/173C, respectively, the fifth work function metal layer 176B is not formed in the gate trenches TRA and TRC.

Figure 21:
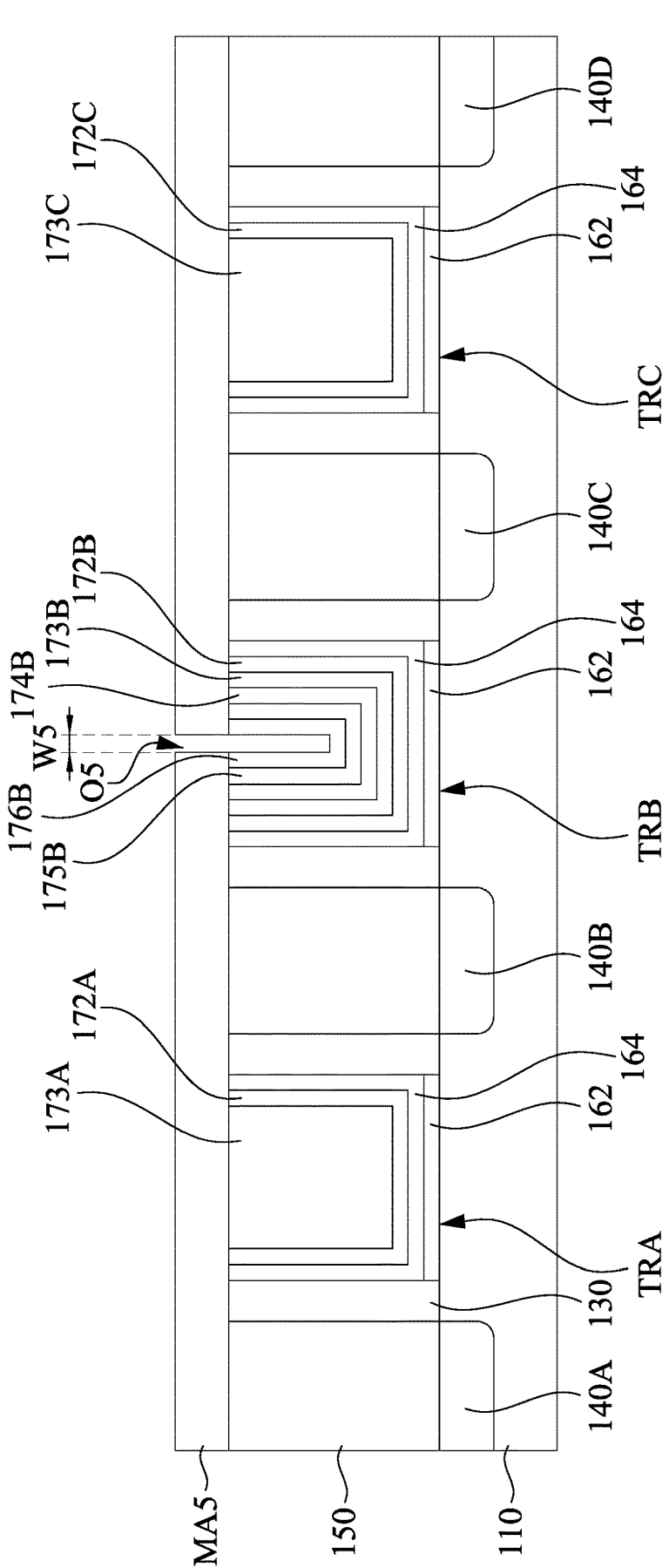

Reference is made to FIG. 21. A patterned mask MA5 is formed over the substrate 100. In some embodiments, the patterned mask MA5 has an opening O5, in which the opening O5 exposes a portion of the fifth work function metal layer 176B. In some embodiments, the patterned mask MA4 entirely covers the work function metal layers 172A and 173A in gate trench TRA, and entirely covers the work function metal layers 172C and 173C in gate trench TRC. That is, the work function metal layers 172A and 173A in gate trench TRA and the work function metal layers 172C and 173C in gate trench TRC are not exposed by the patterned mask MA5. Next, the exposed portion of the fifth work function metal layer 176B is etched. In some embodiments, the opening O5 has a width W5, in which the width W5 is narrower than the widest width of the fifth work function metal layer 176B, such that the opening O5 exposes the middle portion of the fifth work function metal layer 176B, while the opening O5 covers the peripheral portions of the fifth work function metal layer 176B on opposite sides of the middle portion of the fifth work function metal layer 176B. In some embodiments, the etching process is controlled such that the etching process removes the middle portion of the fifth work function metal layer 176B through the opening O5, but not etches through the fifth work function metal layer 176B, such that the remaining portion of the fifth work function metal layer 176B still cover the fourth work function metal layer 175B. In some embodiments, the etching process substantially changes the fifth work function metal layer 176B from a rectangular cross-section to a U-shape cross-section. In some embodiments, the width W5 of the opening O5 of the patterned mask MA5 is narrower than the width W4 of the opening O4 of the patterned mask MA4 discussed in FIG. 19. In some embodiments, the patterned mask MA5 may be a hard mask, or may be a photoresist layer.

Figure 22:
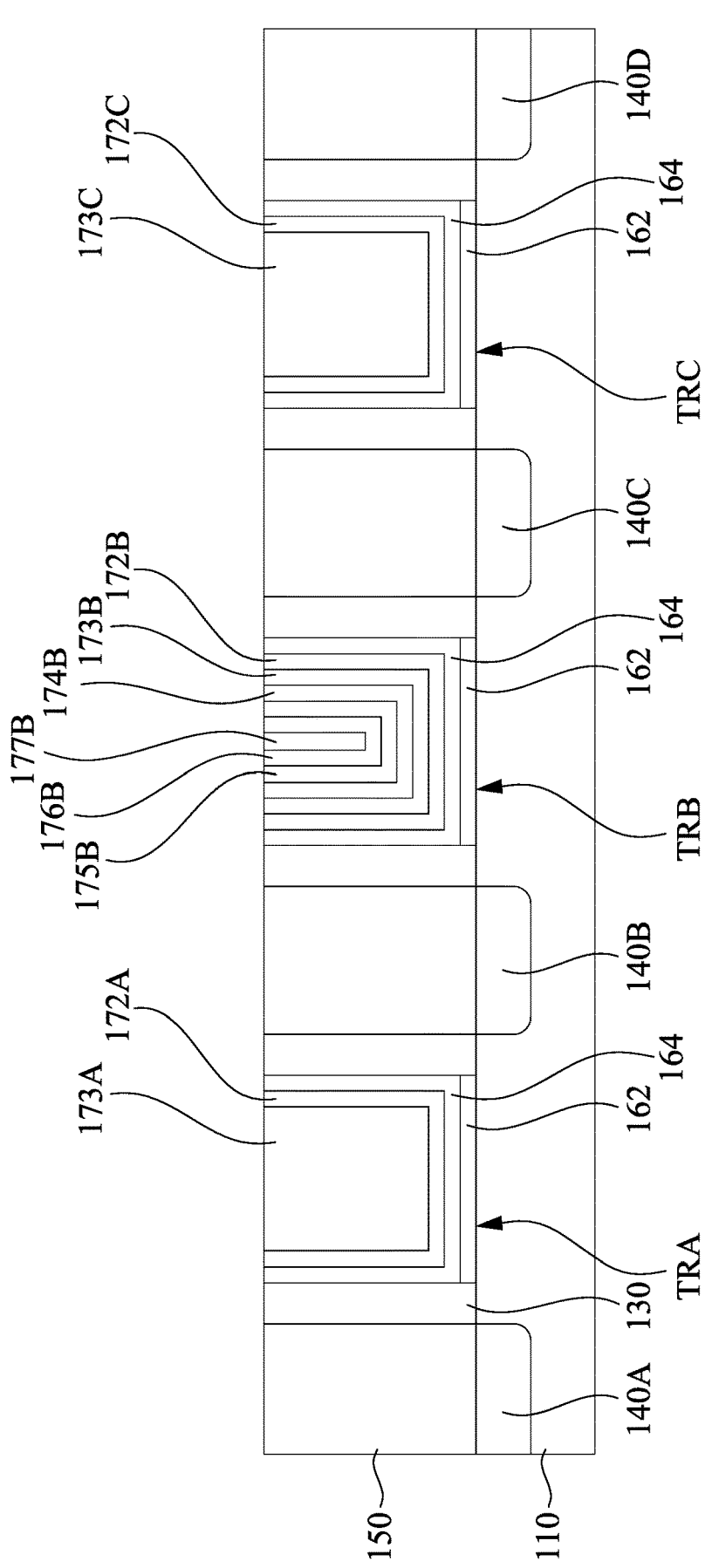

Reference is made to FIG. 22. The patterned mask MA5 is removed. Next, a sixth work function metal layer 177B is formed in the gate trench TRB and covering the sixth work function metal layer 177B. In some embodiments, the sixth work function metal layer 177B may be formed by, for example, depositing a work function metal material blanket over the substrate 100 and filling the gate trench TRB, and then performing a CMP process to remove excess work function metal material until the top surface of the ILD layer 150 is exposed. The remaining portion of the work function metal material in the gate trench TRB is referred to as sixth work function metal layer 177B. It is noted that, because the gate trenches TRA and TRC are completely filled with the work function metal layers 172A/173A and 172C/173C, respectively, the sixth work function metal layer 177B is not formed in the gate trenches TRA and TRC.

Figure 23:
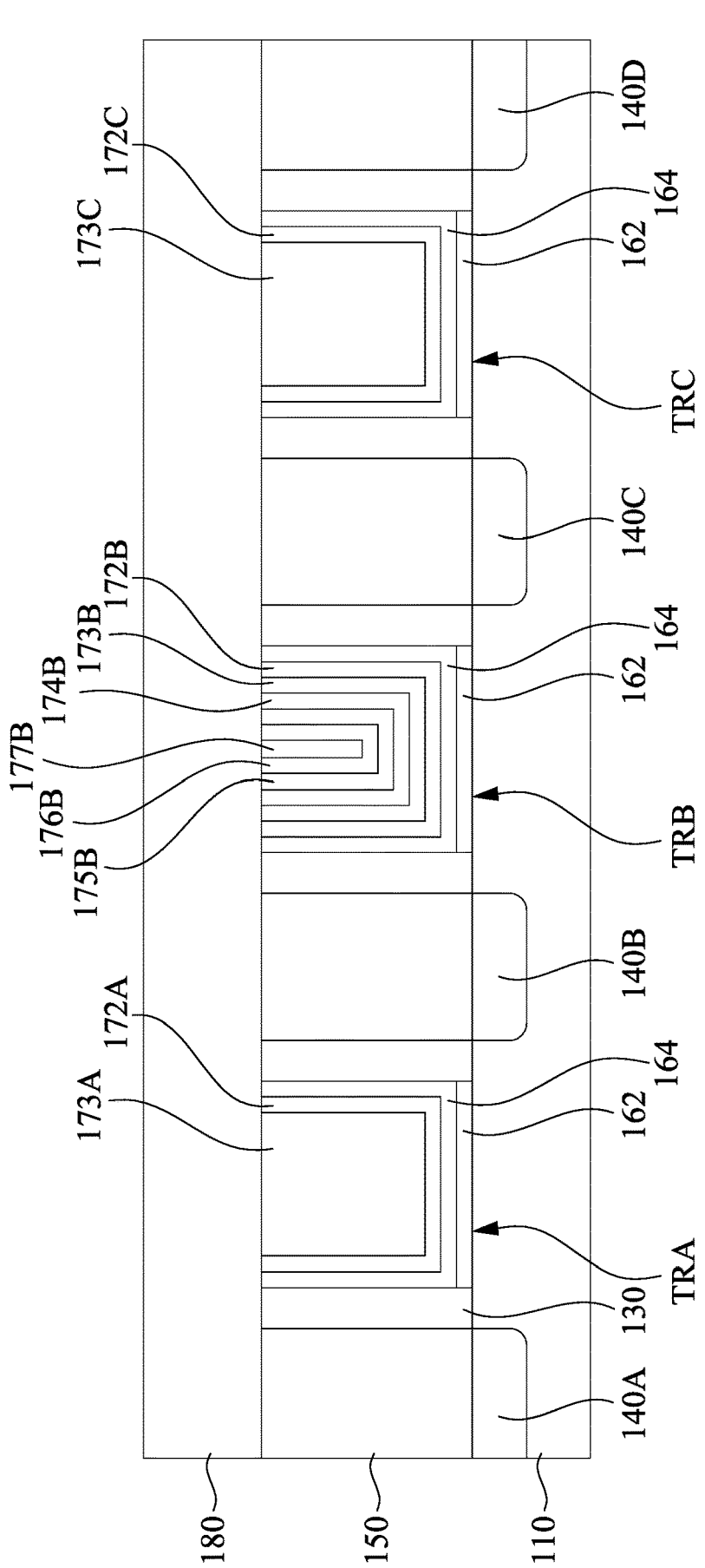

Reference is made to FIG. 23. An interlayer dielectric (ILD) layer 180 is formed over the ILD layer 150 and covering the gate structures 170A, 170B, and 170C. In some embodiments, the ILD layer 180 may be formed by, for example, depositing a dielectric material blanket over the substrate 100, and optionally performing a CMP process to planarize the top surface of the ILD layer 180.

Figure 24:
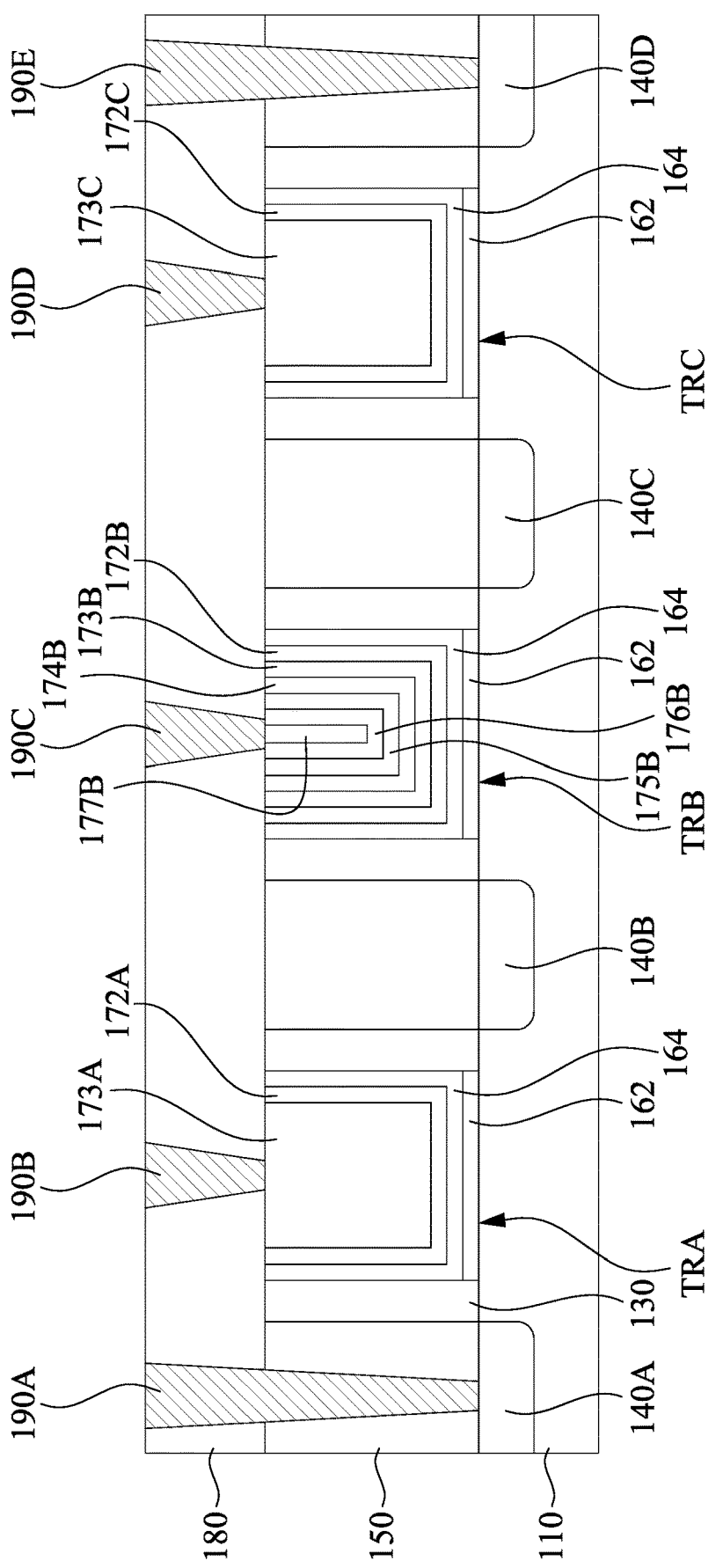

Reference is made to FIG. 24. Conductive vias 190A, 190B, 190C, 190D, and 190E are formed. In some embodiments, the conductive vias 190A and 190E are formed extending through the ILD layers 150 and 180 and contacting the source/drain regions 140A and 140D, respectively. On the other hand, the conductive vias 190B, 190C, and 190D are formed extending through the ILD layer 180 and contacting the metal gate structures 170A, 170B, and 170C, respectively. In some embodiments, the conductive vias 190A, 190B, 190C, 190D, and 190E may be formed by, for example, patterning the ILD layers 150 and 180 to form openings that expose the source/drain regions 140A, 140D and the metal gate structures 170A, 170B, 170C, filling a conductive material in the openings, and then performing a CMP process to remove excess conductive material until the top surface of the ILD layer 180 is exposed.

Figure 25:
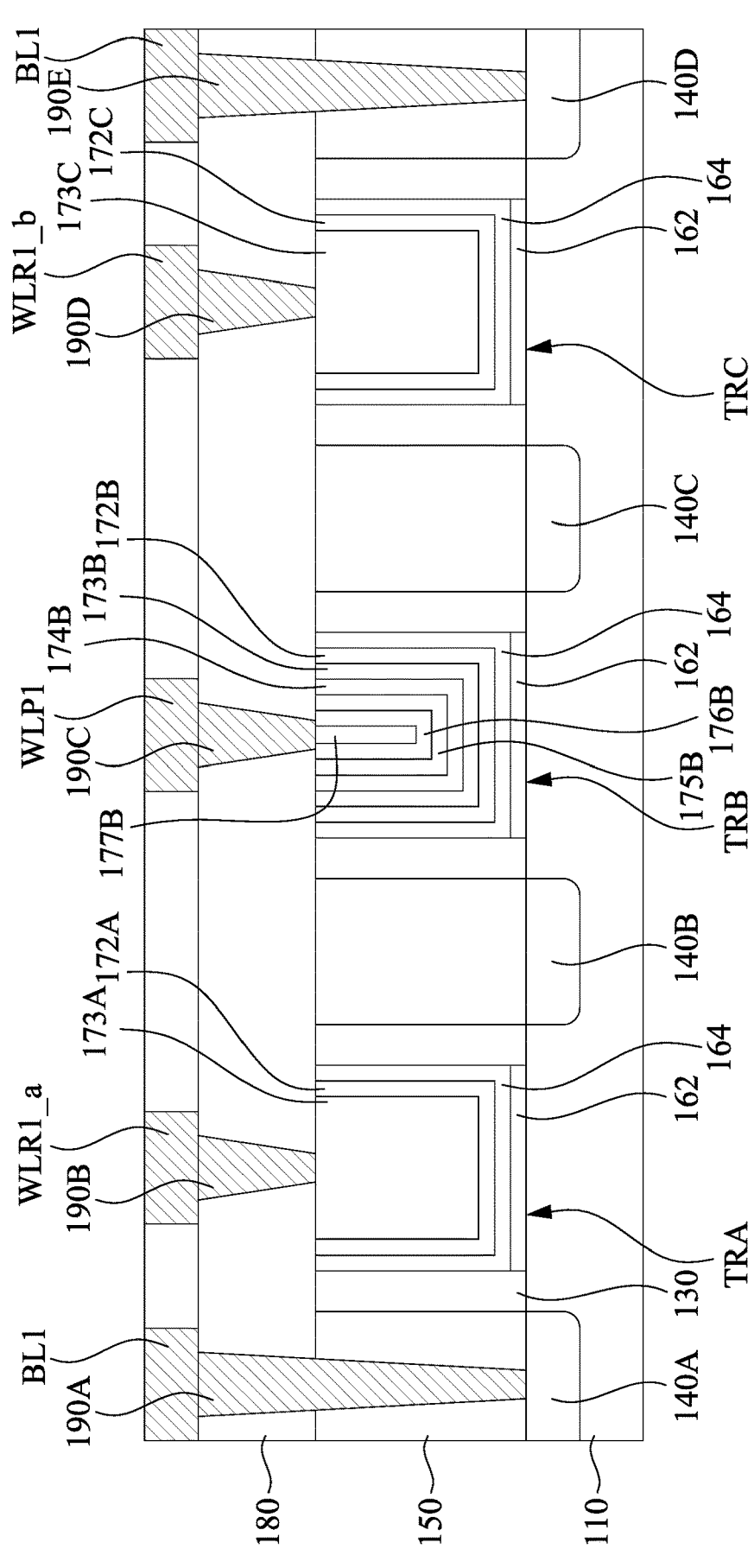
Figure 27:
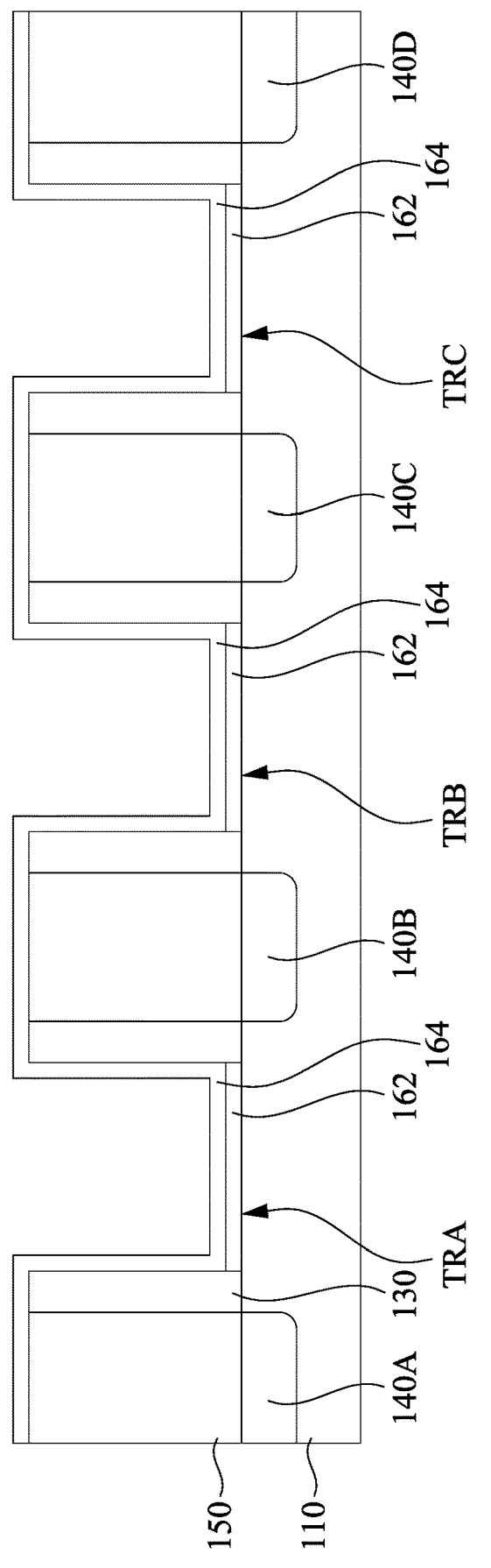
FIGS. 27 to 39 illustrate a method in various stages of fabricating the memory device in accordance with some embodiments of the present disclosure.
Figure 28:
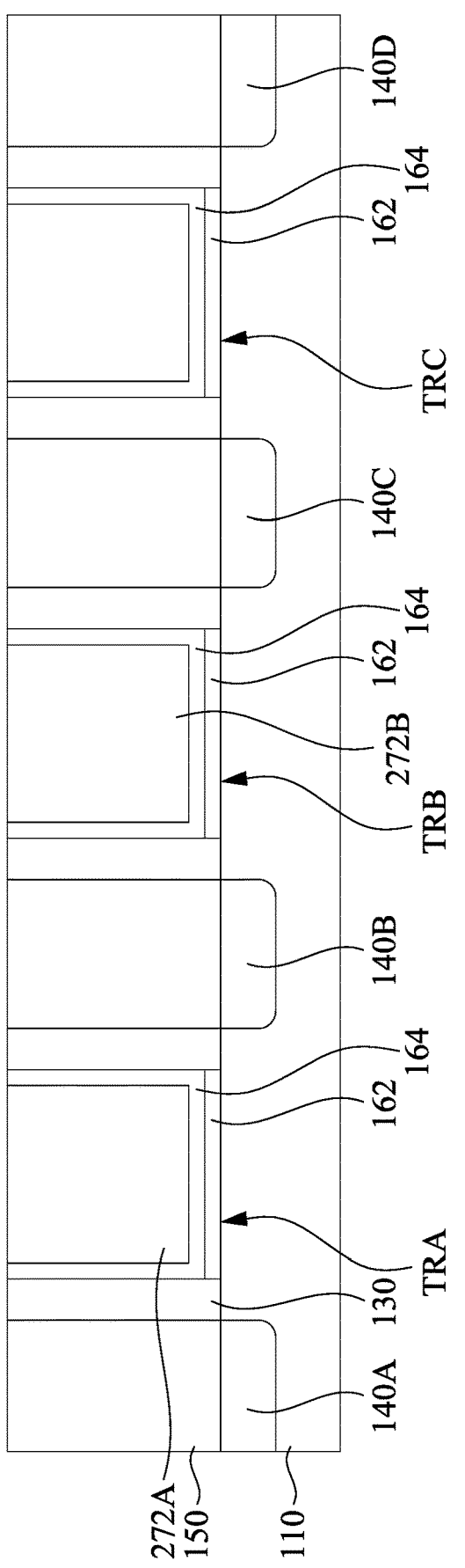

Reference is made to FIG. 25. An interlayer dielectric (ILD) layer 185 is formed over the ILD layer 180, and word lines WLR1_a, WLP1, WLR1_b and bit line BL1 are formed in the ILD layer 185. In some embodiments, the word lines WLR1_a, WLP1, WLR1_b are in contact with the conductive vias 190B, 190C, and 190D, respectively. The bit line is in contact with the conductive vias 190A and 190E. In some embodiments, the ILD layer 185 may be formed by, for example, depositing a dielectric material blanket over the substrate 100, and optionally performing a CMP process to planarize the top surface of the ILD layer 185. In some embodiments, the word lines WLR1_a, WLP1, WLR1_b and bit line BL1 may be formed by, for example, patterning the ILD layer 185 to form openings that expose the conductive vias 190A, 190B, 190C, 190D, and 190E, filling a conductive material in the openings, and then performing a CMP process to remove excess conductive material until the top surface of the ILD layer 185 is exposed.

FIG. 26 illustrates a method 1000 of forming a memory device in accordance with some embodiments of the present disclosure. Although the method 1000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, first, second, and third dummy gate structures are formed over a substrate. FIG. 7 illustrates a cross-sectional view of some embodiments corresponding to act in block S101.

At block S102, gate spacers are formed on opposite sidewalls of the first, second, and third dummy gate structures. FIG. 8 illustrates a cross-sectional view of some embodiments corresponding to act in block S102.

At block S103, source/drain regions are formed in portions of the substrate exposed by the first, second, and third dummy gate structures and the gate spacers, and a first ILD layer is formed over the source/drain regions. FIG. 9 illustrates a cross-sectional view of some embodiments corresponding to act in block S103.

At block S104, first, second, and third dummy gate structures are removed to form first, second, and third gate trenches. FIG. 10 illustrates a cross-sectional view of some embodiments corresponding to act in block S104.

At block S105, interfacial layers are formed over the surfaces of the substrate exposed by the first, second, and third gate trenches, and gate dielectric layers are formed over the interfacial layers. FIG. 11 illustrates a cross-sectional view of some embodiments corresponding to act in block S105.

At block S106, first work function metal layers are formed in the first, second, and third gate trenches. FIG. 12 illustrates a cross-sectional view of some embodiments corresponding to act in block S106.

At block S107, a first patterned mask is formed over the substrate, and the first work function metal layers exposed by the first patterned mask are etched. FIG. 13 illustrates a cross-sectional view of some embodiments corresponding to act in block S107.

At block S108, second work function metal layers are formed in the first, second, and third gate trenches. FIG. 14 illustrates a cross-sectional view of some embodiments corresponding to act in block S108.

At block S109, a second patterned mask is formed over the substrate, and the second work function metal layer in the second gate trench exposed by the second patterned mask is etched. FIG. 15 illustrates a cross-sectional view of some embodiments corresponding to act in block S108.

At block S110, a third work function metal layer is formed in the second gate trench. FIG. 16 illustrates a cross-sectional view of some embodiments corresponding to act in block S110.

At block S111, a third patterned mask is formed over the substrate, and the third work function metal layer in the second gate trench exposed by the third patterned mask is etched. FIG. 17 illustrates a cross-sectional view of some embodiments corresponding to act in block S111.

At block S112, a fourth work function metal layer is formed in the second gate trench. FIG. 18 illustrates a cross-sectional view of some embodiments corresponding to act in block S112.

At block S113, a fourth patterned mask is formed over the substrate, and the fourth work function metal layer in the second gate trench exposed by the fourth patterned mask is etched. FIG. 19 illustrates a cross-sectional view of some embodiments corresponding to act in block S113.

At block S114, a fifth work function metal layer is formed in the second gate trench. FIG. 20 illustrates a cross-sectional view of some embodiments corresponding to act in block S114.

At block S115, a fifth patterned mask is formed over the substrate, and the fifth work function metal layer in the second gate trench exposed by the fifth patterned mask is etched. FIG. 21 illustrates a cross-sectional view of some embodiments corresponding to act in block S115.

At block S116, a sixth work function metal layer is formed in the second gate trench. FIG. 22 illustrates a cross-sectional view of some embodiments corresponding to act in block S116.

At block S117, second ILD layer is formed over the first ILD layer. FIG. 23 illustrates a cross-sectional view of some embodiments corresponding to act in block S117.

At block S118, conductive vias are formed in the first and second ILD layers. FIG. 24 illustrates a cross-sectional view of some embodiments corresponding to act in block S118.

At block S119, a third ILD layer is formed over the second ILD layer, and a bit line and word lines are formed in the third ILD layer. FIG. 25 illustrates a cross-sectional view of some embodiments corresponding to act in block S119.

FIGS. 27 to 39 illustrate a method in various stages of fabricating the memory device in accordance with some embodiments of the present disclosure. It is noted that some elements of FIGS. 27 to 39 are similar to those described in FIGS. 7 to 25, and thus relevant details will not be repeated for simplicity.

Figure 29:
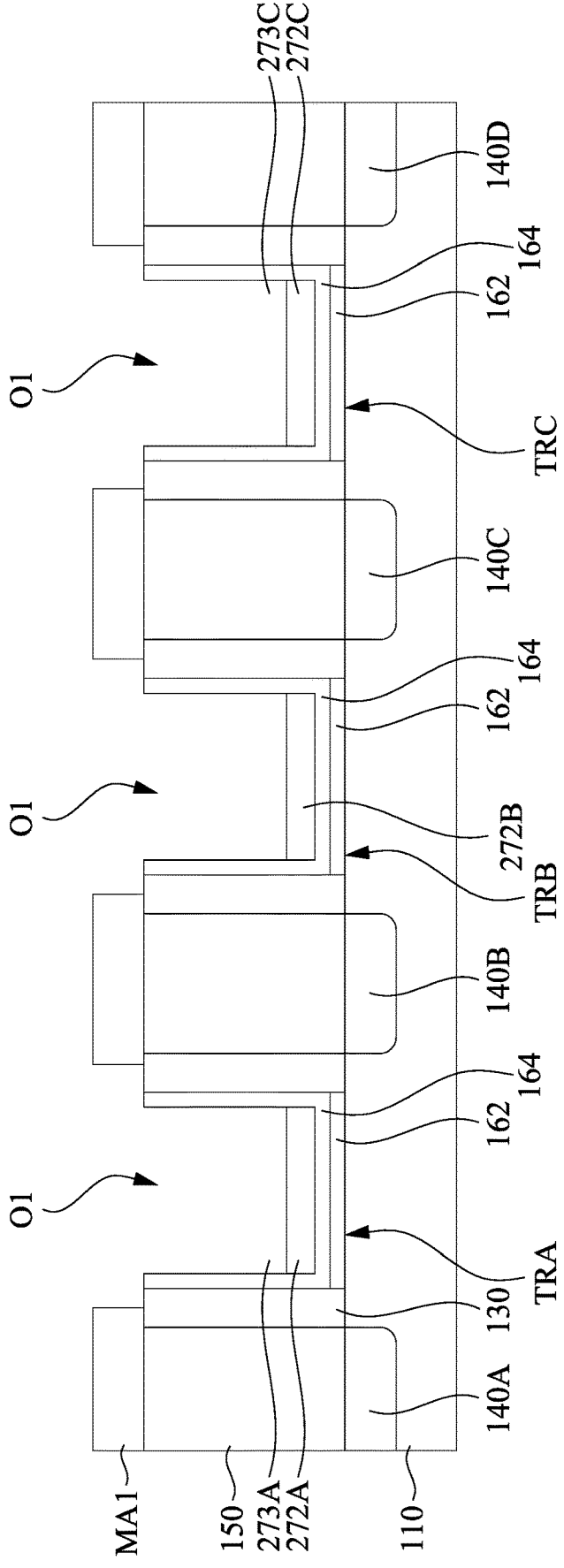

Reference is made to FIG. 29, in which FIG. 29 follows the structure of FIG. 12 discussed above. A patterned mask MA1 is formed over the substrate 100. In some embodiments, the patterned mask MA1 has a plurality of openings O1, in which the openings O1 expose portions of the first work function metal layers 272A, 272B, and 272C, respectively. Next, the exposed portions of the first work function metal layers 272A, 272B, and 272C are selectively etched back by using an etchant that etches the first work function metal at a faster etch rate than etching other materials. In some embodiments, the openings O1 are wider than the widest width of each of the first work function metal layers 272A, 272B, and 272C, such that the topmost surfaces of the first work function metal layers 272A, 272B, and 272C are lowered to a level below the topmost ends of the gate dielectric layers 164 (or the top surfaces of the gate spacers 130). In some embodiments, the etched first work function metal layers 272A, 272B, and 272C have substantially the same thickness. In some embodiments, after the first work function metal layers 272A, 272B, and 272C are etched back, sidewalls of the gate dielectric layers 164 are exposed. In some embodiments, the patterned mask MA1 may cover the ILD layer 150 and the gate spacers 130, while exposes entireties of the gate trenches TRA, TRB, and TRC. In some other embodiments, the patterned mask MA1 may be omitted, and the first work function metal layers 272A, 272B, and 272C may be etched back by using the ILD layer 150 and the gate spacers 130 as etch masks.

Figure 30:
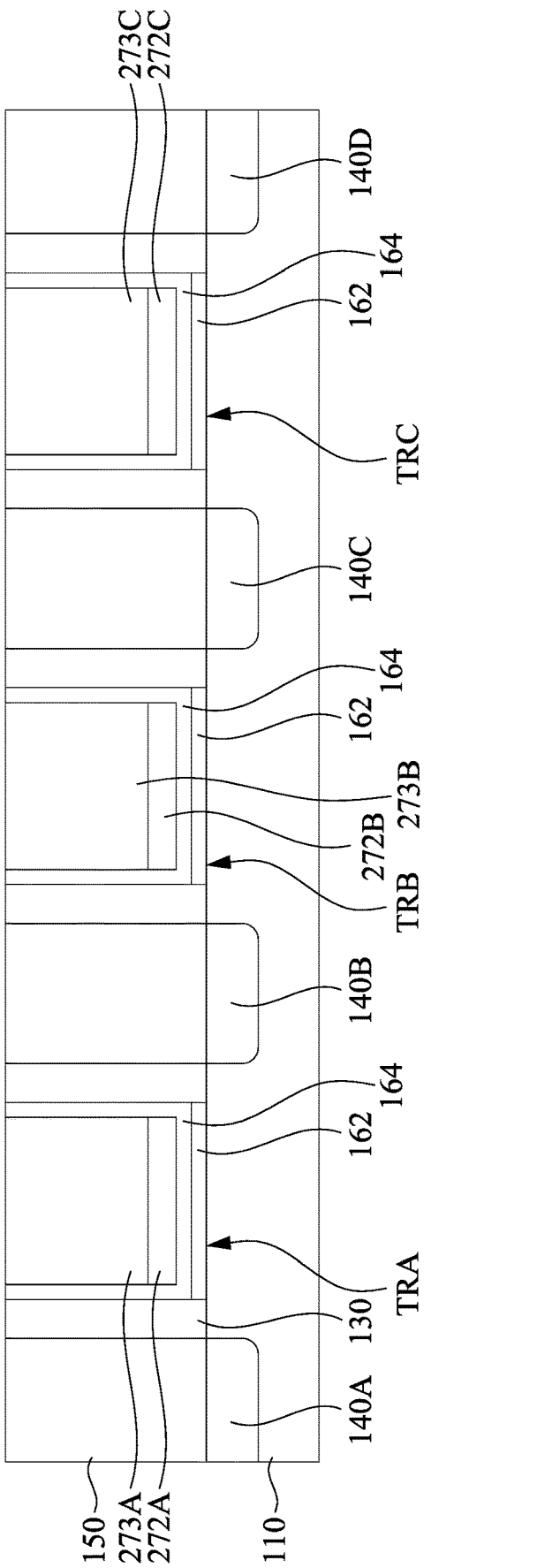

Reference is made to FIG. 30. The patterned mask MA1 is removed. Next, second work function metal layers 273A, 273B, and 273C are formed in the gate trenches TRA, TRB, and TRC, respectively. In some embodiments, the second work function metal layers 273A, 273B, and 273C are in contact with the gate dielectric layers 164, respectively.

Figure 31:
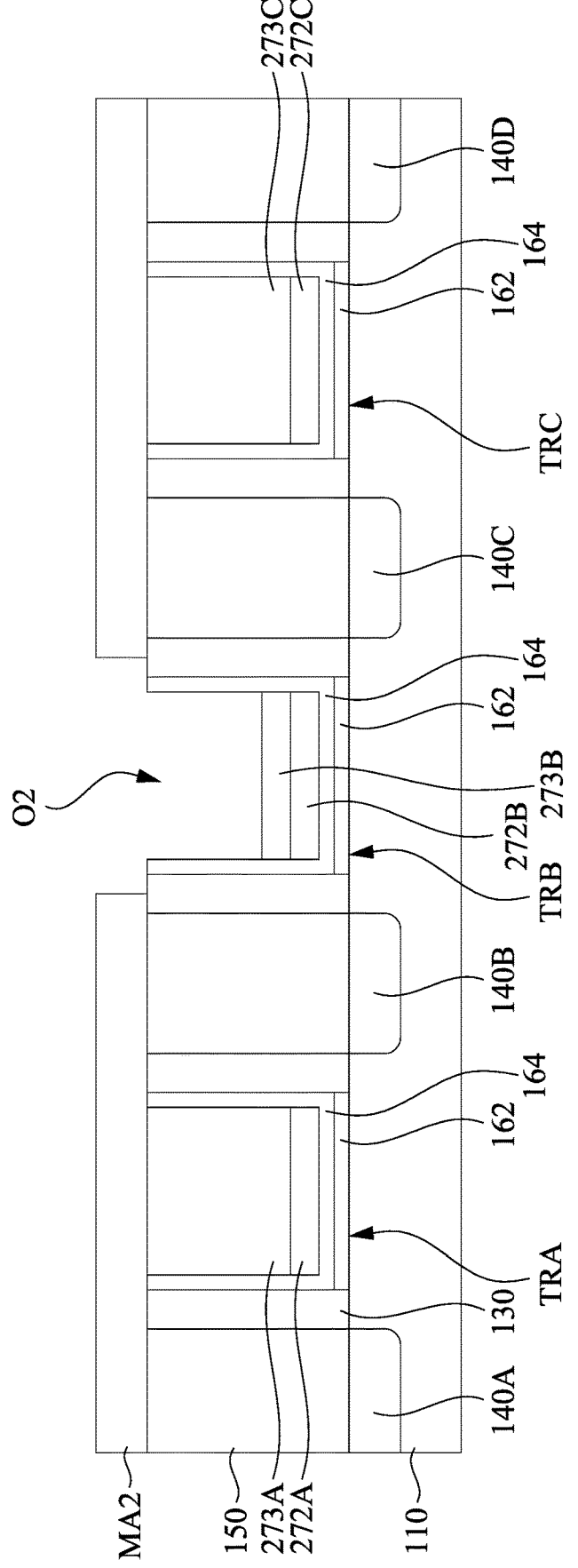

Reference is made to FIG. 31. A patterned mask MA2 is formed over the substrate 100. In some embodiments, the patterned mask MA2 has an opening O2, in which the opening O2 exposes the second work function metal layer 273B. Next, second work function metal layer 273B is selectively etched back by using an etchant that etches the second work function metal at a faster etch rate than etching other materials. In some embodiments, the opening O2 is wider than the widest width of second work function metal layer 273B, such that the topmost surface of the second work function metal layer 273B is lowered to a level below the topmost ends of the gate dielectric layers 164 (or the top surfaces of the gate spacers 130). Accordingly, the second work function metal layer 273B in the gate trench TRB is thinner than the second work function metal layers 273A and 273C in the gate trenches TRA and TRC. In some embodiments, after the second work function metal layer 273B is etched back, sidewalls of the gate dielectric layers 164 are exposed. In some embodiments, the patterned mask MA2 may cover the ILD layer 150 and the gate spacers 130, while exposes an entirety of the gate trench TRB.

Figure 32:
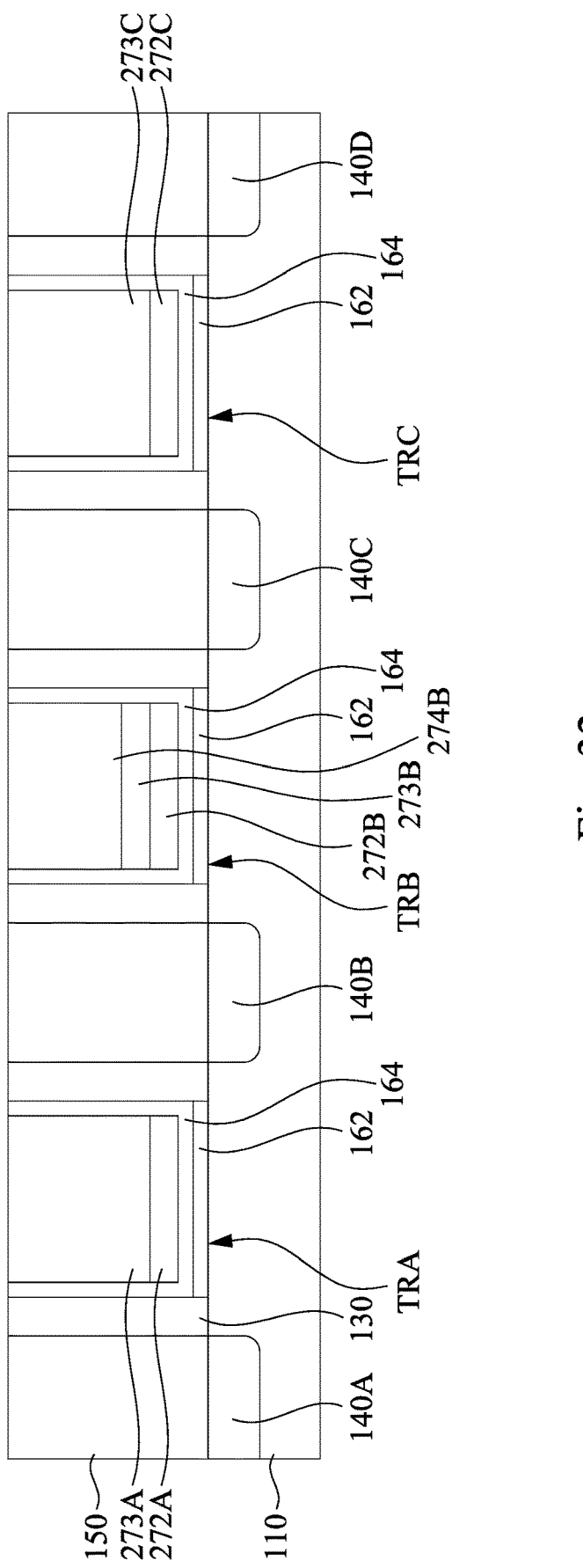

Reference is made to FIG. 32. The patterned mask MA2 is removed. Next, a third work function metal layer 274B is formed in the gate trench TRB. In some embodiments, the third work function metal layer 274B is in contact with the gate dielectric layer 164.

Figure 33:
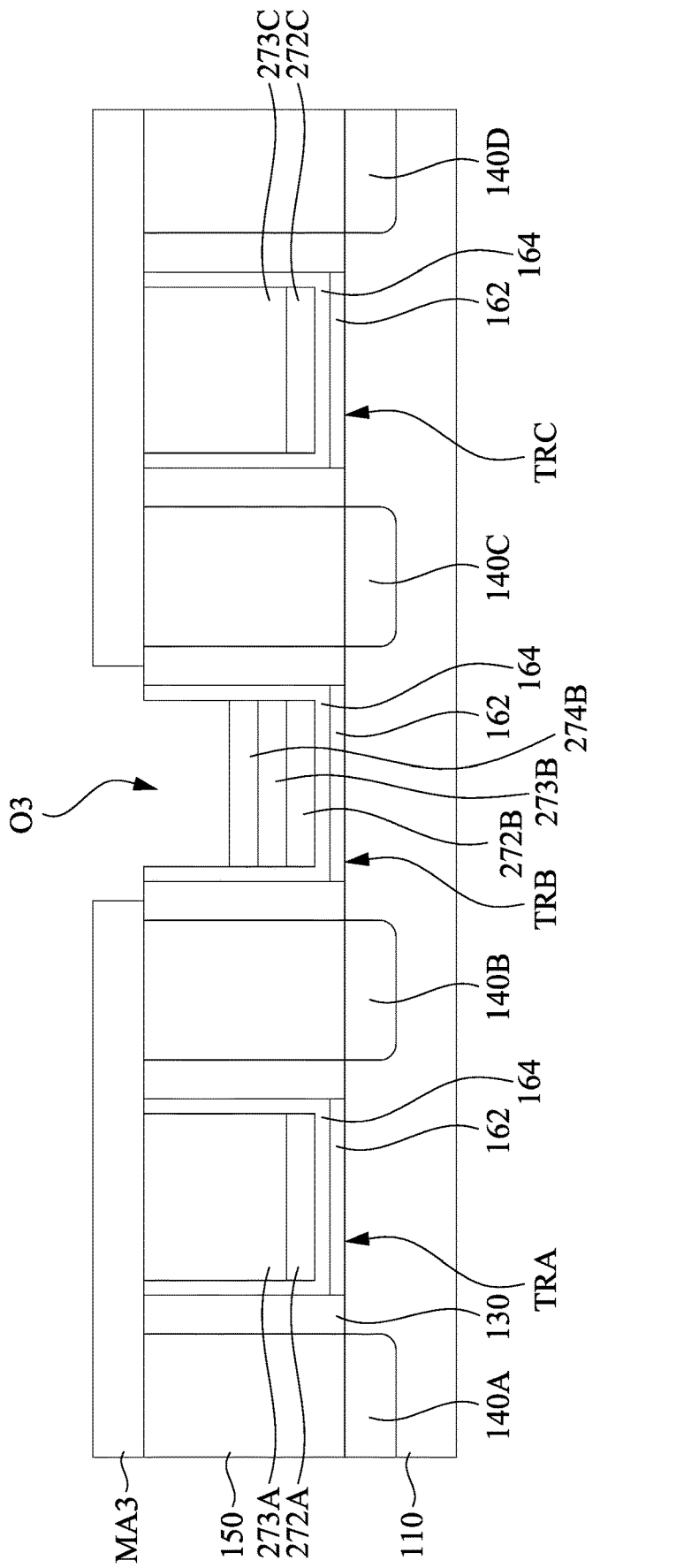

Reference is made to FIG. 33. A patterned mask MA3 is formed over the substrate 100. In some embodiments, the patterned mask MA3 has an opening O3, in which the opening O3 exposes the third work function metal layer 274B. Next, third work function metal layer 274B is selectively etched back by using an etchant that etches the third work function metal at a faster etch rate than etching other materials. In some embodiments, the process of FIG. 33 is similar to the process of FIG. 31, and thus relevant details will not be repeated for simplicity.

Figure 34:
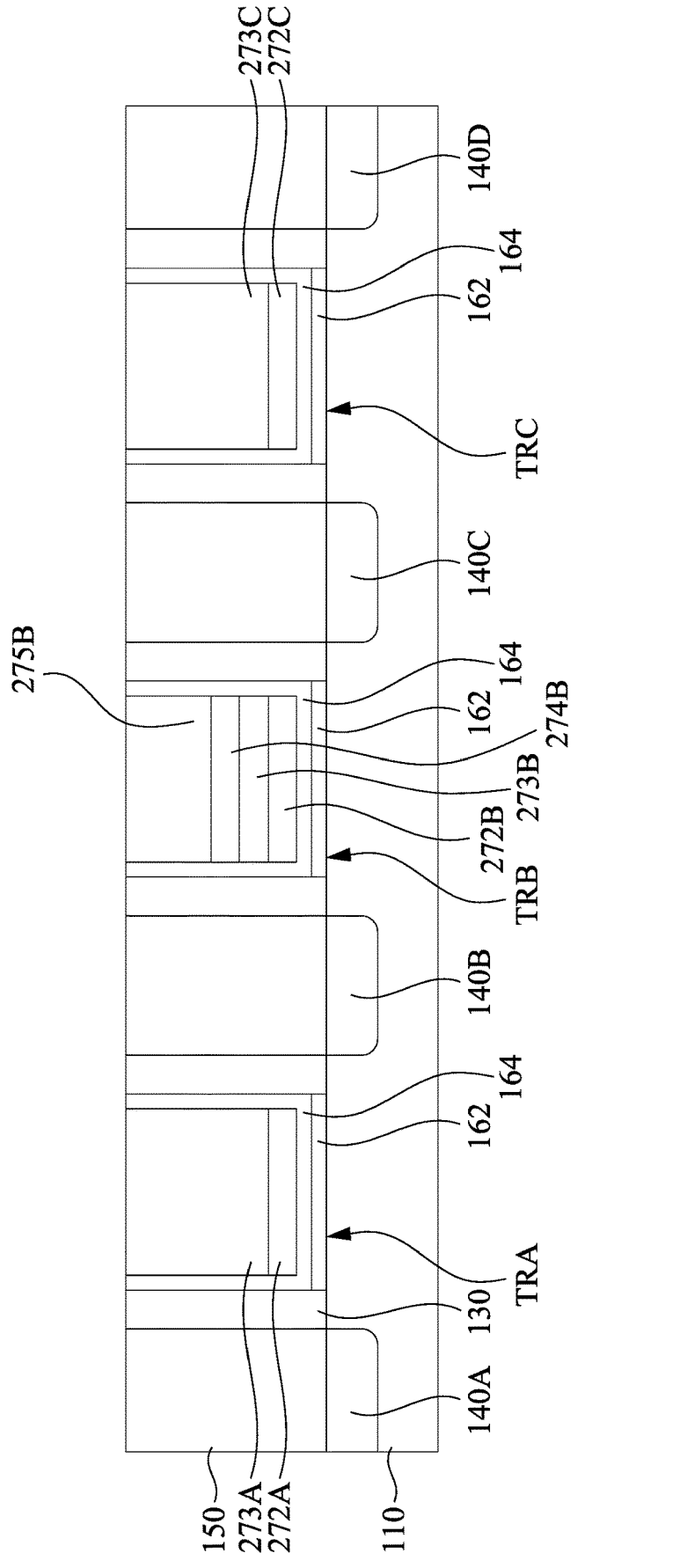

Reference is made to FIG. 34. The patterned mask MA3 is removed. Next, a fourth work function metal layer 275B is formed in the gate trench TRB. In some embodiments, the fourth work function metal layer 275B is in contact with the gate dielectric layer 164.

Figure 35:
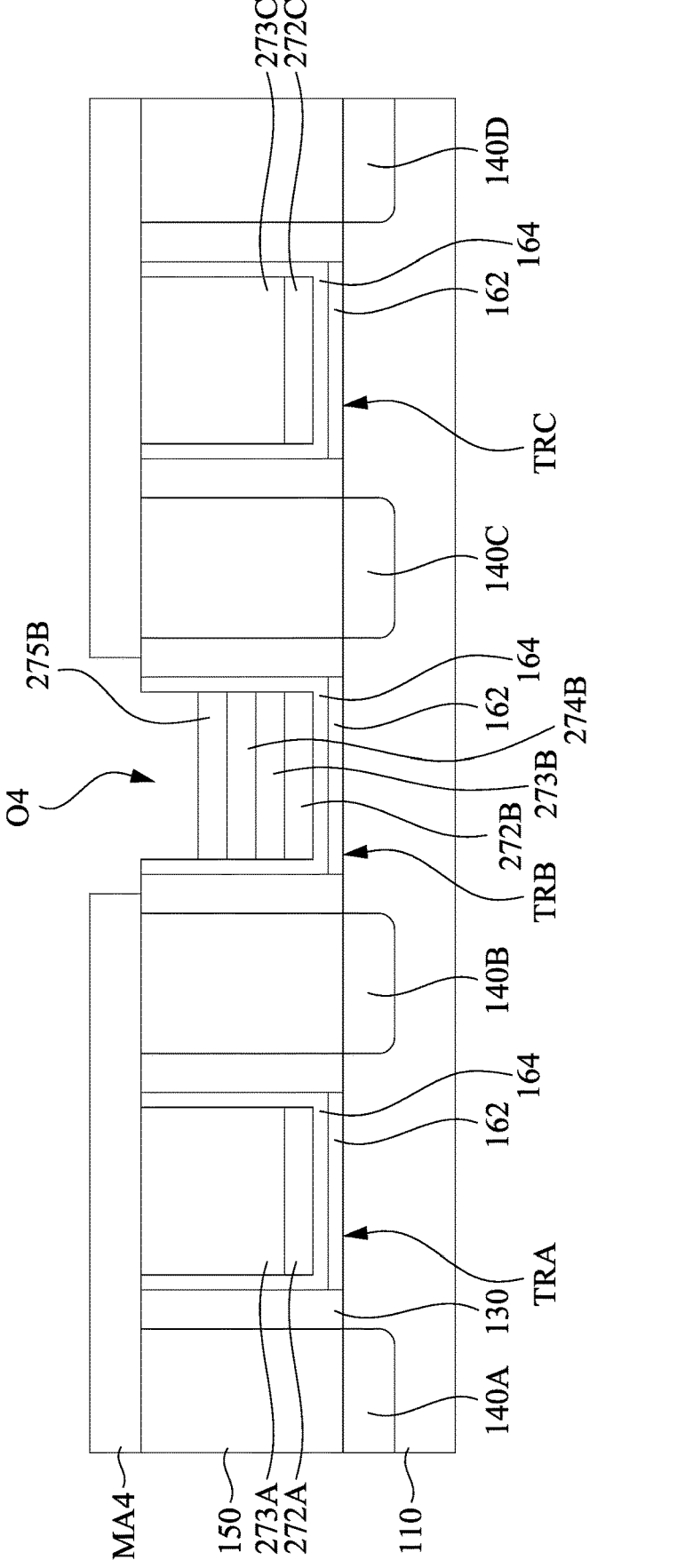

Reference is made to FIG. 35. A patterned mask MA4 is formed over the substrate 100. In some embodiments, the patterned mask MA4 has an opening O4, in which the opening O4 exposes the fourth work function metal layer 275B. Next, fourth work function metal layer 275B is selectively etched back by using an etchant that etches the fourth work function metal at a faster etch rate than etching other materials. In some embodiments, the process of FIG. 35 is similar to the process of FIG. 31, and thus relevant details will not be repeated for simplicity.

Figure 36:
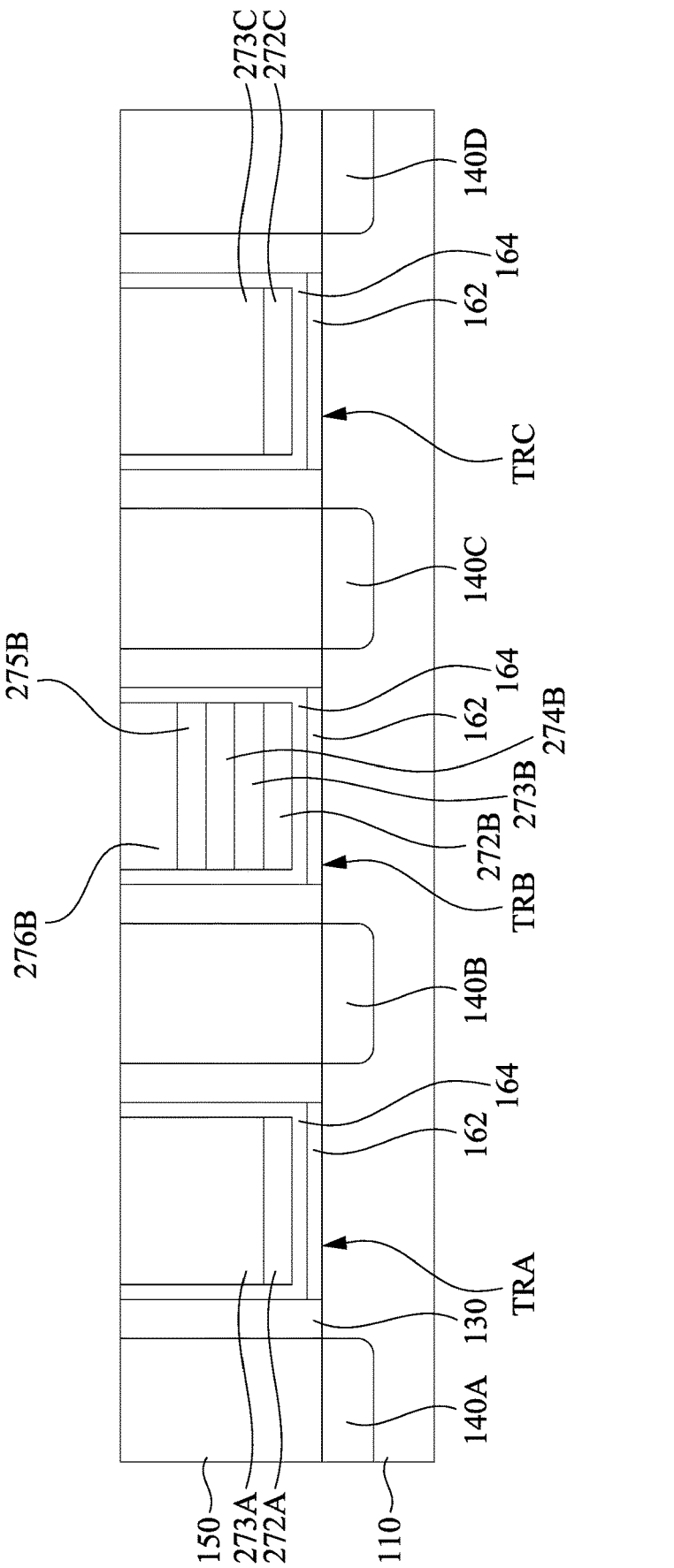

Reference is made to FIG. 36. The patterned mask MA4 is removed. Next, a fifth work function metal layer 276B is formed in the gate trench TRB. In some embodiments, the fifth work function metal layer 276B is in contact with the gate dielectric layer 164.

Figure 37:
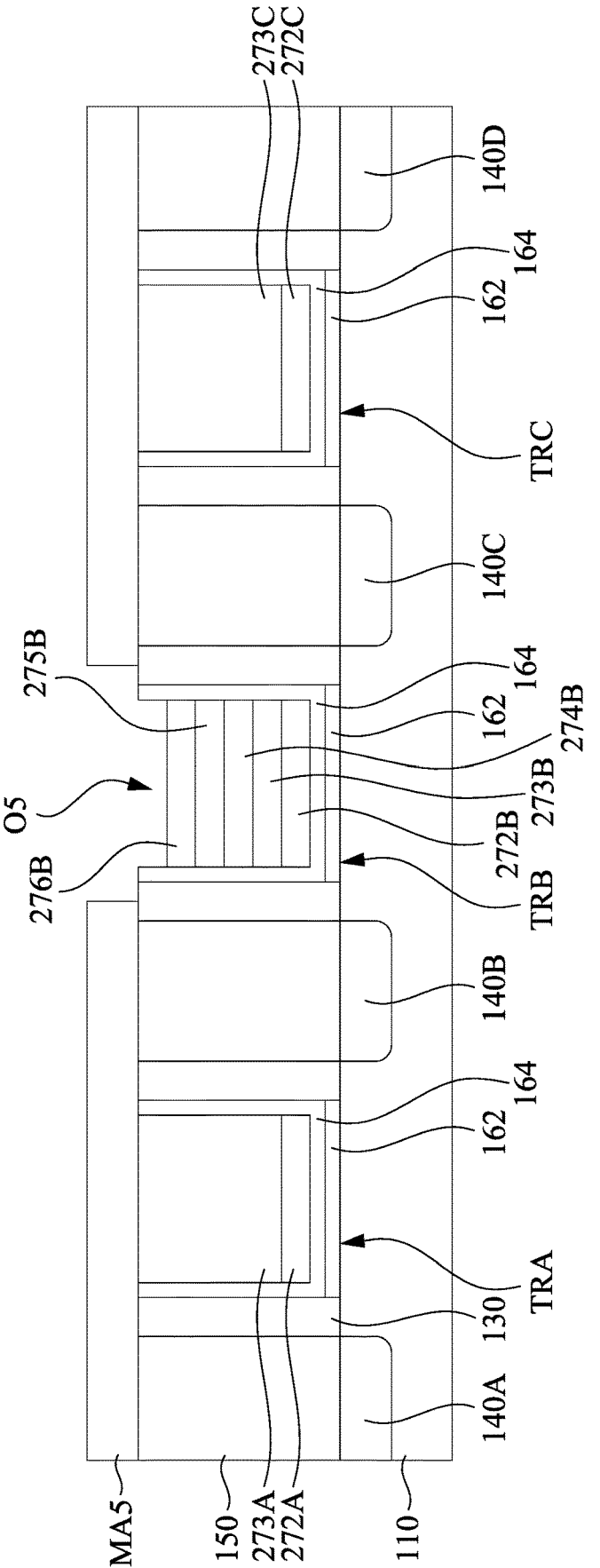

Reference is made to FIG. 37. A patterned mask MA5 is formed over the substrate 100. In some embodiments, the patterned mask MA4 has an opening O5, in which the opening O5 exposes the fifth work function metal layer 276B. Next, fifth work function metal layer 276B is selectively etched back by using an etchant that etches the fifth work function metal at a faster etch rate than etching other materials. In some embodiments, the process of FIG. 37 is similar to the process of FIG. 31, and thus relevant details will not be repeated for simplicity.

Figure 38:
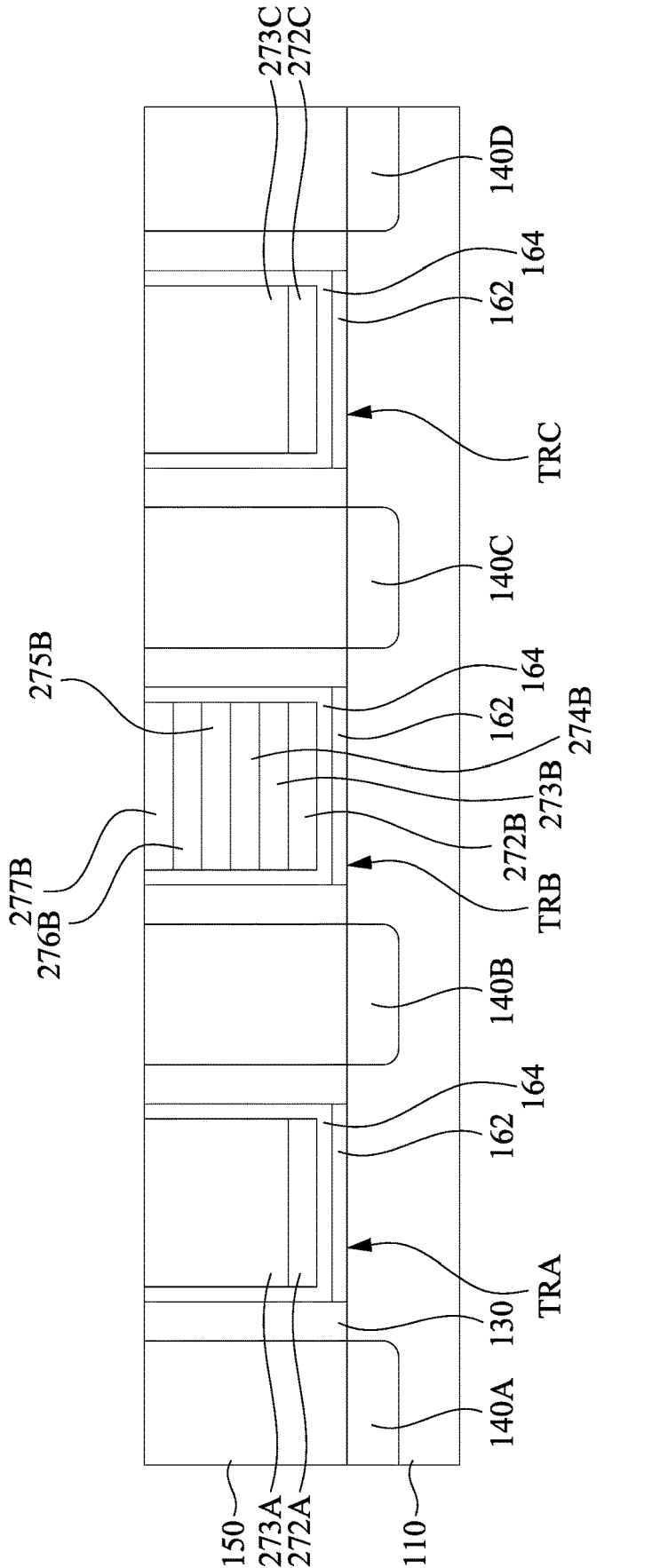

Reference is made to FIG. 38. The patterned mask MA5 is removed. Next, a sixth work function metal layer 277B is formed in the gate trench TRB. In some embodiments, the sixth work function metal layer 277B is in contact with the gate dielectric layer 164.

Figure 39:
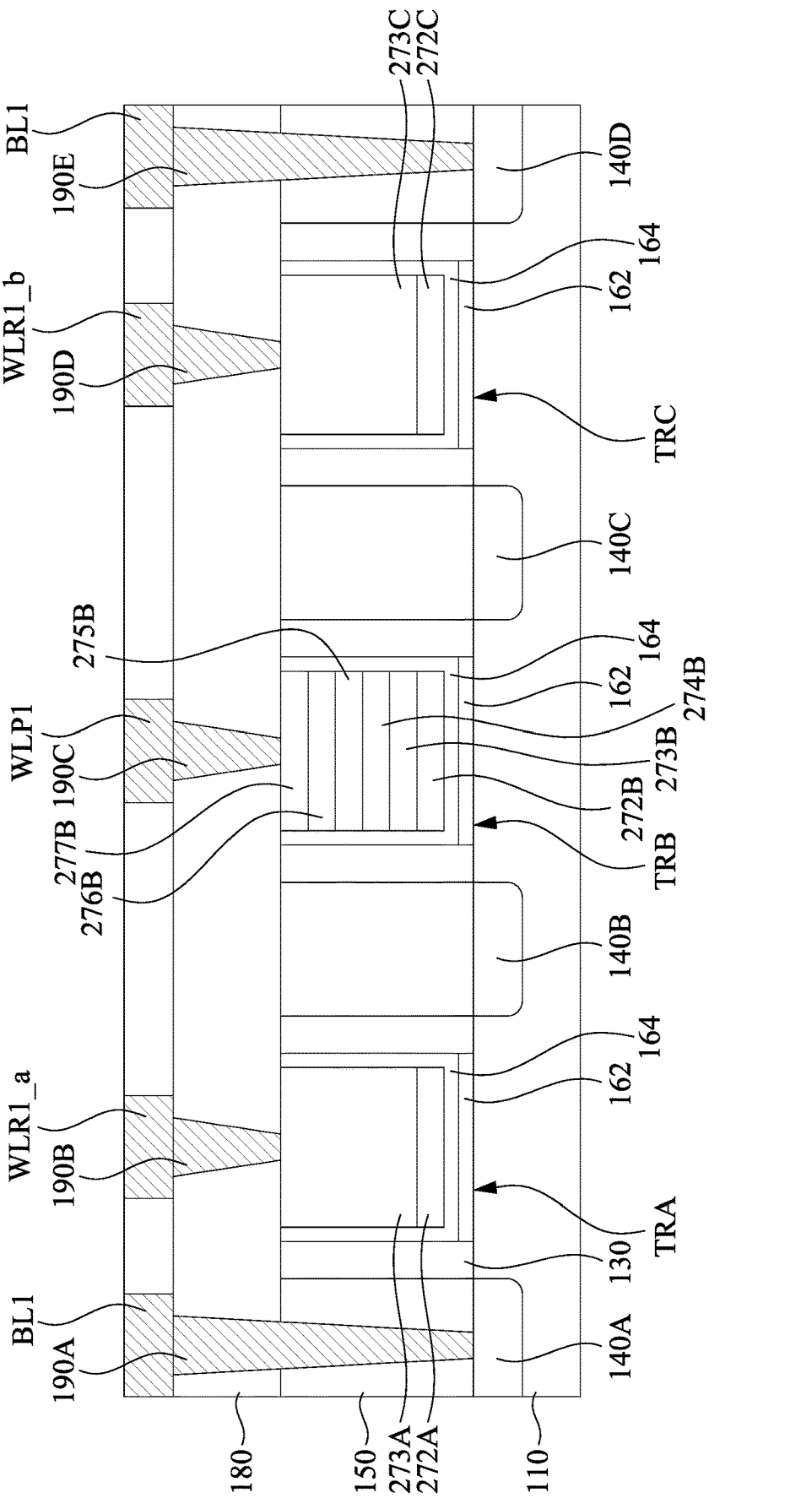
Figures 40A, 40B, 40C, 40D, 40E:
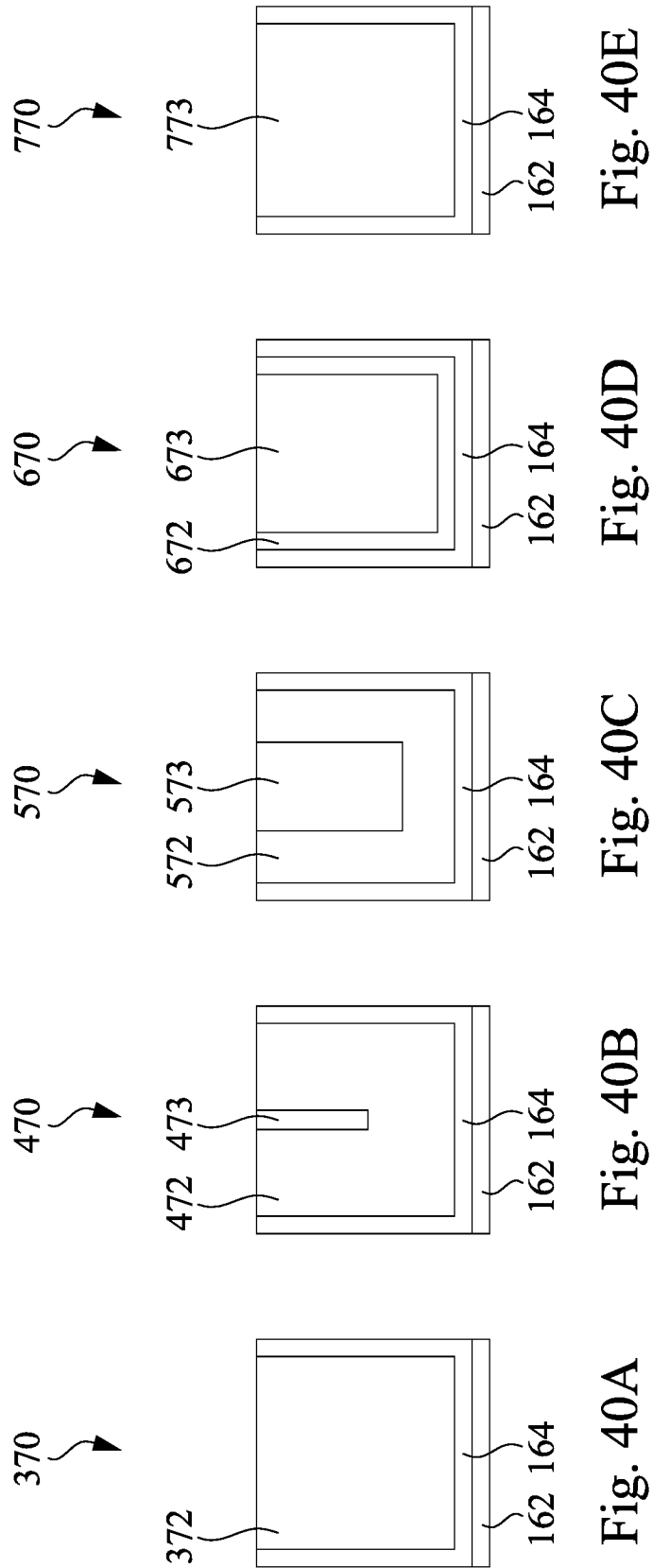
FIGS. 40A to 40E illustrate gate structures of memory devices in accordance with some embodiments of the present disclosure.

Reference is made to FIG. 39. It is noted that elements formed in FIG. 39 are similar to those discussed in FIGS. 23 to 25, and thus such elements are labeled the same and details will not be repeated for simplicity. FIG. 39 is different from FIG. 25, in that the work function metal layers of the gate structures 270A, 270B, and 270C of FIG. 39 have different shapes from the work function metal layers of the gate structures 170A, 170B, and 170C of FIG. 25. For example, each of the work function metal layers 272B to 277B of the gate structure 270B has a rectangular shape, and is in contact with the gate dielectric layer 164. The work function metal layers 272A and 273A of the gate structure 270A and the work function metal layers 272C and 273C of the gate structure 270C have similar properties as the work function metal layers 272B to 277B of the gate structure 270B.

FIGS. 40A to 40E illustrate gate structures of memory devices in accordance with some embodiments of the present disclosure. It is noted that some elements of FIGS. 40A to 40E have been described above, and thus relevant details will not be repeated for simplicity.

Metal gate structures 370, 470, 570, 670, and 770 are illustrated in FIGS. 40A, 40B, 40C, 40D, and 40E, respectively. In some embodiments, each of the metal gate structures 370, 470, 570, 670, 770 includes an interfacial layer 162 and a gate dielectric layer 164. The metal gate structure 370 includes a work function metal layer 372. The metal gate structure 470 includes a work function metal layer 472 and a work function metal layer 473 over the work function metal layer 472. The metal gate structure 570 includes a work function metal layer 572 and a work function metal layer 573 over the work function metal layer 572. The metal gate structure 670 includes a work function metal layer 672 and a work function metal layer 673 over the work function metal layer 672. The metal gate structure 770 includes a work function metal layer 773. In some embodiments, the metal gate structures 370, 470, 570, 670, and 770 have different work function values from each other.

In some embodiments, the work function metal layers 372, 472, 572, and 672 are made of the same material. Similarly, the work function metal layers 473, 573, 673, and 773 are made of the same material. On the other hand, the work function metal layers 372, 472, 572, and 672 are made of different materials from the work function metal layers 473, 573, 673, and 773.

In some embodiments, the work function metal layer 372 is thicker than the work function metal layer 472, the work function metal layer 472 is thicker than the work function metal layer 572, and the work function metal layer 572 is thicker than the work function metal layer 672. Similarly, the work function metal layer 773 is thicker than the work function metal layer 673, the work function metal layer 673 is thicker than the work function metal layer 573, and the work function metal layer 573 is thicker than the work function metal layer 473.

In some embodiments, if the transistor T1 of the memory device MD1 discussed in FIGS. 1 to 2B includes the gate structure 370, the transistor T0 of the memory device MD1 discussed in FIGS. 1 to 2B may include one of the gate structures 470, 570, 670, and 770, and vice versa. If the transistor T1 includes the gate structure 470, the transistor T0 may include one of the gate structures 370, 570, 670, and 770, and vice versa. If the transistor T1 includes the gate structure 570, the transistor T0 may include one of the gate structures 370, 470, 670, and 770, and vice versa. If the transistor T1 includes the gate structure 670, the transistor T0 may include one of the gate structures 370, 470, 570, and 770, and vice versa. If the transistor T1 includes the gate structure 770, the transistor T0 may include one of the gate structures 370, 470, 570, and 670, and vice versa.

On the other hand, if the transistors T1_*a* and T1_*b* of the memory device MD2 discussed in FIGS. 3 to 4B include the gate structure 370, the transistor T0 of the memory device MD2 discussed in FIGS. 3 to 4B may include one of the gate structures 470, 570, 670, and 770, and vice versa. If the transistors T1_*a* and T1_*b* include the gate structure 470, the transistor T0 may include one of the gate structures 370, 570, 670, and 770, and vice versa. If the transistors T1_*a* and T1_*b* include the gate structure 570, the transistor T0 may include one of the gate structures 370, 470, 670, and 770, and vice versa. If the transistors T1_*a* and T1_*b* include the gate structure 670, the transistor T0 may include one of the gate structures 370, 470, 570, and 770, and vice versa. If the transistors T1_*a* and T1_*b* include the gate structure 770, the transistor T0 may include one of the gate structures 370, 470, 570, and 670, and vice versa.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that, an anti-fuse transistor of an OTP memory device is operated in an "inversion mode" when a positive gate voltage $V_{GS}$ is applied, the gate voltage $V_{GS}$ can easily reach the breakdown voltage $V_{BD}$ of the anti-fuse transistor without passing the "accumulation mode" and the "depletion mode." Accordingly, with this configuration, the power of the memory device can be reduced. Moreover, the memory device can be "programed" with lower voltage, which will also improve the reliability of the memory device.

In some embodiments of the present disclosure, a one-time-programmable (OTP) memory device includes a substrate, a first transistor over the substrate, a second transistor over the substrate, a first word line, second word line, and a bit line. The first transistor includes a first gate structure, and a first source/drain region and a second source/drain region on opposite sides of the first gate structure. The second transistor is operable in an inversion mode, and the second transistor includes a second gate structure having more work function metal layers than the first gate structure of the first transistor, and second source/drain region and a third source/drain region on opposite sides of the second gate structure. The first word line is over and electrically connected to the first gate structure of the first transistor. The second word line is over and electrically connected to the second gate structure of the second transistor. The bit line is over and electrically connected to the first source/drain region of the first transistor.

In some embodiments of the present disclosure, a one-time-programmable (OTP) memory device includes a substrate, first, second, and third gate structures over the substrate, first, second, third, and fourth source/drain regions in the substrate, a first word line, a second word line, and a bit line. A work function metal value of the second gate structure is different from a work function metal value of the first gate structure and a work function metal value of the first gate structure, and the a work function metal value of the first gate structure is substantially the same as the work function metal value of the first gate structure. The first and second source/drain regions are on opposite sides of the first gate structure, the second and third source/drain regions are on opposite sides of the second gate structure, and the third and fourth source/drain regions are on opposite sides of the third gate structure. The first word line is over and electrically connected to the first gate structure. The second word line is over and electrically connected to the second gate structure. The third word line is over and electrically connected to the second gate structure. The bit line is over and electrically connected to the first and fourth source/drain regions.

In some embodiments of the present disclosure, a method includes forming first and second dummy gate structures over the substrate; forming gate spacers on opposite sidewalls of the first and second dummy gate structures; removing the first and second dummy gate structures to form first and second gate trenches; forming a first metal gate structure in the first gate trench and a second metal gate structure in the second gate trench, forming the first and second metal gate structures comprising: forming first work function metal layers in the first and second gate trenches; etching the first work function metal layers; forming second work function metal layers in the first and second gate trenches; etching the second work function metal layers; and forming a third work function metal layer in the second gate trench, in which the third work function metal layer is not formed in the first gate trench; and forming a first word line electrically coupled to the first metal gate structure and a second word line electrically coupled to the second metal gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:

forming first and second dummy gate structures over a substrate;

forming gate spacers on opposite sidewalls of the first and second dummy gate structures;

forming first, second, and third source/drain regions, the first and second source/drain regions being on opposite sides of the first dummy gate structure, and the second and third source/drain regions being on opposite sides of the second dummy gate structure;

removing the first and second dummy gate structures to form first and second gate trenches;

forming a first metal gate structure in the first gate trench and a second metal gate structure in the second gate trench, wherein the first metal gate structure and the first and second source/drain regions collectively forms a first transistor, and the second metal gate structure and the second and third source/drain regions collectively forms a second transistor, and the first and second transistors have a same conductivity type, wherein the first transistor is operable in an accumulation mode, and a threshold voltage of the first transistor is greater than 0V, and wherein the second transistor is operable in an inversion mode, and a threshold voltage of the second transistor is lower than 0V, and wherein forming the first and second metal gate structures comprises:

forming first work function metal layers in the first and second gate trenches;

etching the first work function metal layers;

forming second work function metal layers in the first and second gate trenches; and forming a third work function metal layer in the second gate trench, wherein the third work function metal layer is not formed in the first gate trench; and forming a first word line electrically coupled to the first metal gate structure and a second word line electrically coupled to the second metal gate structure.

2. The method of claim 1, wherein forming the first work function metal layers in the first and second gate trenches is performed such that the first work function metal layers completely fill the first and second gate trenches.

3. The method of claim 1, further comprising:

forming a bit line electrically coupled to the first source/drain region.

4. The method of claim 3, further comprising forming a mask covering the first gate trench during etching the second work function metal layer.

5. The method of claim 1, further comprising forming a mask covering the first gate trench during forming the third work function metal layer.

6. The method of claim 1, further comprising etching the second work function metal layer in the second gate trench, such that the second work function metal layer in the second gate trench is thinner than the second work function metal layer in the first gate trench.

7. The method of claim 1, further comprising forming fourth, fifth, and sixth work function metal layers in the second gate trench, while the fourth, fifth, and sixth work function metal layers in the second gate trench are not formed in the first gate trench.

8. The method of claim 1, wherein the first transistor is operable in the accumulation mode when a gate voltage applied to the first transistor is zero, and the second transistor is operable in the inversion mode when a gate voltage applied to the second transistor is zero.

9. A method for forming a semiconductor device, comprising:

forming a first transistor and a second transistor having a same conductivity type over a substrate, the first transistor comprising a first gate structure and the second transistor comprising a second gate structure, wherein the a second gate structure having more work function metal layers than the first gate structure of the first transistor, wherein the first transistor is operable in an accumulation mode, and a threshold voltage of the first transistor is greater than 0V, and wherein the second transistor is operable in an inversion mode, and a threshold voltage of the second transistor is lower than 0V;

forming a first word line electrically connected to the first gate structure of the first transistor;

forming a second word line electrically connected to the second gate structure of the second transistor; and forming a bit line electrically connected to a first source/drain region of the first transistor.

10. The method of claim 9, wherein forming the first transistor and the second transistor is performed such that a first work function value of the first gate structure of the first transistor is lower than a second work function value of the second gate structure of the second transistor.

11. The method of claim 9, wherein forming the first transistor and the second transistor is performed such that a breakdown voltage of the second transistor is lower than a breakdown voltage of the first transistor.

12. The method of claim 9, wherein a number of the work function metal layers in the second gate structure is at least three times a number of the work function metal layers in the first gate structure.

13. The method of claim 9, wherein forming the first transistor and the second transistor is performed such that a threshold voltage of the second transistor is lower than 0, and a threshold voltage of the first transistor is greater than 0.

14. The method of claim 9, wherein the first transistor is operable in the accumulation mode when a gate voltage applied to the first transistor is zero, and the second transistor is operable in the inversion mode when a gate voltage applied to the second transistor is zero.

15. A method for forming a semiconductor device, comprising:

forming first, second, and third gate structures over a substrate, wherein a work function metal value of the second gate structure is different from a work function metal value of the first gate structure and a work function metal value of the third gate structure, and the a work function metal value of the first gate structure is substantially the same as the work function metal value of the third gate structure;

forming first, second, third, and fourth source/drain regions in the substrate, wherein the first and second source/drain regions are on opposite sides of the first gate structure, the second and third source/drain regions are on opposite sides of the second gate structure, and the third and fourth source/drain regions are on opposite sides of the third gate structure, wherein the first gate structure and the first and second source/drain regions collectively forms a first transistor, the second gate structure and the second and third source/drain regions collectively forms a second transistor, and the third gate structure and the third and fourth source/drain regions collectively forms a third transistor, the first, second, and third transistors have a same conductivity type, wherein the first transistor and the third transistor are operable in an accumulation mode, the second transistor is operable in an inversion mode, and a threshold voltage of the second transistor is lower than threshold voltages of the first and third transistors;

forming a first word line over and electrically connected to the first gate structure;

forming a second word line over and electrically connected to the second gate structure;

forming a third word line over and electrically connected to the third gate structure; and forming a bit line over and electrically connected to the first and fourth source/drain regions.

16. The method of claim 15, wherein the work function metal value of the second gate structure is lower than the work function metal value of the first gate structure and the work function metal value of the third gate structure.

17. The method of claim 15, wherein first and third gate structures have more work function metal layers than the second gate structure.

18. The method of claim 17, wherein first and third gate structures have a same number of work function metal layers.

19. The method of claim 15, wherein the threshold voltages of the first and third transistors are substantially the same.

20. The method of claim 15, wherein the threshold voltage of the second transistor is lower than 0, and the threshold voltages of the first and third transistors are greater than 0.

* * * * *